US009653687B2

(12) United States Patent
Ludemann et al.

(10) Patent No.: US 9,653,687 B2
(45) Date of Patent: May 16, 2017

(54) MATERIALS FOR ORGANIC ELECTROLUMINESCENT DEVICES

(75) Inventors: Aurélie Ludemann, Frankfurt am Main (DE); Rémi Manouk Anémian, Seoul (KR); Susanne Heun, Bad Soden (DE); Almut Rapp, Darmstadt (DE)

(73) Assignee: Merck Patent GmbH, Darmstadt (DE)

(*) Notice: Subject to any disclaimer, the term of this patent is extended or adjusted under 35 U.S.C. 154(b) by 608 days.

(21) Appl. No.: 13/879,094

(22) PCT Filed: Sep. 15, 2011

(86) PCT No.: PCT/EP2011/004644

§ 371 (c)(1), (2), (4) Date: Apr. 12, 2013

(87) PCT Pub. No.: WO2012/048778

PCT Pub. Date: Apr. 19, 2012

(65) Prior Publication Data

US 2013/0228767 A1 Sep. 5, 2013

(30) Foreign Application Priority Data

Oct. 14, 2010 (DE) ........................ 10 2010 048 498

(51) Int. Cl.
*H01L 51/50* (2006.01)
*H01L 51/00* (2006.01)
(Continued)

(52) U.S. Cl.
CPC ........ *H01L 51/0043* (2013.01); *C08K 5/0091* (2013.01); *C08K 5/3417* (2013.01); *C09K 11/06* (2013.01); *H01L 51/0035* (2013.01); *H01L 51/5016* (2013.01); *H01L 51/5024* (2013.01); *H05B 33/10* (2013.01); *C08G 2261/126* (2013.01); *C08G 2261/3241* (2013.01); *C08G 2261/342* (2013.01); *C08G 2261/344* (2013.01); *C08G 2261/3424* (2013.01);
(Continued)

(58) Field of Classification Search
None
See application file for complete search history.

(56) References Cited

U.S. PATENT DOCUMENTS 7,659,540 B2 2/2010 Heun et al.
8,361,638 B2 1/2013 Stoessel et al.
(Continued)

FOREIGN PATENT DOCUMENTS

JP 2008-255344 A 10/2008
JP 2010-516637 A 5/2010
(Continued)

OTHER PUBLICATIONS

Office Action Issued for Chinese Patent Application 201180049410.X mailed Mar. 11, 2014.
(Continued)

*Primary Examiner* — Gregory Clark

(57) ABSTRACT

The present invention relates to a mixture comprising a) a polymer which contains at least one L=X structural unit, b) a triplet emitter compound and c) a carbazole compound or a soluble neutral molecule. The invention furthermore relates to organic electroluminescent devices which contain the mixture according to the invention.

18 Claims, 2 Drawing Sheets

(51) Int. Cl.
*C09K 11/06* (2006.01)
*H05B 33/10* (2006.01)
*C08K 5/00* (2006.01)
*C08K 5/3417* (2006.01)

(52) U.S. Cl.
CPC .................. *C08G 2261/411* (2013.01); *C08G 2261/5242* (2013.01); *C08G 2261/95* (2013.01); *C09K 2211/1408* (2013.01); *C09K 2211/185* (2013.01); *H01L 2251/5376* (2013.01); *Y02E 10/549* (2013.01)

(56) References Cited

U.S. PATENT DOCUMENTS

2007/0080343 A1* 4/2007 Heun ..................... C08G 61/02 257/40
2009/0167166 A1 7/2009 Bach et al.
2009/0302752 A1* 12/2009 Parham ................ C07D 209/80 313/504
2010/0033086 A1 2/2010 Mikami et al.
2010/0102305 A1 4/2010 Heun et al.

FOREIGN PATENT DOCUMENTS

WO WO-2005/040302 A1 5/2005
WO WO-2009/124627 A1 10/2009

OTHER PUBLICATIONS

Gong, Xiong, et al., "Electrophosphorescence from a Polymer Guest-Host System with an Iridium Complex as Guest: Förster Energy Transfer an dCharge Trapping", Adv. Funct. Mater., vol. 13, No. 6, (2003), pp. 439-444.
International Search Report for PCT/EP2011/004644 mailed Dec. 1, 2011.

* cited by examiner

| | | |
|---|---|---|
| 3 nm / 150 nm | **Cathode** | Ba/Al |
| 80 nm | **EML** | T1 in P1 to P7, C1 to C6 and/or N1 to N3 |
| 20 nm | **IL** | HIL-012 |
| 80 nm | **Buffer layer** | PEDOT |
| | **IT** | |

MATERIALS FOR ORGANIC ELECTROLUMINESCENT DEVICES

CROSS-REFERENCE TO RELATED APPLICATIONS

This application is a national stage application (under 35 U.S.C. §371) of PCT/EP2011/004644, filed Sep. 15, 2011, which claims benefit of German Application No. 10 2010 048 498.9, filed Oct. 14, 2010, both of which are incorporated herein by reference in their entirety.

BACKGROUND OF THE INVENTION

The present invention relates to a mixture comprising
a) a polymer which contains at least one L=X structural unit,
b) a triplet emitter compound and
c) a carbazole compound or a soluble neutral molecule.

The invention is furthermore directed to organic electroluminescent devices which contain the mixture according to the invention.

The structure of organic electroluminescent devices (OLEDs) in which organic semiconductors are employed as functional materials is described, for example, in U.S. Pat. No. 4,539,507, U.S. Pat. No. 5,151,629, EP 0676461 and WO 98/27136. A development in the area of organic electroluminescent devices are phosphorescent OLEDs. These have significant advantages owing to the higher achievable efficiency compared with fluorescent OLEDs.

However, there is still a need for improvement in the case of phosphorescent OLEDs. This applies, in particular, to the efficiency and lifetime of the devices.

In accordance with the prior art, electron-conducting materials, inter alia ketones (for example in accordance with WO 04/093207) or triazine derivatives (for example in accordance with DE 102008036982), are used as matrix materials for phosphorescent emitters. In particular with ketones, low operating voltages and long lifetimes are achieved, which makes this class of compound a very interesting matrix material. However, there is still a need for improvement in the case of the use of these matrix materials, as in the case of other matrix materials, in particular with respect to the efficiency and lifetime of the devices.

The prior art furthermore discloses organic electroluminescent devices which contain a phosphorescent emitter doped into a mixture of two matrix materials.

US 2007/0252516 discloses phosphorescent organic electroluminescent devices which contain a mixture of a hole-conducting matrix material and an electron-conducting matrix material. Improved efficiency is disclosed for these OLEDs. An influence on the lifetime is not evident.

US 2007/0099026 discloses white-emitting organic electroluminescent devices in which the green- or red-emitting layer comprises a phosphorescent emitter and a mixture of a hole-conducting matrix material and an electron-conducting matrix material. The hole-conducting materials disclosed are, inter alia, triarylamine and carbazole derivatives. The electron-conducting materials disclosed are, inter alia, aluminium and zinc compounds, oxadiazole compounds and triazine or triazole compounds. Further improvements are also still desirable for these OLEDs.

WO 2008/086851 A1 discloses carbazole compounds and the use thereof in organic electroluminescent devices, in particular as matrix material in phosphorescent devices, in which ketone compounds may likewise be present.

WO 2005/040302 A1 discloses organic semiconductors comprising a polymer, compounds containing L=X structural units and triplet emitter compounds. The compounds mentioned therein have good solubility and are readily accessible synthetically.

Nevertheless, there continues to be a need for improvement with respect to solubility for solution-processable systems and with respect to lifetime and efficiency.

The technical object on which the invention is based was therefore the provision of a mixture which can be processed simply from solution and, in an organic electroluminescent device, results in a very long lifetime and good efficiency.

The object is achieved in accordance with the invention by a mixture comprising
a) a polymer which contains at least one L=X structural unit,
b) a triplet emitter compound and
c) a carbazole compound or a soluble neutral molecule,
where the following applies to the symbols and indices used:

L is on each occurrence, identically or differently, $C(R^1)_2$, $PR^1$, $AsR^1$, $SbR^1$, $BiR^1$, $P(R^1)_3$, $As(R^1)_3$, $Sb(R^1)_3$, $Bi(R^1)_3$, $S(R^1)_2$, $Se(R^1)_2$, $Te(R^1)_2$, $(R^1)_2S({=}O)$, $(R^1)_2Se({=}O)$ or $(R^1)_2Te({=}0)$;

X is on each occurrence, identically or differently, O, S, Se or $NR^2$;

$R^1$ is on each occurrence, identically or differently, H, D, F, CN, $N(R^2)_2$, a straight-chain, branched or cyclic alkyl, alkoxy or thioalkoxy group having 1 to 40 C atoms, which may be substituted by $R^3$ or also unsubstituted, where one or more non-adjacent $CH_2$ groups may be replaced by $—R^4C{=}CR^4—$, $—C{\equiv}C—$, $Si(R^4)_2$, $Ge(R^4)_2$, $Sn(R^4)_2$, C=O, C=S, C=Se, $C{=}NR^4$, —O—, —S—, $—NR^4$ or $—CONR^4—$ and where one or more H atoms may be replaced by F, Cl, Br, I, CN or $NO_2$, or an aromatic or heteroaromatic ring system having 1 to 60 C atoms, which may be substituted by one or more radicals $R^3$, where two or more substituents $R^1$, together with the atoms to which they are bonded, may also form a mono- or polycyclic, aliphatic or aromatic ring system with one another; where at least one group $R^1$ has a bond to a further structural unit of the polymer;

$R^2$ is on each occurrence, identically or differently, a straight-chain, branched or cyclic alkyl or alkoxy group having 1 to 22 C atoms, in which, in addition, one or more non-adjacent C atoms may be replaced by $—R^4C{=}CR^4—$, $—C{\equiv}C—$, $Si(R^4)_2$, $Ge(R^4)_2$, $Sn(R^4)_2$, $—NR^4—$, —O—, —S—, —CO—O—, —O—CO—O—, where, in addition, one or more H atoms may be replaced by fluorine, an aryl, heteroaryl or aryloxy group having 1 to 40 C atoms, which may also be substituted by one or more radicals $R^3$, or OH or $N(R^3)_2$;

$R^3$ is on each occurrence, identically or differently, $R^4$ or CN, $B(R^4)_2$ or $Si(R^4)_3$; and $R^4$ is on each occurrence, identically or differently, H, D or an aliphatic or aromatic hydrocarbon radical having 1 to 20 C atoms.

A BRIEF DESCRIPTION OF THE FIGURE

A DETAILED DESCRIPTION OF THE INVENTION

Figures 1, 2:
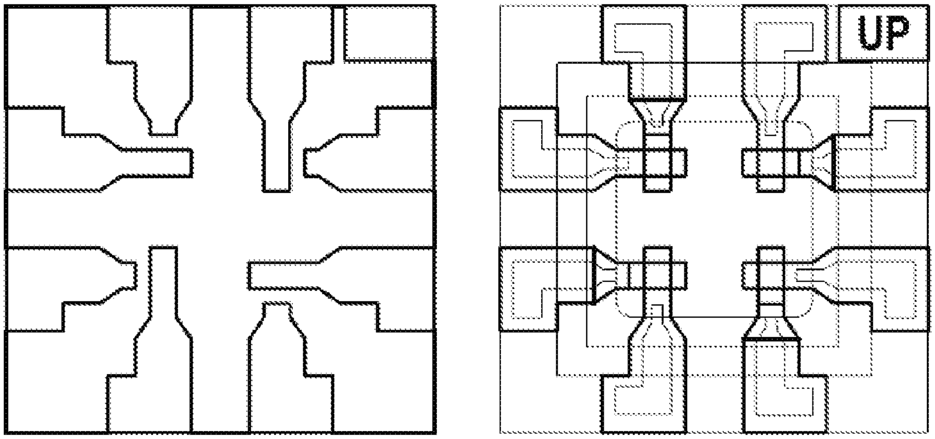
FIG. 1 illustrates a device according to the invention.
FIG. 2 illustrates a diagram on the left: ITO structure applied to the glass support, diagram on the right: complete electronic structure with ITO, vapour-deposited cathode and optional metallisation of the leads.

In an embodiment of the mixture according to the invention, the structural unit L=X of the polymer is preferably a structural unit of the formula (1)

(1)

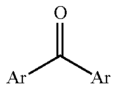

where the following applies to the symbols used:

Ar is on each occurrence, identically or differently, an aromatic or heteroaromatic ring system having 5 to 60 aromatic ring atoms, which may in each case be substituted by one or more groups $R^5$;

$R^5$ is on each occurrence, identically or differently, H, D, F, Cl, Br, I, CHO, $C(=O)Ar^1$, $P(=O)(Ar^1)_2$, $S(=O)Ar^1$, $S(=O)_2Ar^1$, $CR^6=CR^6Ar^1$, CN, $NO_2$, $Si(R^6)_3$, $B(OR^6)_2$, $B(R^6)_2$, $B(N(R^6)_2)_2$, $OSO_2R^6$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^6$, where one or more non-adjacent $CH_2$ groups may be replaced by $R^6C=CR^6$, $C\equiv C$, $Si(R^6)_2$, $Ge(R^6)_2$, $Sn(R^6)_2$, C=O, C=S, C=Se, $C=NR^6$, $P(=O)(R^6)$, SO, $SO_2$, $NR^6$, O, S or $CONR^6$ and where one or more H atoms may be replaced by F, Cl, Br, I, CN or $NO_2$, or an aromatic or heteroaromatic ring system having 5 to 60 aromatic ring atoms, which may in each case be substituted by one or more radicals $R^6$, or an aryloxy or heteroaryloxy group having 5 to 60 aromatic ring atoms, which may be substituted by one or more radicals $R^6$, or a combination of these systems; two or more adjacent substituents $R^5$ here may also form a mono- or polycyclic, aliphatic or aromatic ring system with one another;

$Ar^1$ is on each occurrence, identically or differently, an aromatic or heteroaromatic ring system having 5 to 40 aromatic ring atoms, which may be substituted by one or more radicals $R^5$; and $R^6$ is on each occurrence, identically or differently, H, D, CN or an aliphatic, aromatic or heteroaromatic hydrocarbon radical having 1 to 20 C atoms, in which, in addition, H atoms may be replaced by F; two or more adjacent substituents $R^6$ here may also form a mono- or polycyclic, aliphatic or aromatic ring system with one another;

where at least one radical $R^5$ is a covalent bond to a further structural unit of the polymer.

In the present invention, the term "polymer" is taken to mean both polymeric compounds, oligomeric compounds, and dendrimers. The polymeric compounds according to the invention preferably have 10 to 100000, particularly preferably 20 to 50000 and in particular 50 to 20000 recurring units (structural units). The oligomeric compounds according to the invention preferably have 2 to 9 recurring units. The branching factor of the polymers here is between 0 (linear polymer, no branching points) and 1 (fully branched dendrimer). "Dendrimer" here is generally intended to be understood as described, for example, by M. Fischer and F. Vögtle (*Angew. Chem., Int. Ed.* 1999, 38, 885).

The weight-average molecular weight $M_w$ of the polymer is preferably in the range from 10000 to 2000000 g/mol, particularly preferably in the range from 20000 to 1000000 g/mol and in particular in the range from 50000 to 500000 g/mol. $M_w$ is determined by gel permeation chromatography with polystyrene as internal standard.

An aryl group in the sense of the present invention contains 6 to 60 C atoms; a heteroaryl group in the sense of the present invention contains 2 to 60 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, phenanthrene, quinoline, isoquinoline, etc.

An aromatic ring system in the sense of the present invention contains 6 to 60 C atoms in the ring system. A heteroaromatic ring system in the sense of the present invention contains 2 to 60 C atoms and at least one heteroatom in the ring system, with the proviso that the sum of C atoms and heteroatoms is at least 5. The heteroatoms are preferably selected from N, O and/or S. An aromatic or heteroaromatic ring system in the sense of the present invention is intended to be taken to mean a system which does not necessarily contain only aryl or heteroaryl groups, but instead in which a plurality of aryl or heteroaryl groups may also be interrupted by a non-aromatic unit (preferably less than 10% of the atoms other than H), such as, for example, an $sp^3$-hybridised C, N or O atom. Thus, for example, systems such as 9,9'-spirobifluorene, 9,9-diarylfluorene, triarylamine, diaryl ether and stilbene are also intended to be taken to be aromatic ring systems in the sense of the present invention, as are systems in which two or more aryl groups are interrupted, for example, by a linear or cyclic alkyl group or by a silyl group. The aromatic ring system preferably contains no metal atoms.

An aromatic or heteroaromatic ring system having 5 to 60 aromatic ring atoms, which may also in each case be substituted by the above-mentioned radicals R and which may be linked to the aromatic or heteroaromatic ring system via any desired positions, is taken to mean, in particular, groups derived from benzene, naphthalene, anthracene, phenanthrene, pyrene, chrysene, perylene, fluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

For the purposes of the present invention, a $C_1$- to $C_{40}$-alkyl group, in which, in addition, individual H atoms or $CH_2$ groups may be substituted by the above-mentioned groups, is preferably taken to mean the radicals methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl and octynyl. A $C_1$- to $C_{40}$-alkoxy group is preferably taken to mean methoxy, trifluoromethoxy, ethoxy, n-propoxy, i-propoxy, n-butoxy, i-butoxy, s-butoxy, t-butoxy and 2-methylbutoxy.

Suitable structural units of the formula (1) are, in particular, the compounds disclosed in WO 04/093207 and in DE 102008033943. These are incorporated into the present invention by way of reference.

It is evident from the definition of the structural unit of the formula (1) that this does not have to contain only one carbonyl group, but instead may also contain a plurality of these groups.

The group Ar in the structural unit of the formula (1) is preferably an aromatic ring system having 6 to 40 aromatic ring atoms or a heteroaromatic ring system having 2 to 40 C atoms and at least one heteroatom in the ring system, with the proviso that the sum of C atoms and heteroatoms is at least 5. As defined above, the aromatic ring system does not necessarily have to contain only aromatic groups, but instead two aryl groups may also be interrupted by a non-aromatic group, for example by a further carbonyl group.

In a further preferred embodiment of the invention, the group Ar of the structural unit of the formula (1) has not more than two condensed rings. It is thus preferably built up only from phenyl and/or naphthyl groups, particularly preferably only from phenyl groups, but contains no larger condensed aromatic ring systems, such as, for example, anthracene.

Preferred groups Ar which are bonded to the carbonyl group of the structural unit of the formula (1) are phenyl, 2-, 3- or 4-tolyl, 3- or 4-o-xylyl, 2- or 4-m-xylyl, 2-p-xylyl, o-, m- or p-tert-butylphenyl, o-, m- or p-fluorophenyl, benzophenone, 1-, 2- or 3-phenylmethanone, 2-, 3- or 4-biphenyl, 2-, 3- or 4-o-terphenyl, 2-, 3- or 4-m-terphenyl, 2-, 3- or 4-p-terphenyl, 2'-p-terphenyl, 2'-, 4'- or 5'-m-terphenyl, 3'- or 4'-o-terphenyl, p-, m,p-, o,p-, m,m, o,m- or o,o-quaterphenyl, quinquephenyl, sexiphenyl, 1-, 2-, 3- or 4-fluorenyl, 2-, 3- or 4-spiro-9,9'-bifluorenyl, 1-, 2-, 3- or 4-(9,10-dihydro)phenanthrenyl, 1- or 2-naphthyl, 2-, 3-, 4-, 5-, 6-, 7- or 8-quinolinyl, 1-, 3-, 4-, 5-, 6-, 7- or 8-isoquinolinyl, 1- or 2-(4-methylnaphthyl), 1- or 2-(4-phenylnaphthyl), 1- or 2-(4-naphthylnaphthyl), 1-, 2- or 3-(4-naphthylphenyl), 2-, 3- or 4-pyridyl, 2-, 4- or 5-pyrimidinyl, 2- or 3-pyrazinyl, 3- or 4-pyridanzinyl, 2-(1,3,5-triazin)yl-, 2-, 3- or 4-(phenylpyridyl), 3-, 4-, 5- or 6-(2,2'-bipyridyl), 2-, 4-, 5- or 6-(3,3'-bipyridyl), 2- or 3-(4,4'-bipyridyl) and combinations of one or more of these radicals.

The groups Ar may, as described above, be substituted by one or more radicals $R^5$. These radicals $R^5$ of the structural unit of the formula (1) are preferably selected, identically or differently on each occurrence, from the group consisting of H, F, C(=O)$Ar^1$, P(=O)$(Ar^1)_2$, S(=O)$Ar^1$, S(=O)$_2Ar^1$, a straight-chain alkyl group having 1 to 4 C atoms or a branched or cyclic alkyl group having 3 to 5 C atoms, each of which may be substituted by one or more radicals $R^6$, where one or more H atoms may be replaced by F, or an aromatic ring system having 6 to 24 aromatic ring atoms, which may be substituted by one or more radicals $R^6$, or a combination of these systems; two or more adjacent substituents $R^5$ here may also form a mono- or polycyclic, aliphatic or aromatic ring system with one another.

In particular for the production of layers from solution, straight-chain, branched or cyclic alkyl groups having up to 10 C atoms are also preferred as substituents $R^5$. The radicals $R^5$ are particularly preferably selected, identically or differently on each occurrence, from the group consisting of H, C(=O)$Ar^1$ or an aromatic ring system having 6 to 24 aromatic ring atoms, which may be substituted by one or more radicals $R^6$, but is preferably unsubstituted.

In a further preferred embodiment of the present invention, the group Ar of the structural unit of the formula (1) is, identically or differently on each occurrence, an aromatic ring system having 6 to 24 aromatic ring atoms, which may be substituted by one or more radicals $R^5$. $Ar^1$ is particularly preferably, identically or differently on each occurrence, an aromatic ring system having 6 to 12 aromatic ring atoms.

Particular preference is given to benzophenone derivatives, which are in each case substituted at the 3,5,3',5'-positions by an aromatic or heteroaromatic ring system having 5 to 30 aromatic ring atoms, which may in turn be substituted by one or more radicals $R^5$ in accordance with the above definition. Preference is furthermore given to ketones which are substituted by at least one spirobifluorene group and/or fluorene group.

Preferred aromatic ketone structural units of the formula (1) are therefore the compounds of the following formulae (2) to (5):

(2)

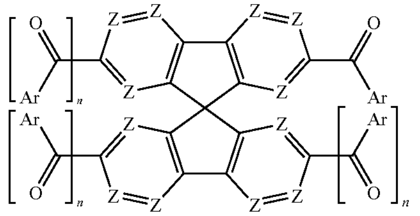

(3)

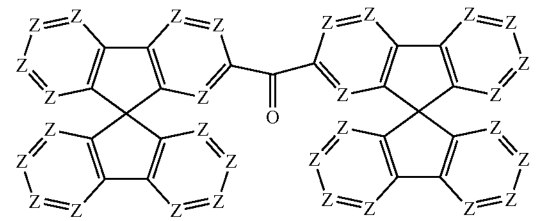

(4)

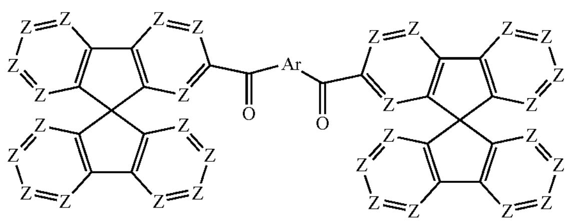

(5)

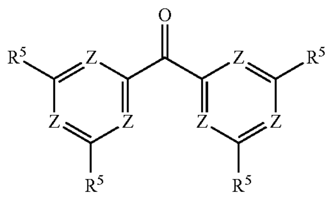

where Ar and $R^5$ have the same meaning as described above in relation to the structural unit of the formula (1), and furthermore:

Z is, identically or differently on each occurrence, $CR^5$ or N; and n is, identically or differently on each occurrence, 0 or 1.

Ar in the above-mentioned formula (2) and (4) preferably stands for an aromatic or heteroaromatic ring system having 1 to 30 aromatic ring atoms, which may be substituted by one or more radicals $R^5$. Particular preference is given to the groups Ar mentioned above.

Examples of suitable structural units of the formula (1) are structures (1-1) to (1-63) depicted below, where at least one H atom, preferably two H atoms, denotes a bond to a further, identical or different structural unit.

(1-1)

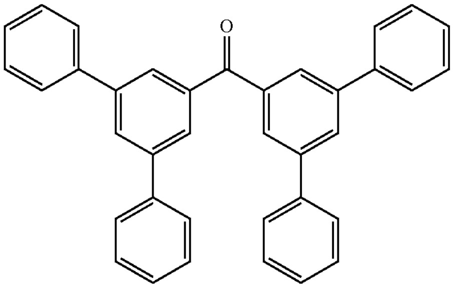

(1-2)

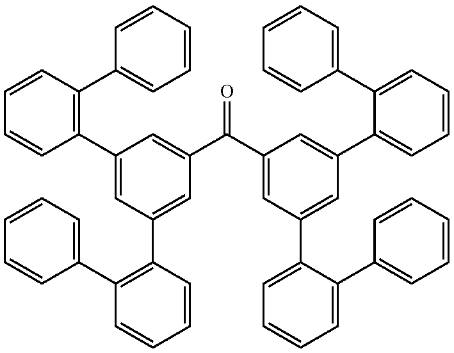

(1-3)

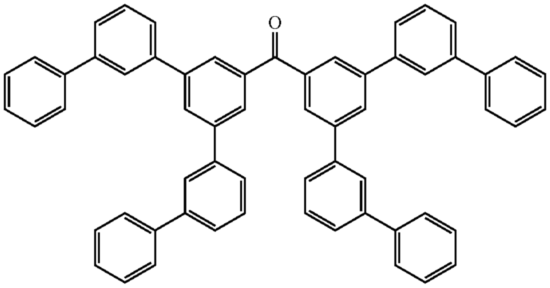

(1-4)

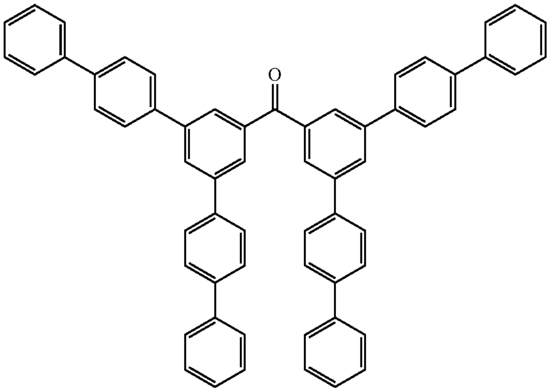

(1-5)

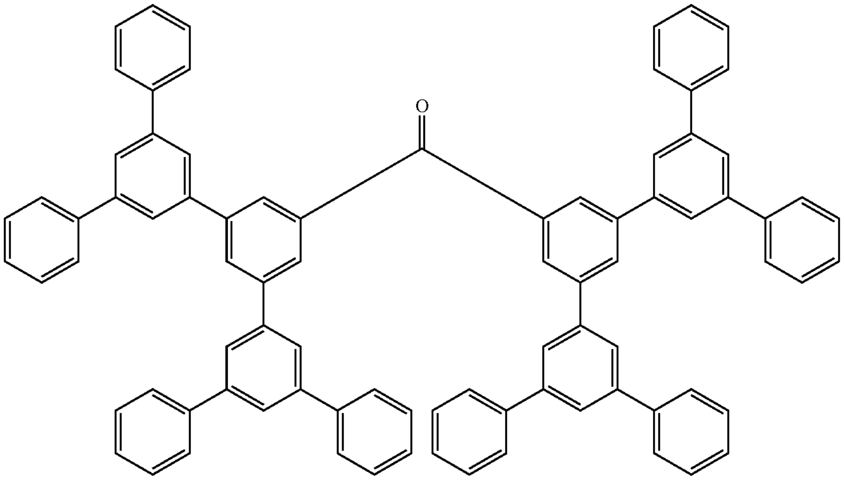

-continued
(1-6)
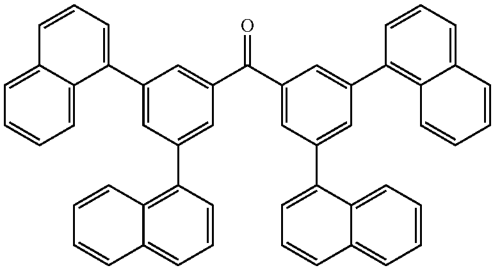
(1-7)
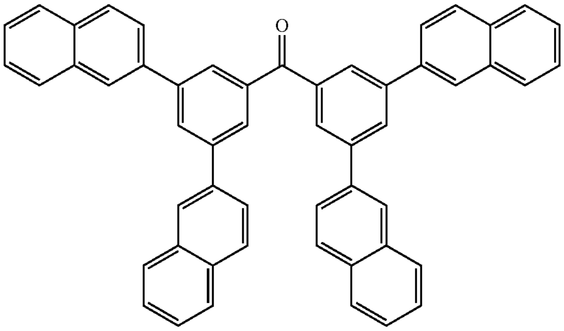
(1-8)
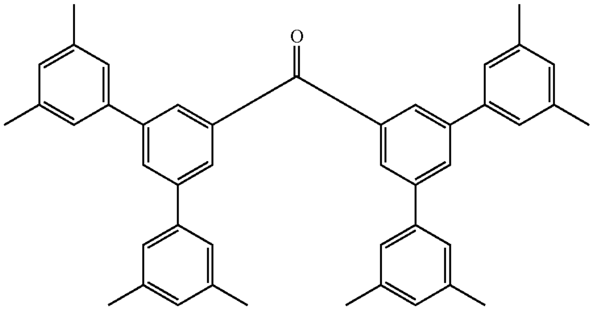
(1-9)
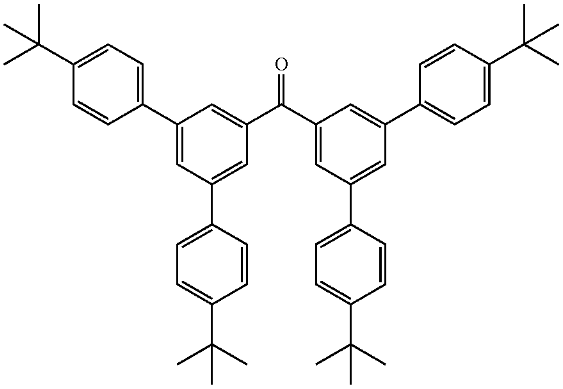
(1-10)
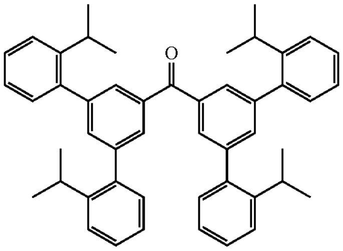
(1-11)
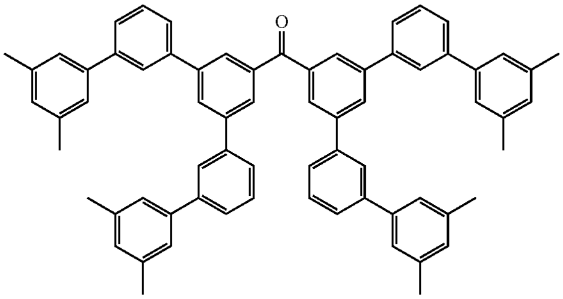
(1-12)
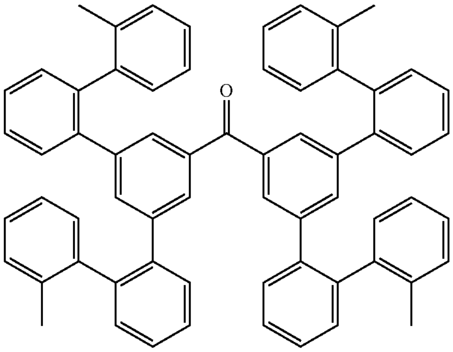
(1-13)
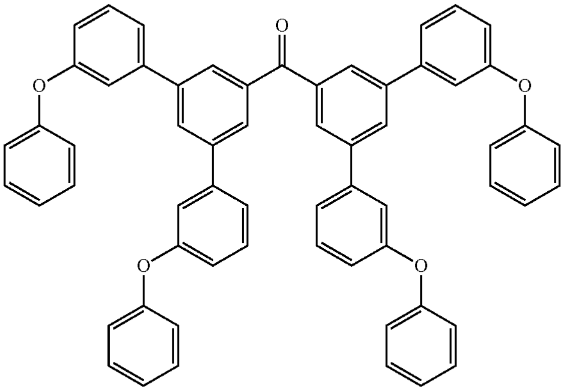

-continued
(1-14)
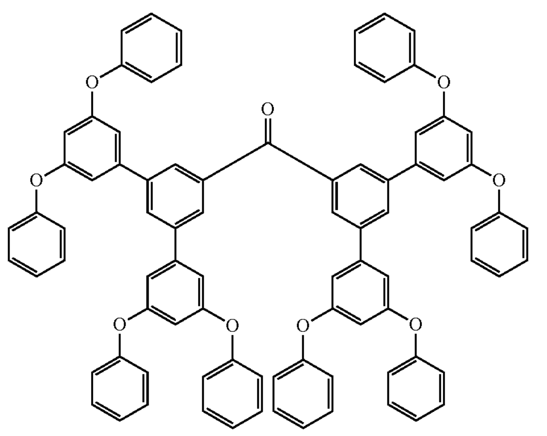
(1-15)
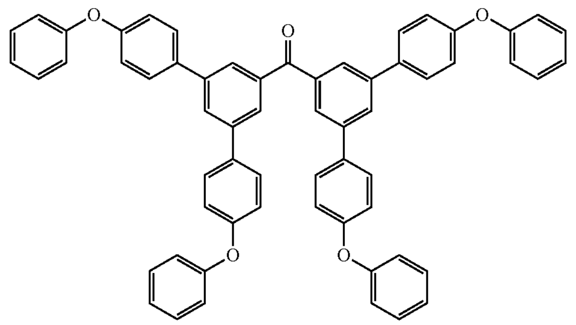
(1-16)
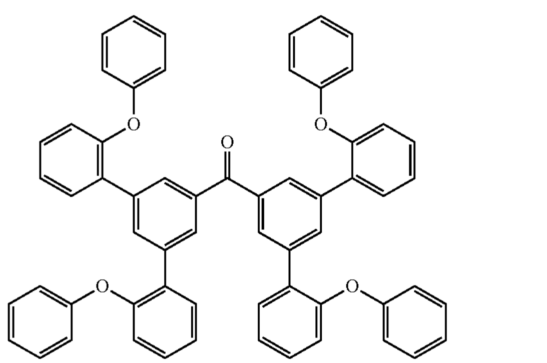
(1-17)
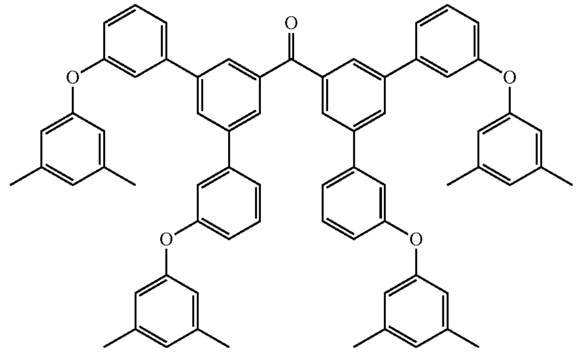
(1-18)
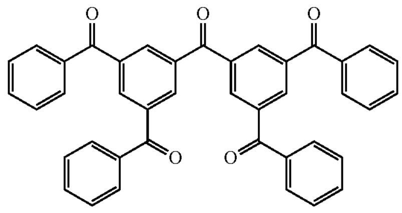
(1-19)
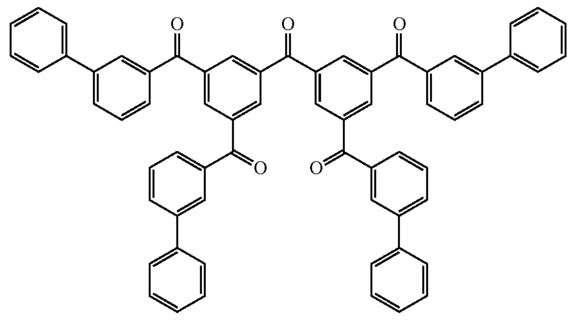
(1-20)
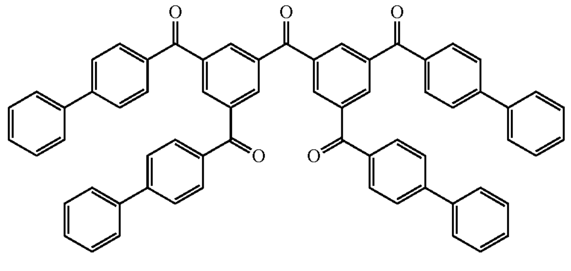
(1-21)
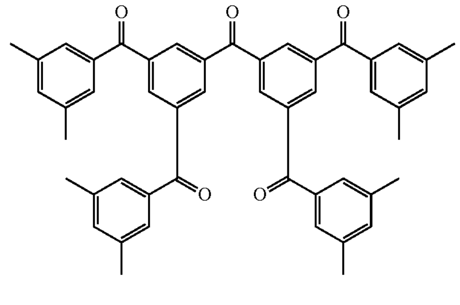

-continued
(1-22)
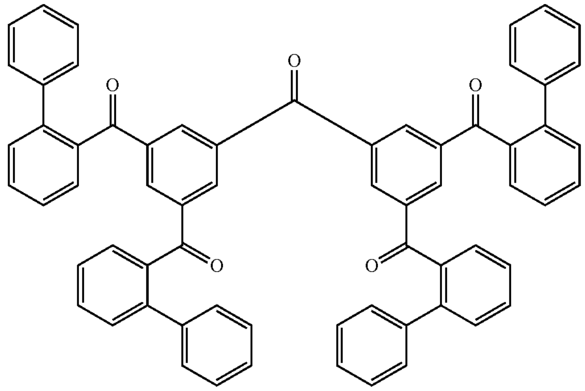
(1-23)
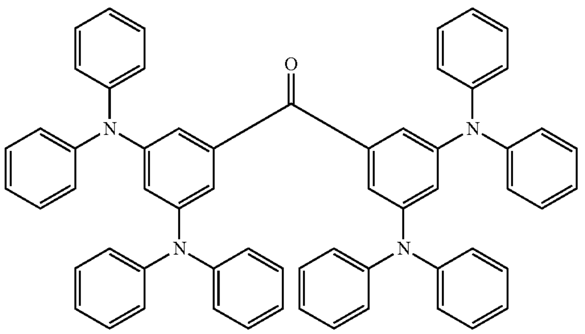
(1-24)
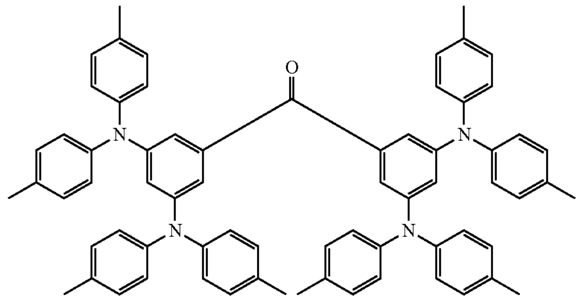
(1-25)
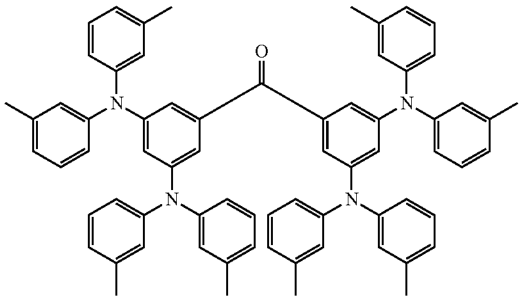
(1-26)
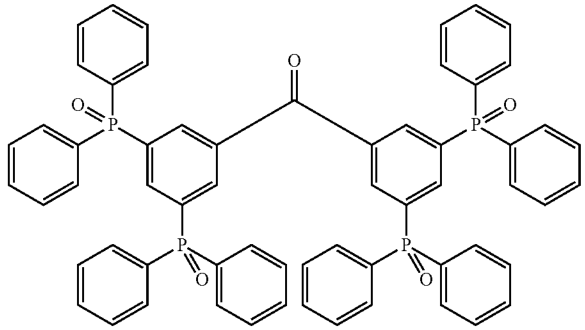
(1-27)
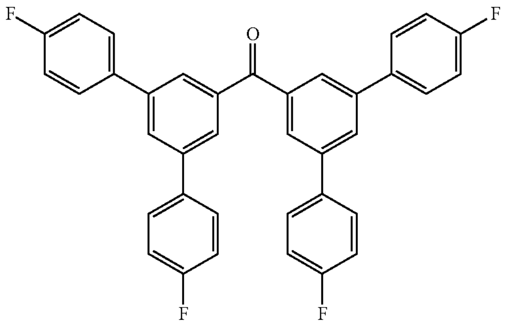
(1-28)
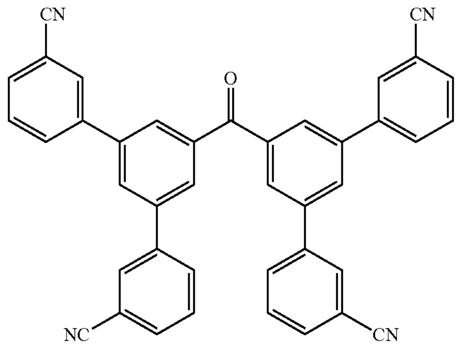
(1-29)
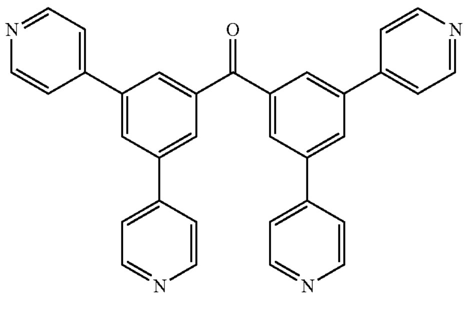

-continued
(1-30)
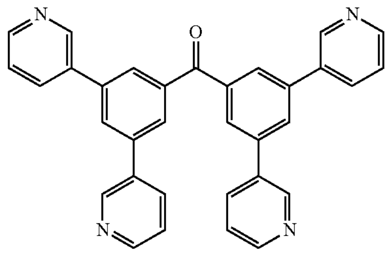
(1-31)
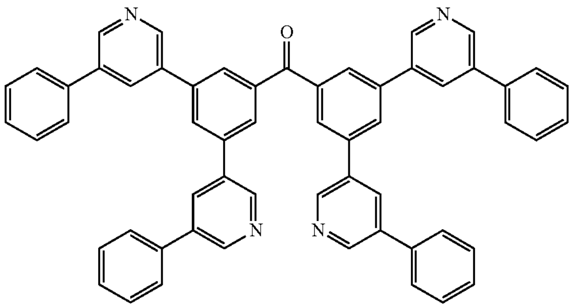
(1-32)
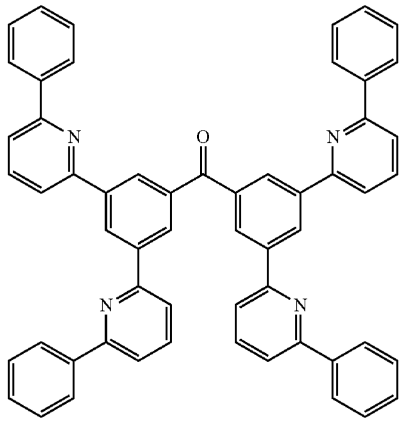
(1-33)
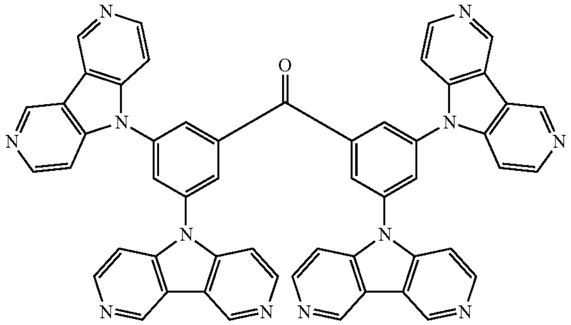
(1-34)
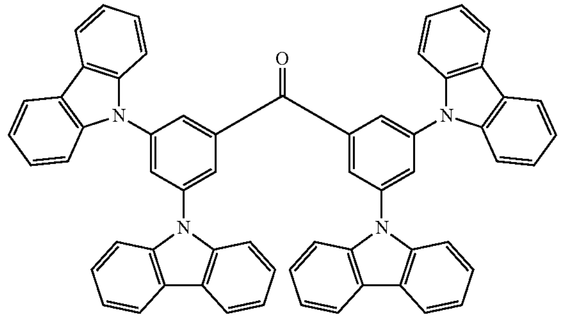
(1-35)
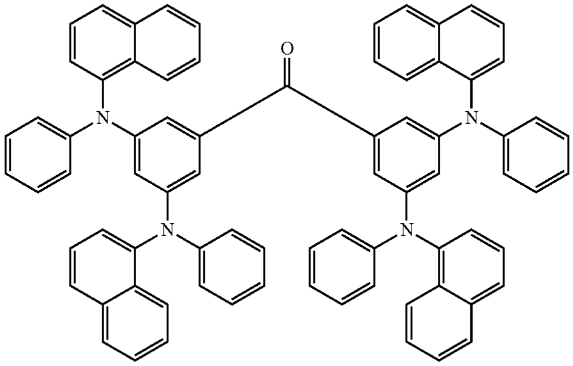
(1-36)
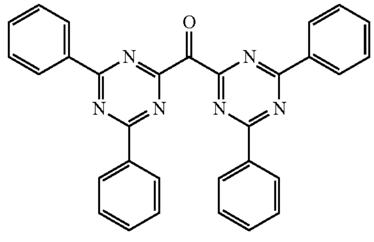
(1-37)
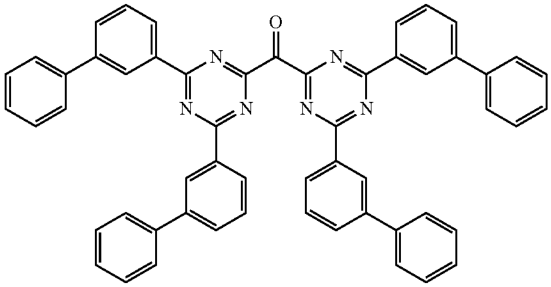

-continued
(1-38)
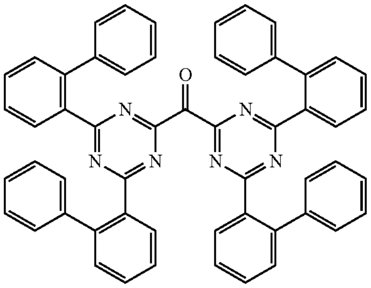
(1-39)
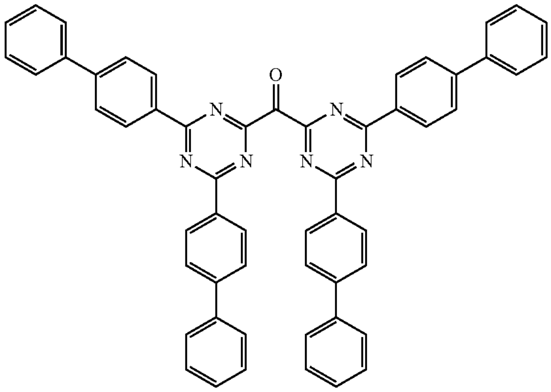
(1-40)
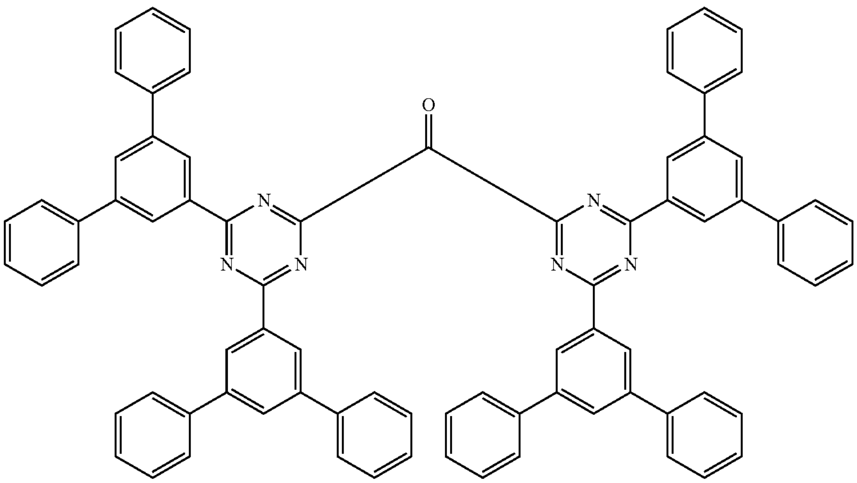
(1-41)
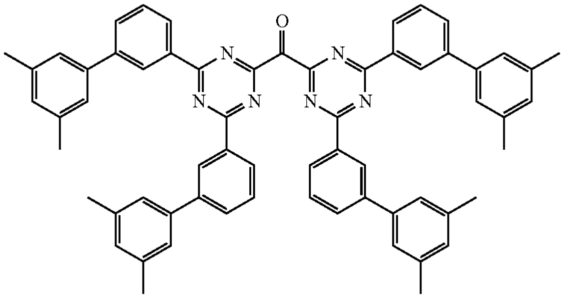
(1-42)
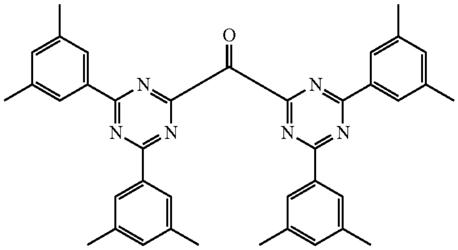
(1-43)
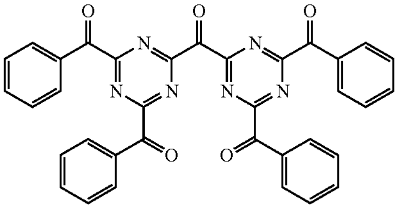
(1-44)
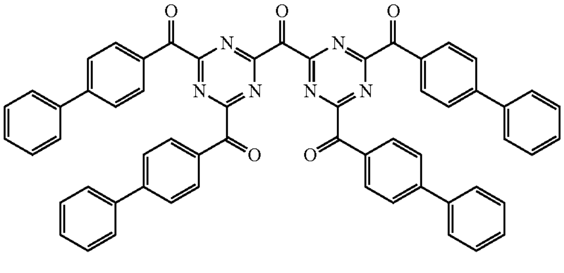

-continued
(1-45)
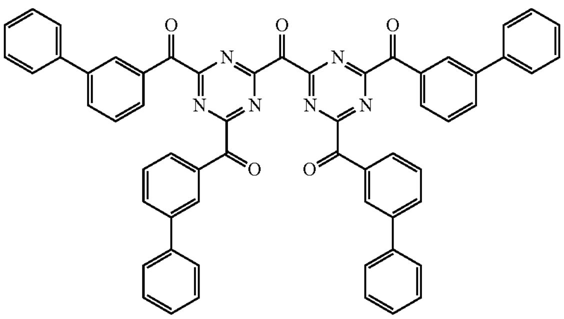
(1-46)
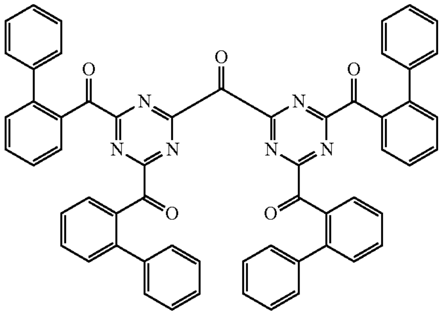
(1-47)
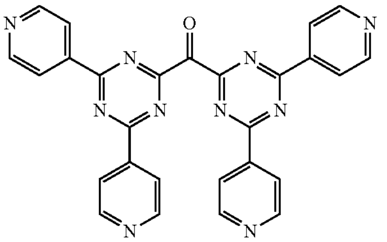
(1-48)
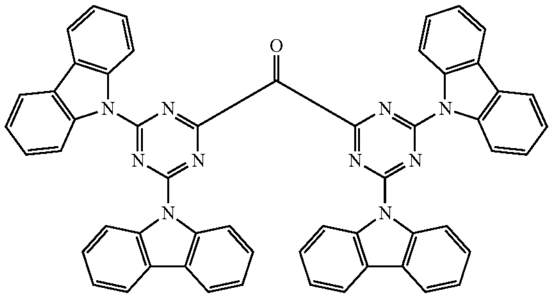
(1-49)
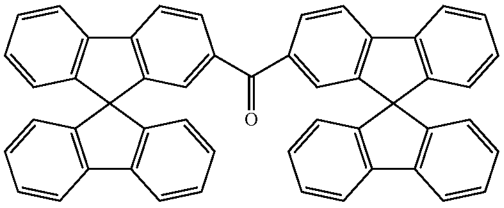
(1-50)
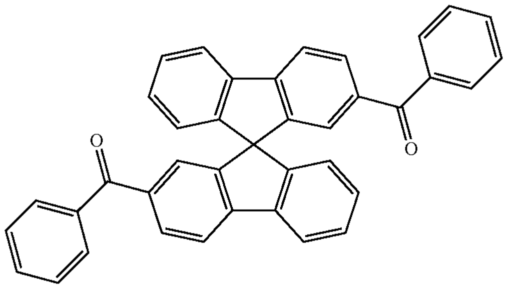
(1-51)
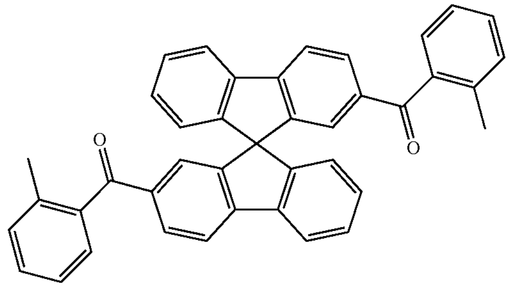
(1-52)
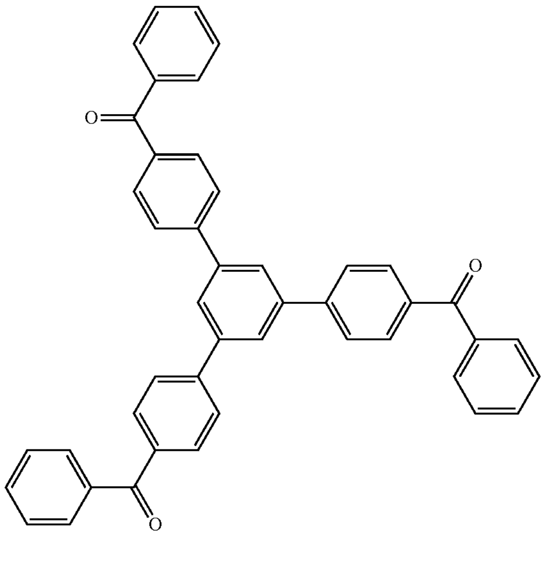

-continued
(1-53)
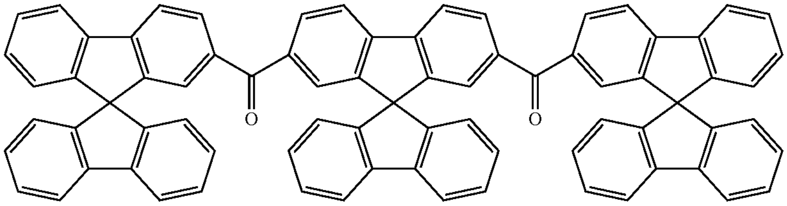
(1-54)
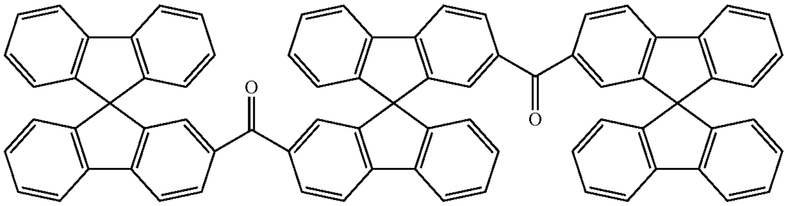
(1-55)
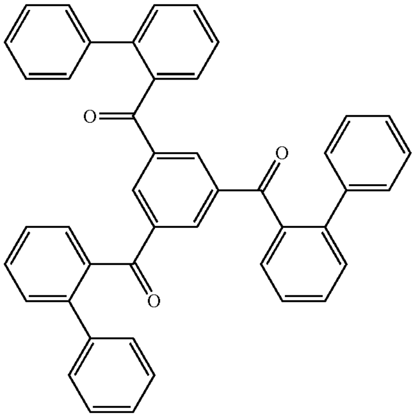
(1-56)
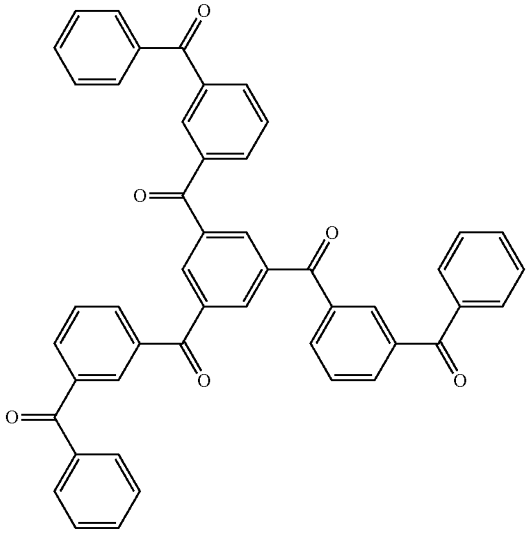
(1-57)
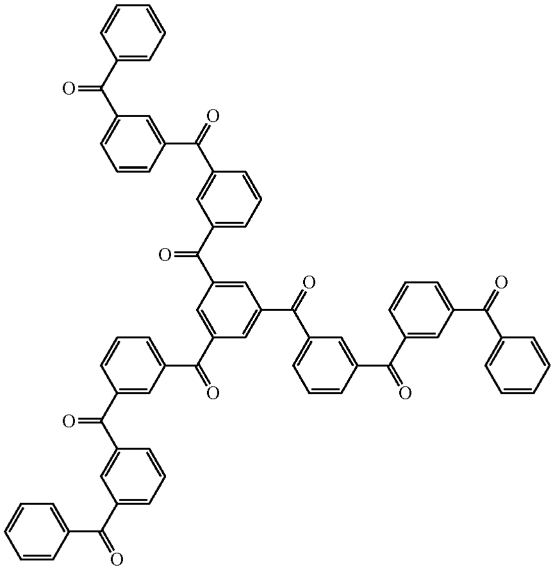
(1-58)
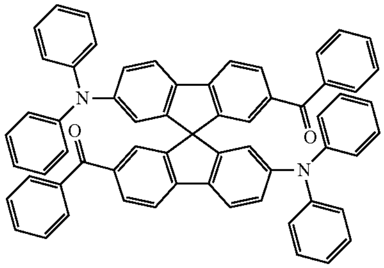

-continued (1-59)

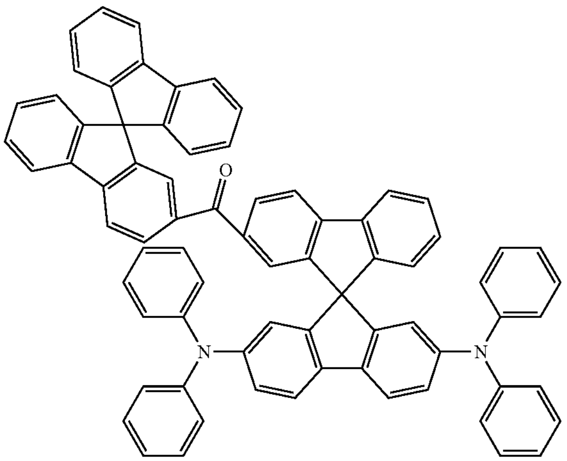

(1-60)

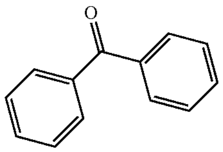

(1-61)

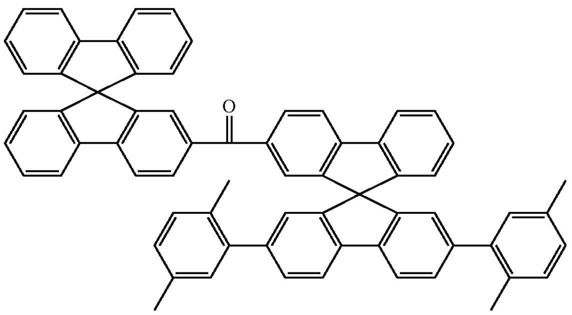

(1-62)

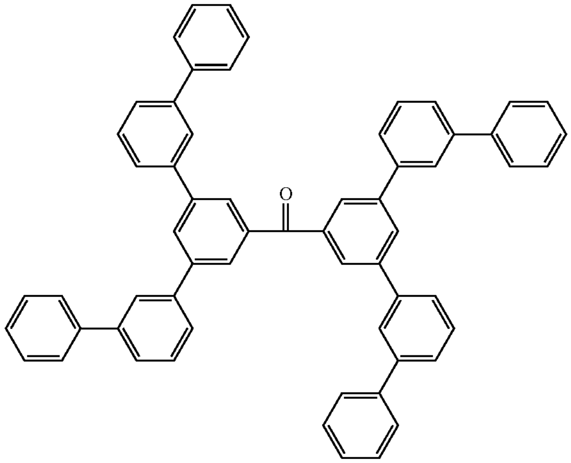

(1-63)

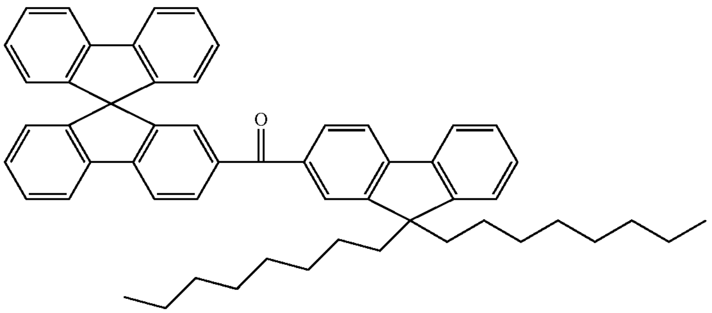

In each of the illustrative structures mentioned above, at least one bond, preferably two bonds, to a further structural unit of the polymer are present, i.e. at least one H atom, preferably two H atoms, represent a bond to a further structural unit.

In a further embodiment according to the invention, the proportion of the units of the formula (1) in the polymer is up to 100 mol %, preferably up to 95 mol %, particularly preferably up to 80 mol % and in particular up to 50 mol %. Likewise in a preferred embodiment, the proportion of the units of the formula (1) in the polymer is at least 0.01 mol %, preferably at least 1 mol %, particularly preferably at least 5 mol % and in particular at least 10 mol %.

In a further embodiment of the present invention, it is preferred for the polymer to contain further structural units which are different from the formula (1). These can be located either in the main chain (backbone) or in a side chain of the polymer. The further structural units can originate, for example, from the following classes:

Group 1: units which influence the hole-injection and/or hole-transport properties of the polymers;

Group 2: units which influence the electron-injection and/or electron-transport properties of the polymers;

Group 3: units which have combinations of individual units from group 1 and group 2;

Group 4: units which modify the emission characteristics to such an extent that electrophosphorescence can be obtained instead of electrofluoroescence;

Group 5: units which improve the transfer from the so-called singlet state to the triplet state;

Group 6: units which influence the emission colour of the resultant polymers;

Group 7: units which are typically used as backbone;

Group 8: units which influence the film-morphological and/or rheological properties of the resultant polymers.

Preferred polymers are those in which at least one structural unit has charge-transport properties, i.e. which contain units from group 1 and/or 2.

Structural units from group 1 which have hole-injection and/or hole-transport properties are, for example, triarylamine, benzidine, tetraaryl-paraphenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S-, Se- or N-containing heterocycles having a high HOMO (HOMO=highest occupied molecular orbital). These arylamines and heterocycles preferably result in an HOMO in the polymer of greater than −5.8 eV (against vacuum level), particularly preferably greater than −5.5 eV.

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles having a low LUMO (LUMO=lowest unoccupied molecular orbital). These units in the polymer preferably result in an LUMO of less than −1.9 eV (against vacuum level), particularly preferably less than −2.5 eV.

It may be preferred for the polymers to contain units from group 3 in which structures which influence, preferably increase, the hole mobility and structures which influence, preferably increase, the electron mobility (i.e. units from group 1 and 2) are bonded directly to one another or structures which increase both the hole mobility and the electron mobility. Some of these units can serve as emitters and shift the emission colour into the green, yellow or red. Their use is thus suitable, for example, for the generation of other emission colours from originally blue-emitting polymers.

Structural units from group 4 are those which are able to emit light from the triplet state with high efficiency, even at room temperature, i.e. exhibit electrophosphorescence instead of electrofluoroescence, which frequently causes an increase in the energy efficiency. Suitable for this purpose are firstly compounds which contain heavy atoms having an atomic number of greater than 36. Preference is given to compounds which contain d or f transition metals which satisfy the above-mentioned condition. Particular preference is given here to corresponding structural units which contain elements from group 8 to 10 (Ru, Os, Rh, Ir, Pd, Pt). Suitable structural units for the polymers according to the invention here are, for example, various complexes, as disclosed, for example, in WO 02/068435 A1, WO 02/081488 A1, EP 1239526 A2 and WO 2004/026886 A2. Corresponding monomers are disclosed in WO 02/068435 A1 and in WO 2005/042548 A1.

Structural units from group 5 are those which improve transfer from the singlet state to the triplet state and which, employed in support of the structural elements from group 4, improve the phosphorescence properties of these structural elements. Suitable for this purpose are, in particular, carbazole and bridged carbazole dimer units, as disclosed, for example, in WO 2004/070772 A2 and WO 2004/113468 A1. Also suitable for this purpose are ketones, phosphine oxides, sulfoxides, sulfones, silane derivatives and similar compounds, as disclosed, for example, in WO 2005/040302 A1.

Structural units from group 6, besides those mentioned above, are those which have at least one further aromatic structure or another conjugated structure which do not fall under the above-mentioned groups, i.e. which have only little influence on the charge-carrier mobilities, are not organometallic complexes or do not influence singlet-triplet transfer. Structural elements of this type can influence the emission colour of the resultant polymers. Depending on the unit, they can therefore also be employed as emitters. Preference is given here to aromatic structures having 6 to 40 C atoms and also tolan, stilbene or bisstyrylarylene derivatives, each of which may be substituted by one or more radicals R. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4"-terphenylylene, 4,4'-bi-1,1'-naphthylylene, 4,4'-tolanylene, 4,4'-stilbenzylene, 4,4"-bisstyrylarylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives, which are preferably substituted, or preferably conjugated push-pull systems (systems which are substituted by donor and acceptor substituents) or systems such as squarines or quinacridones, which are preferably substituted.

Structural units from group 7 are units which contain aromatic structures having 6 to 40 C atoms, which are typically used as polymer backbone. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives.

Structural units from group 8 are those which influence the film-morphological properties and/or rheological properties of the polymers, such as, for example, siloxanes, long alkyl chains or fluorinated groups, but also particularly rigid or flexible units, such as, for example, liquid crystal-forming units or crosslinkable groups.

Preference is given to polymers which, besides the structural units of the formula (1), at the same time additionally contain one or more units selected from groups 1 to 8 which are different from the structural units (recurring units) of the formula (1) according to the invention. It may likewise be preferred for more than one recurring unit from one group to be present at the same time.

Preference is given here to polymers which, besides at least one structural unit of the formula (1), also contain units from group 7, particularly preferably at least 50 mol % of these units, based on the total number of structural units in the polymer.

It is likewise preferred for the polymers to contain units which improve the charge transport and/or charge injection, i.e. units from group 1 and/or 2; a proportion of 0.5 to 30 mol % of these units is particularly preferred; a proportion of 1 to 10 mol % of these units is especially preferred.

It is furthermore particularly preferred for the polymers to contain structural units from group 7 and units from group 1 and/or 2, in particular at least 50 mol % of units from group 7 and 0.5 to 30 mol % of units from group 1 and/or 2.

Particularly preferred structural units in the polymer according to the invention, which, in addition, differ from the structural units of the formula (1), are substituted or unsubstituted cis- or trans-indenofluorenes and substituted or unsubstituted indenofluorene derivatives, such as, for example, indenocarbazoles, or structural units containing two aromatic groups which are connected to one another via a $C_{1-10}$-alkylene group, $C_{2-10}$-alkenylene group, $C_{2-10}$-alkynylene group and $Si_{1-10}$-silylene group, where one or more $CH_2$ units may be replaced by NR, O or S and one or more $SiH_2$ units may be replaced by O. The proportion of these structural units is preferably in the range from 20 to 70 mol %, particularly preferably in the range from 40 to 60 mol % and in particular with 50 mol %, based on the total number of structural units in the polymer.

The indenofluorene structural unit here preferably conforms to the following formula (I):

(I)

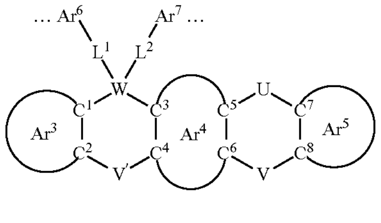

where the symbols and indices used have the following meanings:

the dashed lines represent, independently of one another, a bond to a further structural unit of the polymer;

$L^1$ and $L^2$ represent, independently of one another, a single covalent bond or a unit selected from the group consisting of a $C_{1-10}$-alkylene group, $C_{2-10}$-alkenylene group, $C_{2-10}$-alkynylene group and $Si_{1-10}$-silylene group, where one or more $CH_2$ units may be replaced by NR, O or S and one or more $SiH_2$ units may be replaced by O;

W represents a tetravalent unit selected from the group consisting of C, Si, Ge and a structural element of the following formulae (II) and (III):

(II)

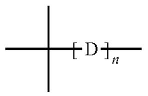

(III)

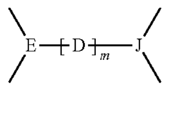

where D is, identically or differently on each occurrence, a unit selected from the group consisting of $CR_2$, O, S and NR;

E and J are each, independently of one another, units selected from the group consisting of CR and N;

n is 1, 2 or 3;

m is 0, 1 or 2; where

R is a radical selected from the group consisting of H, D, F and $C_{1-6}$-alkyl;

with the proviso that only one representative from E, D and J is different from $CR^1$ or $CR^2_2$;

where, in the case where W is a tetravalent unit of the formula (II) or (III), $C^1$ and $C^3$ are bonded to different atoms of the unit W;

U, V and V' represent, independently of one another, a single covalent bond or a divalent unit selected from the group consisting of $CR^1R^2$, C═O, $NR^1$, O, $SiR^1R^2$, P═O, S and $GeR^1R^2$;

where $R^1$ and $R^2$ in the formula (I) are selected, independently of one another, from the group consisting of H, D, F, a $C_{1-40}$-alkyl group, a $C_{2-40}$-alkenyl group, a $C_{2-40}$-alkynyl group, an optionally substituted $C_{6-40}$-aryl group and an optionally substituted 5- to 25-membered heteroaryl group;

$C^1$ to $C^8$ each represent a C atom;

$Ar^6$ and $Ar^7$ each represent, independently of one another, a 5- to 25-membered optionally substituted aromatic or heteroaromatic ring system;

$Ar^3$, $Ar^4$ and $Ar^5$ represent, independently of one another, an optionally substituted $C_{6-40}$-aryl group or an optionally substituted 5- to 25-membered heteroaryl group, where C atoms $C^1$ and $C^2$ are part of $Ar^3$, C atoms $C^3$ to $C^6$ are part of $Ar^4$ and C atoms $C^7$ and $C^8$ are part of $Ar^5$.

In a further embodiment of the present invention, it is preferred for L' and $L^2$ to represent a single covalent bond.

In still a further embodiment of the present invention, it is preferred for W to be selected from the group consisting of C, Si and Ge. W is particularly preferably a carbon atom.

In still a further embodiment of the present invention, it is preferred for one representative from U and V in compounds of the formula (I) to represent a single covalent bond and for the other representative to represent a unit $CR^1R^2$— as described above.

In still a further embodiment of the present invention, it is preferred for $Ar^6$ and $Ar^7$ to represent a 6- to 14-membered optionally substituted aromatic ring system. In accordance with the invention, the term "6- to 14-membered optionally substituted aromatic ring system" is intended to encompass all compounds which fall under the number-of-atoms sub-set of the term defined as "5- to 25-membered optionally substituted aromatic ring system". These ring systems are preferably phenyl, naphtyl, anthracyl and phenanthryl, particularly preferably phenyl and naphtyl and in particular phenyl.

In still a further embodiment of the present invention, it is preferred for one, two or all three representatives from $Ar^3$, $Ar^4$ and $Ar^5$ to be, independently of one another, an optionally substituted $C_{6-14}$-aryl group. In accordance with the invention, the term "$C_{6-14}$-aryl group" is intended to encompass all compounds which fall under the number-of-atoms sub-set of the term defined as "$C_{6-40}$-aryl group". These ring systems are preferably phenyl, naphtyl, anthracyl and phenanthryl, particularly preferably phenyl and naphtyl and in particular phenyl.

All non-preferred and preferred constituents of the above-mentioned embodiments can be combined with one another as desired in accordance with the invention. These combinations are likewise part of the present invention.

A further preferred embodiment according to the invention is a polymer which contains at least one structural unit of the following formulae (IVa), (IVb) and/or (IVc):

(IVa)

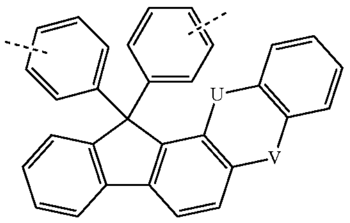

(IVb)

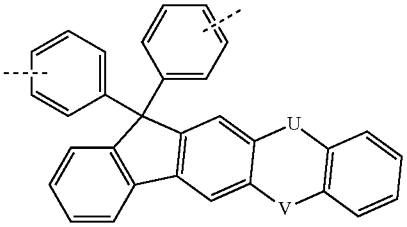

(IVc)

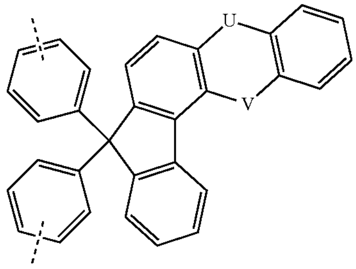

where the dashed lines, U and V have the same meanings as defined in the above-mentioned embodiments and preferred embodiments for the formula (I). The bonds denoted by the dashed lines represent bonds in the ortho-, meta- or para-position on the corresponding phenyl rings. The meta- and para-positions are preferred. It is also preferred for one representative from U and V to represent a single covalent bond and for the other representative to be $CR^1R^2$.

A further particularly preferred embodiment is thus a polymer which contains at least one structural unit of the following formulae (Va) and/or (Vb):

(Va1)

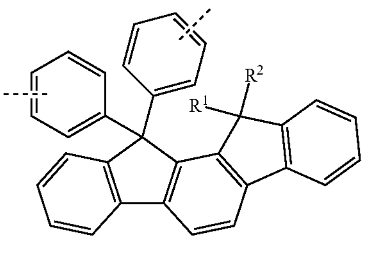

(Va2)

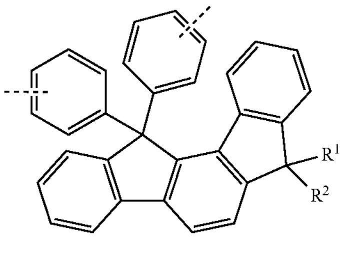

-continued (Va3)

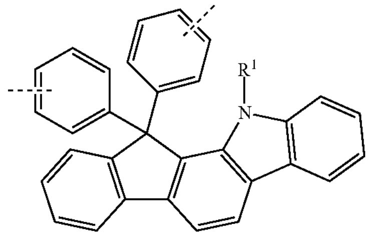

(Va4)

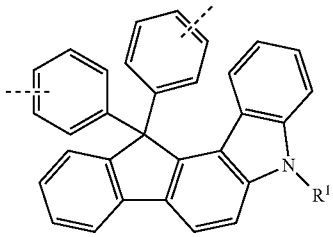

(Vb1)

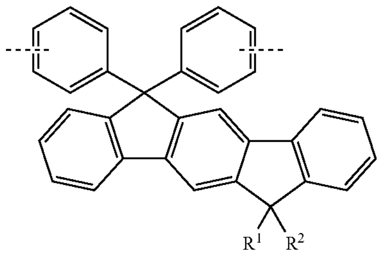

(Vb2)

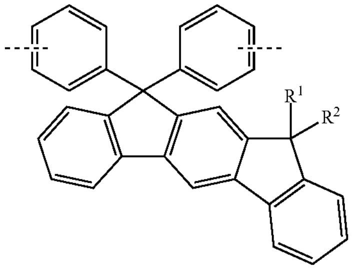

(Vb3)

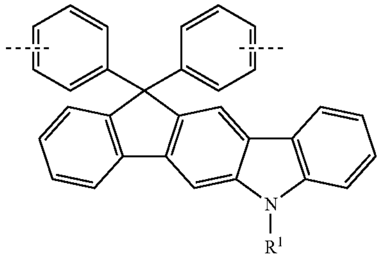

(Vb4)

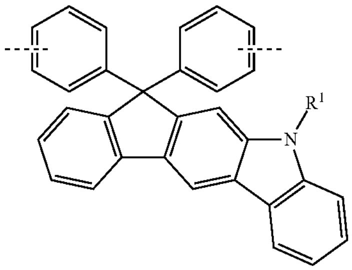

where the dashed lines have the same meaning as in the above embodiments, and $R^1$ and $R^2$ have the same meanings as $R^1$ and $R^2$ in relation to formula (I).

A particularly preferred comonomer structural unit is the following indenofluorene structural unit:

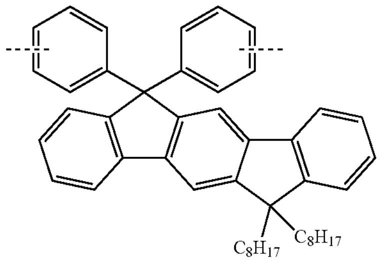

Of the structural units which contain two aromatic groups which are connected to one another via a linear $C_1$-$C_{10}$-alkylene group, the following structural unit is particularly preferred:

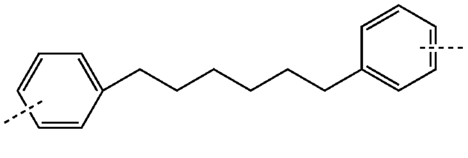

Of the structural units which contain two aromatic groups which are connected to one another via a linear $C_1$-$C_{10}$-alkylene group, where one or more $CH_2$ groups have been replaced by O, the following structural unit is particularly preferred:

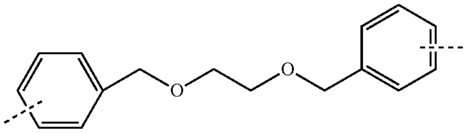

Of the structural units which contain two aromatic groups which are connected to one another via a linear $Si_1$-$Si_{10}$-silylene group, the following structural unit is particularly preferred:

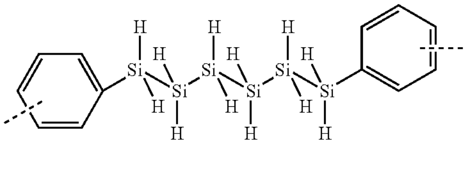

The polymers according to the invention are generally prepared by polymerisation of one or more types of monomer, of which at least one type of monomer forms structural units of the formula (1) in the polymer. Suitable polymerisation reactions are known to the person skilled in the art and are described in the literature. Particularly suitable and preferred polymerisation reactions which result in C—C or C—N links are the following:

(A) SUZUKI polymerisation;
(B) YAMAMOTO polymerisation;
(C) STILLE polymerisation;
(D) HECK polymerisation;
(E) NEGISHI polymerisation;
(F) SONOGASH IRA polymerisation;
(G) HIYAMA polymerisation; and
(H) HARTWIG-BUCHWALD polymerisation.

The way in which the polymerisation can be carried out by these methods and the way in which the polymers can then be separated off from the reaction medium and purified is known to the person skilled in the art and is described in detail in the literature, for example in WO 03/048225 A2, WO 2004/037887 A2 and WO 2004/037887 A2.

The methods for the C—C linking reactions are preferably selected from the group comprising SUZUKI coupling, YAMAMOTO coupling and STILLE coupling. The method for a C—N linking reaction is preferably a HARTWIG-BUCHWALD coupling.

The present invention thus also relates to a process for the preparation of the polymers according to the invention, which is characterised in that they are prepared by SUZUKI polymerisation, YAMAMOTO polymerisation, STILLE polymerisation or HARTWIG-BUCHWALD polymerisation.

The dendrimers according to the invention can be prepared by processes known to the person skilled in the art or analogously thereto. Suitable processes are described in the literature, such as, for example, in Frechet, Jean M. J.; Hawker, Craig J., "Hyperbranched polyphenylene and hyper-branched polyesters: new soluble, three-dimensional, reactive polymers", Reactive & Functional Polymers (1995), 26(1-3), 127-36; Janssen, H. M.; Meijer, E. W., "The synthesis and characterization of dendritic molecules", Materials Science and Technology (1999), 20 (Synthesis of Polymers), 403-458; Tomalia, Donald A., "Dendrimer molecules", Scientific American (1995), 272(5), 62-6, WO 02/067343 A1 and WO 2005/026144 A1.

The synthesis of the above-described units from group 1 to 8 and the further emitting units is known to the person skilled in the art and is described in the literature, for example in WO 2005/014689 A2, WO 2005/030827 A1 and WO 2005/030828 A1. These documents and the literature cited therein are incorporated into the present application by way of reference.

In an embodiment of the mixture according to the invention, the carbazole compound is preferably a compound of the formula (6)

(6)

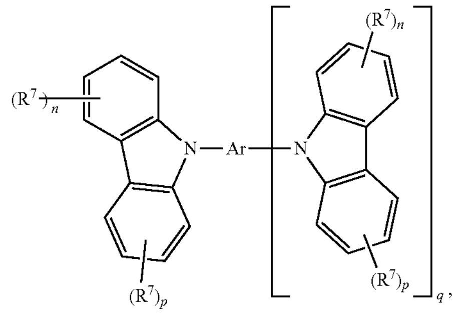

where the following applies to the symbols and indices used:

Ar is on each occurrence an aromatic or heteroaromatic ring system having 5 to 60 aromatic ring atoms, which may be substituted by one or more radicals $R^7$;

$R^7$ is on each occurrence, identically or differently, H, D, F, Cl, Br, I, $N(Ar^2)_2$, CN, $NO_2$, $Si(R^8)_3$, $B(OR^8)_2$, C(═O)$Ar^2$, P(═O)$(Ar^2)_2$, S(═O)$Ar^2$, S(═O)$_2Ar^2$, —$CR^8$═$CR^8(Ar^2)$, $OSO_2R^8$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^8$, where one or more non-adjacent $CH_2$ groups may be replaced by $R^8C$═$CR^8$, C≡C, $Si(R^8)_2$, $Ge(R^8)_2$, $Sn(R^8)_2$, C═O, C═S, C═Se, C═$NR^8$, P(═O)($R^8$), SO, $SO_2$, $NR^8$, O, S or $CONR^8$ and where one or more H atoms may be replaced by F, Cl, Br, I, CN or $NO_2$, or an aromatic or heteroaromatic ring system having 5 to 60 aromatic ring atoms, which may in each case be substituted by one or more radicals $R^8$, or an aryloxy or heteroaryloxy group having 5 to 60 aromatic ring atoms, which may be substituted by one or more radicals $R^8$, or a combination of these systems; two or more substituents R here may also form a mono- or polycyclic, aliphatic or aromatic ring system with one another;

$R^7$ is on each occurrence, identically or differently, R, a group $Ar^e$ or F;

$Ar^e$ is on each occurrence, identically or differently, an aromatic or heteroaromatic ring system having 5 to 60 aromatic ring atoms, which may be substituted by one or more radicals $R^8$;

$R^8$ is on each occurrence, identically or differently, H, D or an aliphatic, aromatic and/or heteroaromatic hydrocarbon radical having 1 to 20 C atoms; or an aromatic or heteroaromatic ring system having 5 to 60 aromatic ring atoms, which may be substituted by one or more radicals R; two or more substituents $R^8$ here may also form a mono- or polycyclic, aliphatic, aromatic or heteroaromatic ring system with one another;

n is on each occurrence, identically or differently, 0, 1, 2, 3 or 4;

p is on each occurrence, identically or differently, 0, 1, 2, 3 or 4; and q is 1, 2, 3, 4 or 5.

If the index q is equal to 1, this means that Ar in compounds of the formula (6) represents a divalent group. If the index q is greater than 1, this means that in total three or more carbazole groups are bonded to the aromatic ring system Ar in compounds of the formula (6). In compounds of the formula (6), Ar is a trivalent group for q=2 and a correspondingly polyvalent group for q>2. The index q is preferably 1 or 2, particularly preferably q=1.

The carbazole compounds of the formula (6) employed in accordance with the invention preferably have a glass-transition temperature $T_g$ of greater than 120° C., particularly preferably greater than 140° C.

For the purposes of the present invention, the carbazole compound of the formula (6) serves principally as matrix material and/or as hole-transport material. A hole-transporting material in the sense of the present application is characterised by an HOMO of preferably greater than −5.4 eV. An electron-transporting material in the sense of the present application is characterised by an LUMO of preferably less than −2.4 eV. The HOMO and LUMO positions and the energy gap are preferably determined by cyclic voltammetry.

In a preferred embodiment of the present invention, the indices n in compounds of the formula (6) are on each occurrence, identically or differently, 0 or 1. The indices n are particularly preferably 0.

In an embodiment, the index p in the compound of the formula (6) is preferably, identically or differently on each occurrence, 0, 1 or 2, particularly preferably 0 or 1. If the index p is equal to 1, the substituent $R^7$ is preferably bonded in the 5-position or in the 7-position of the carbazole, particularly preferably in the 5-position. If the index p is equal to 2, the substituents $R^7$ are preferably bonded in the 5- and 7-position of the carbazole.

For the purposes of clarity, the numbering of the positions of the carbazole is depicted in the following formula:

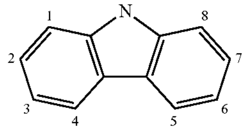 [SMILES: c1ccc2c(c1)[nH]c1ccccc12]

Preferred groups Ar and $R^8$ in formula (6) contain only phenyl and/or naphthyl groups or heteroaromatic groups having not more than two condensed, aromatic or heteroaromatic rings, but no larger condensed aromatic systems. Preferred groups Ar and $R^8$ are therefore aromatic ring systems built up from phenyl and/or naphthyl groups or linkings of these systems, such as, for example, biphenyl, fluorene and spirobifluorene.

Particularly preferred groups Ar are selected from the group consisting of 1,2-phenylene, 1,3-phenylene, 1,4-phenylene, 1,3,5-benzene, 3,3'-biphenyl, 4,4'-biphenyl, 1,3,5-triphenylbenzene, triphenylamine, 2,7-fluorenylene, which may be substituted by one or more radicals $R^7$, 2,7-spirobifluorenylene, which may be substituted by one or more radicals $R^7$, indenofluorenylene, which may be substituted by one or more radicals $R^7$, 4,4'''-(1,1':2',1'', 2'',1'''-quaterphenyl), 4,4'-(2,2'-dimethylbiphenyl), 4,4'-(1,1'-binaphthyl), 4,4'-stilbenzyl and dihydrophenanthrenyl, which may be substituted by one or more radicals $R^7$.

Particularly preferred groups $R^8$ of the carbazole compound are selected, identically or differently, from the group consisting of phenyl, 1-naphthyl, 2-naphthyl, 2-carbazolyl, 3-carbazolyl, 9-carbazolyl, triphenylamine, naphthyldiphenylamine and dinaphthylphenylamine, each of which may be substituted by one or more radicals R. The two last-mentioned groups here may be bonded via the naphthalene in the 1- or 2-position or via the phenyl group. A 2- or 3-carbazolyl group here is preferably substituted on the nitrogen by an aromatic radical Ar.

Preference is furthermore given to compounds of the formula (6) in which the symbol R stands, identically or differently on each occurrence, for H, D, $N(Ar^2)_2$, a straight-chain alkyl group having 1 to 5 C atoms or branched alkyl group having 3 to 5 C atoms, where in each case one or more non-adjacent $CH_2$ groups may be replaced by —$R^8C$═$CR^8$— or —O— and where one or more H atoms may be replaced by F, or an aryl group having 6 to 16 C atoms or heteroaryl group having 2 to 16 C atoms or a spirobifluorene group, each of which may be substituted by one or more radicals $R^8$, or a combination of two of these systems. Particularly preferred radicals R are, identically or differently on each occurrence, H, D, methyl, ethyl, isopropyl, tert-butyl, where in each case one or more H atoms may be replaced by F, or a phenyl, naphthyl or spirobifluorenyl group, which may in each case be substituted by one or more radicals R, or a combination of two of these systems. In the case of compounds which are processed from solution, linear or branched alkyl chains having up to 10 C atoms are particularly preferred. Bromine, boronic acid or boronic acid derivatives as substituents are preferred, above all, for use of this compound as intermediate compound for the preparation of further compounds according to the invention, for example polymers, oligomers or dendrimers.

Preference is furthermore given to compounds of the formula (6) in which the symbol $R^7$ is defined, identically or differently on each occurrence, correspondingly to the preferred substituent R or stands for $Ar^2$ or F.

Examples of further preferred compounds of the formula (6) are structures (6-1) to (6-91) depicted below.

(6-1)

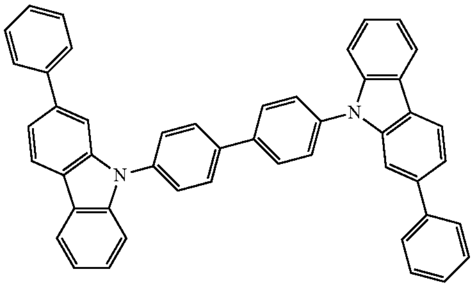

(6-2)

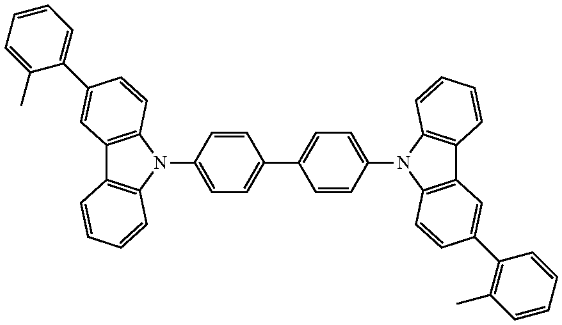

(6-3)

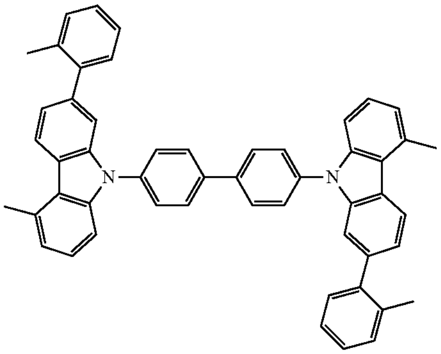

(6-4)

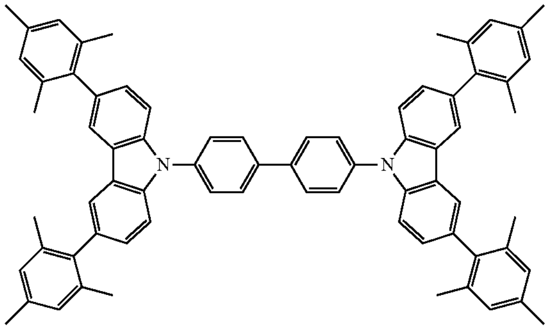

(6-5)

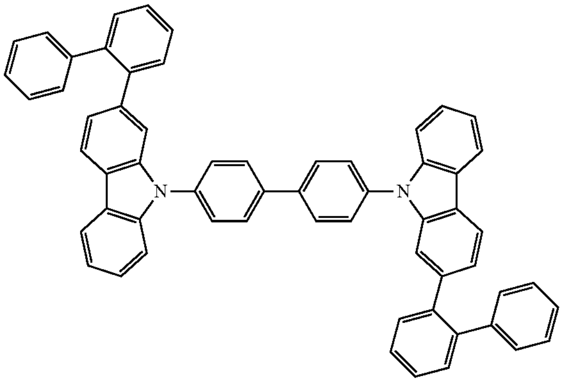

(6-6)

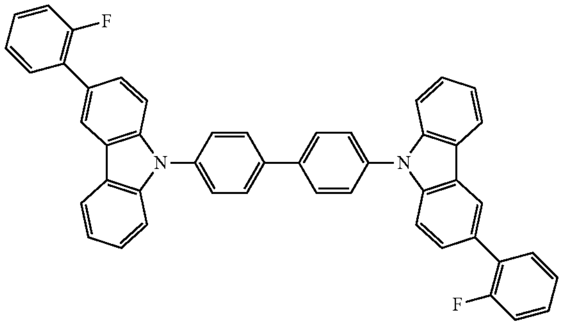

(6-7)

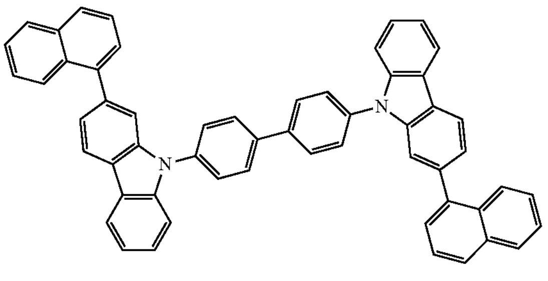

(6-8)

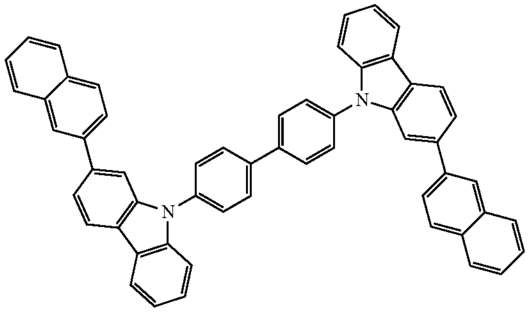

-continued
(6-9)
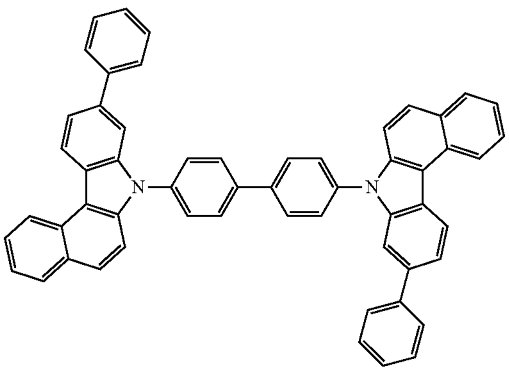
(6-10)
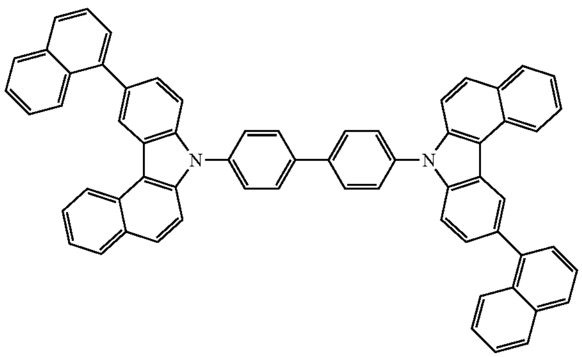
(6-11)
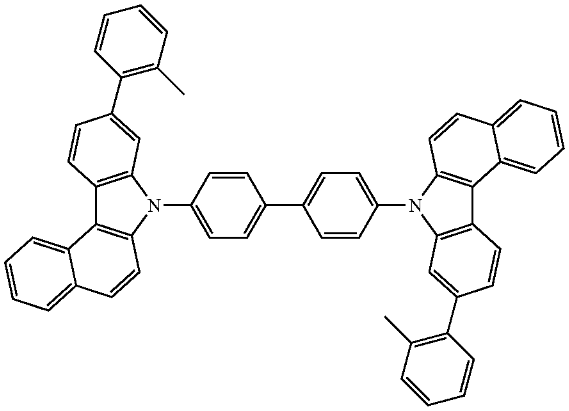
(6-12)
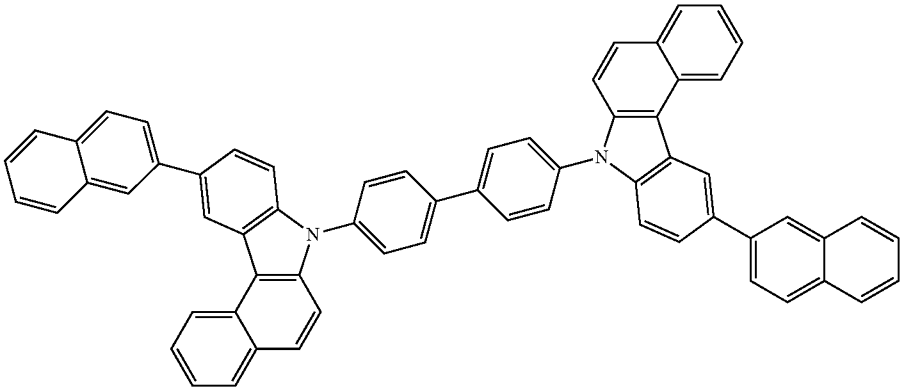
(6-13)
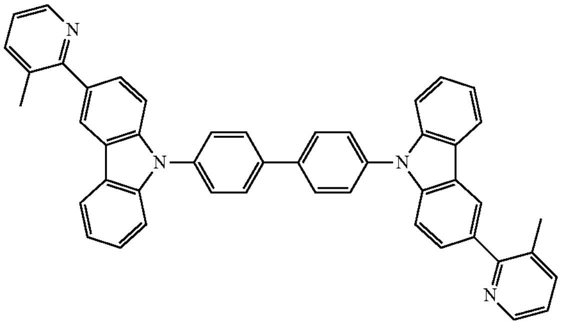
(6-14)
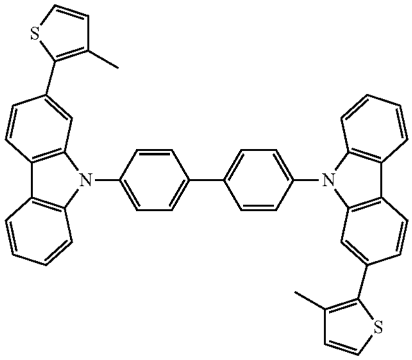

-continued
(6-15)
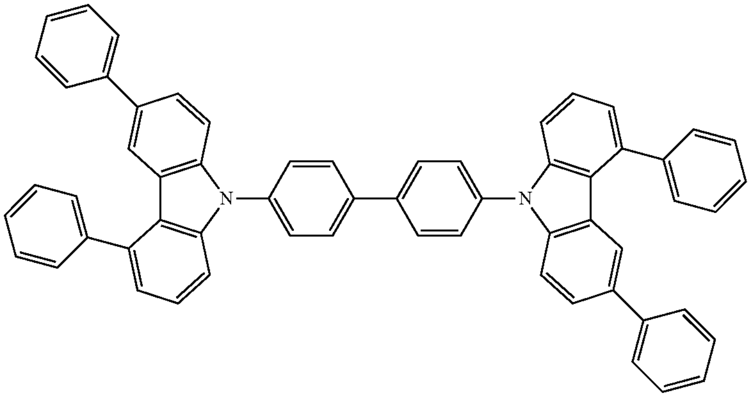
(6-16)
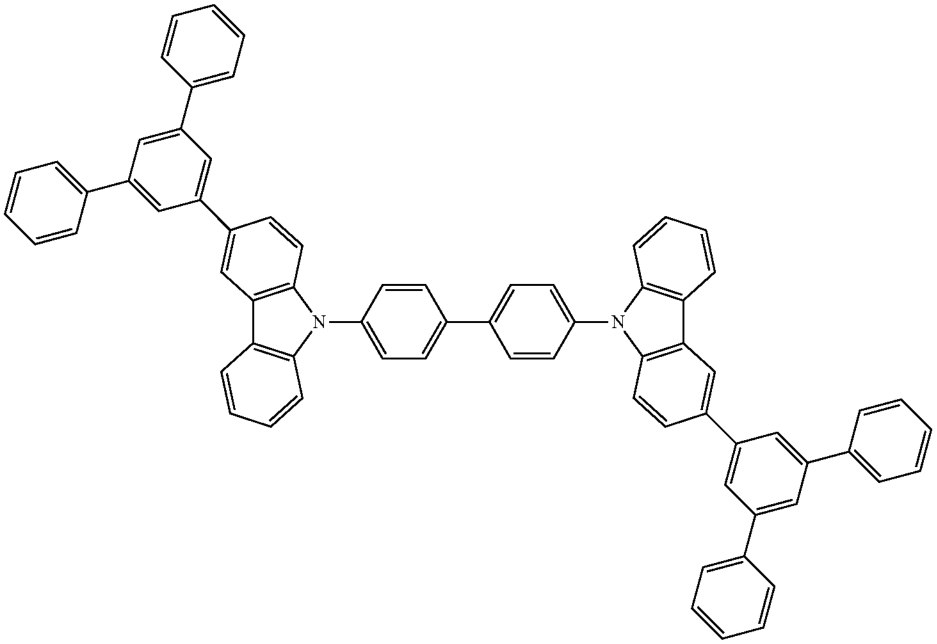
(6-17)
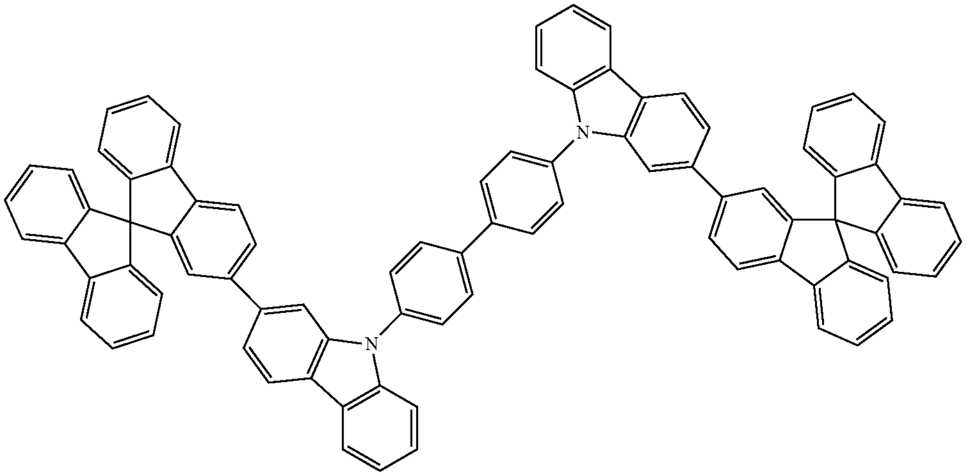

-continued
(6-18)
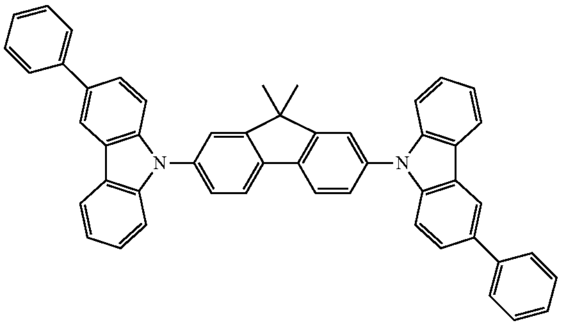
(6-19)
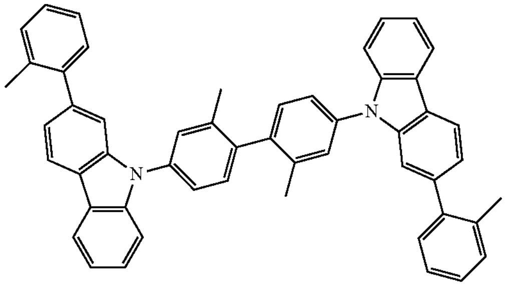
(6-20)
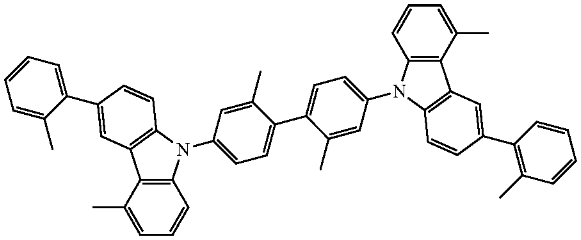
(6-21)
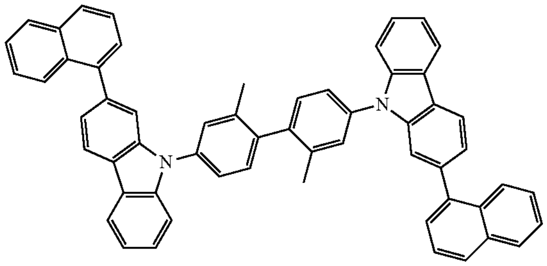
(6-22)
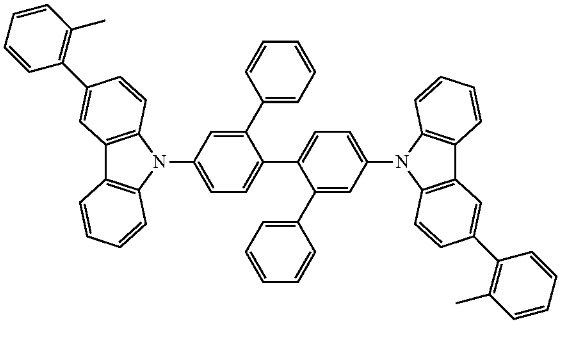
(6-23)
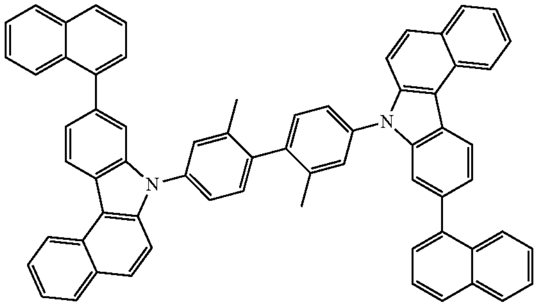
(6-24)
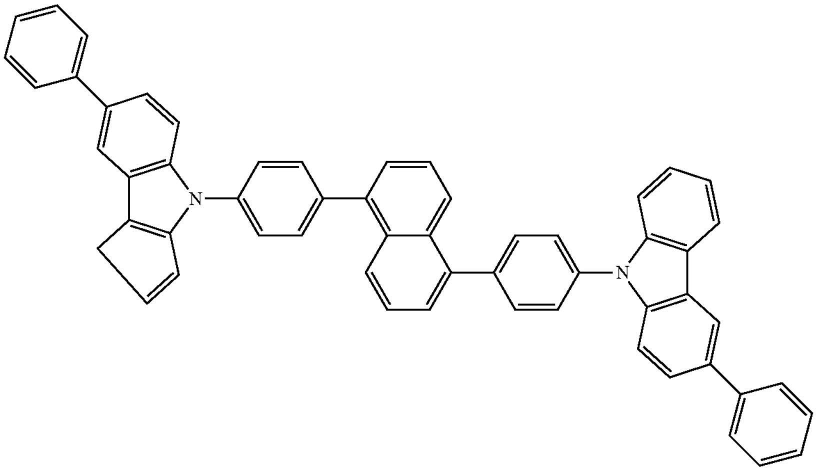

-continued
(6-25)
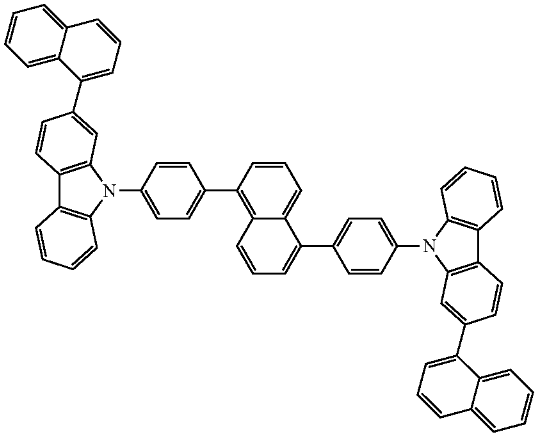
(6-26)
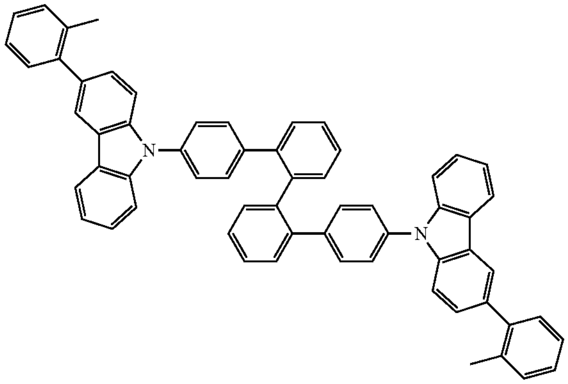
(6-27)
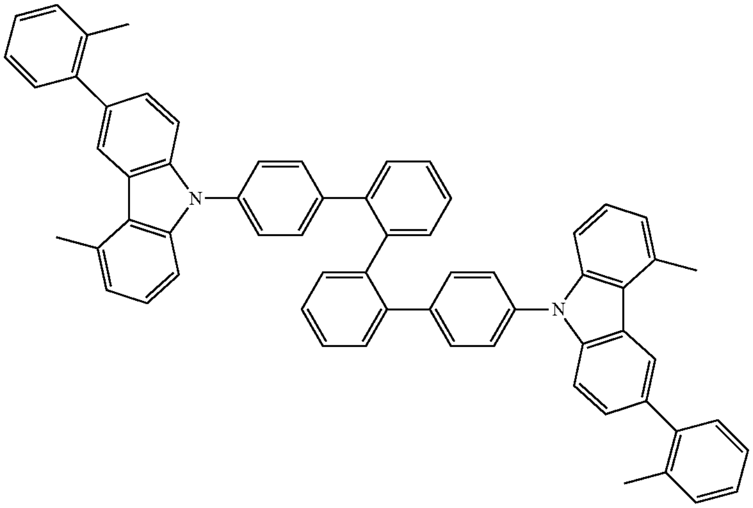
(6-28)
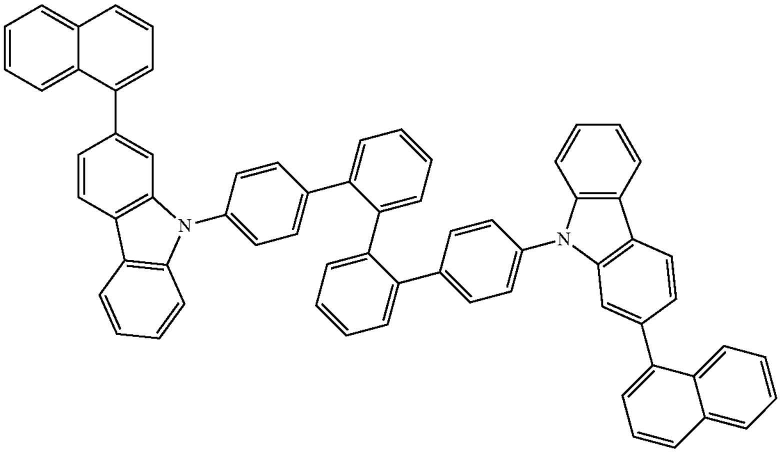

-continued
(6-29)
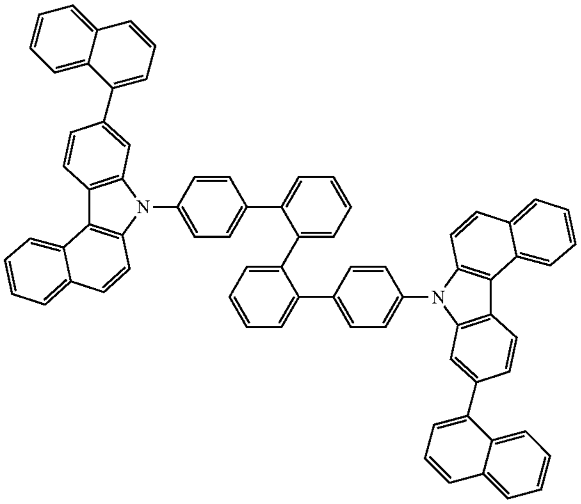
(6-30)
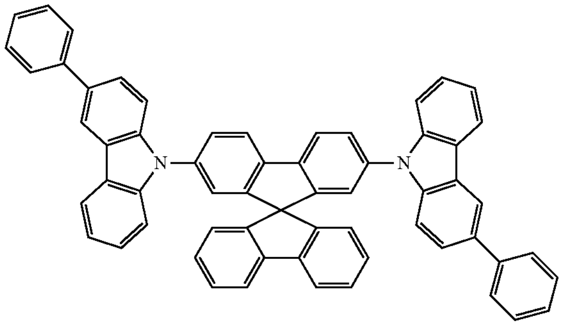
(6-31)
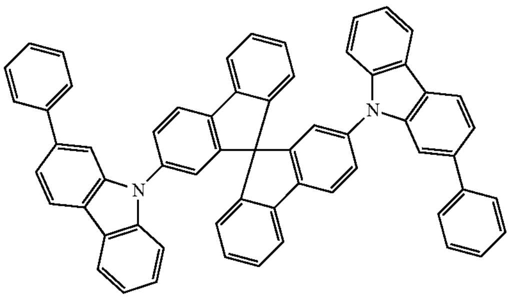
(6-32)
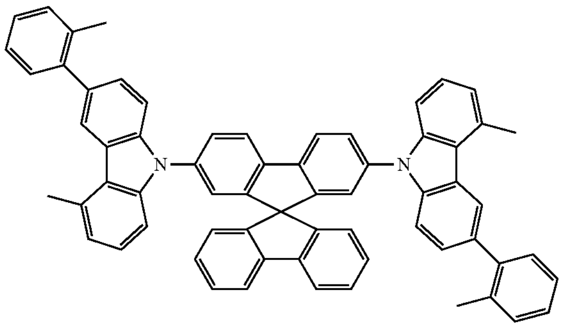
(6-33)
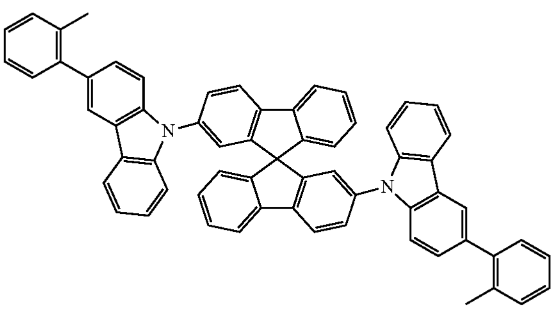
(6-34)
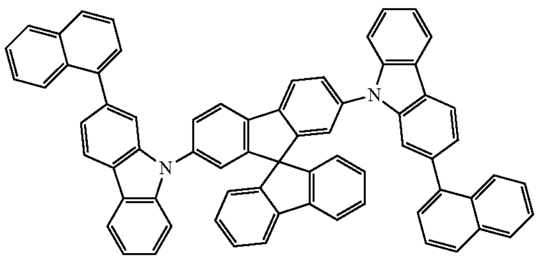

-continued
(6-35)
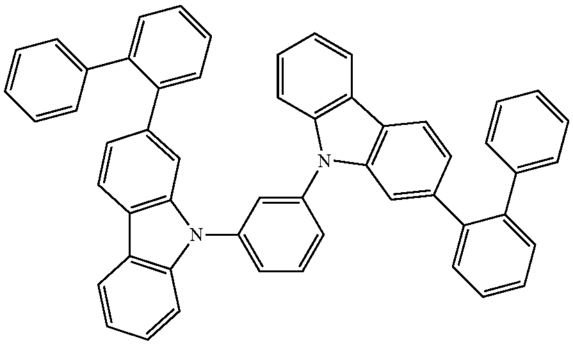
(6-36)
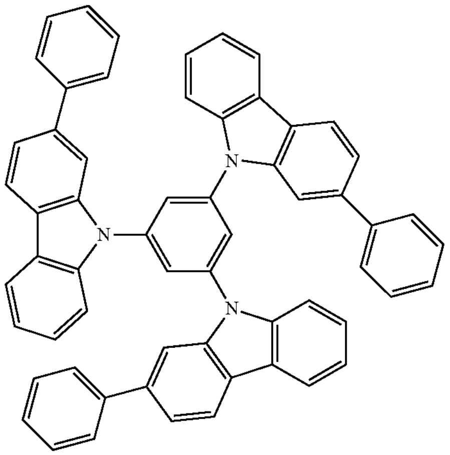
(6-37)
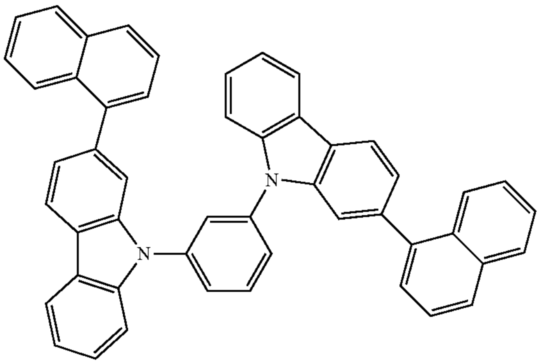
(6-38)
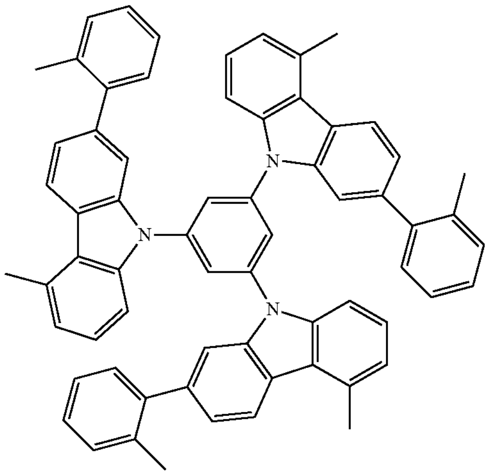
(6-39)
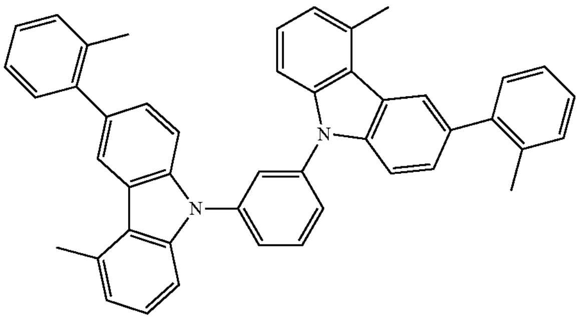
(6-40)
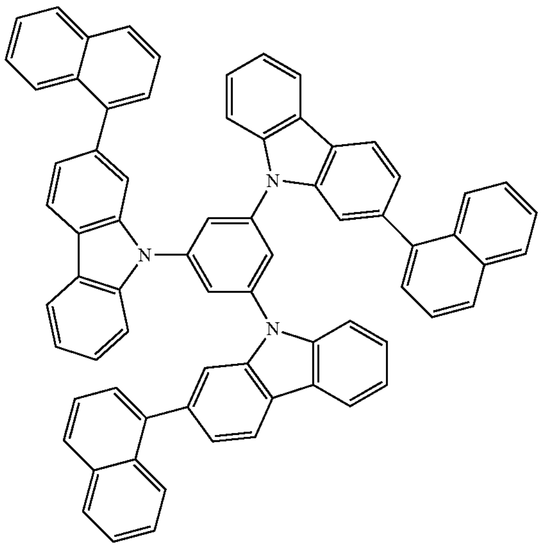

-continued
(6-41)
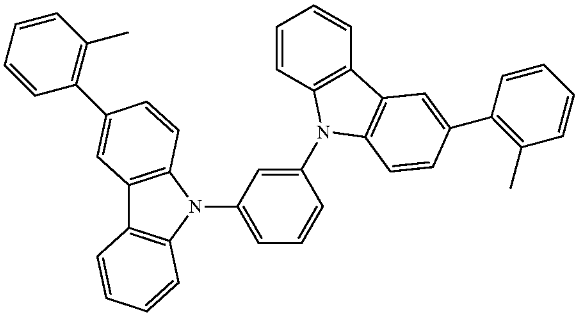
(6-42)
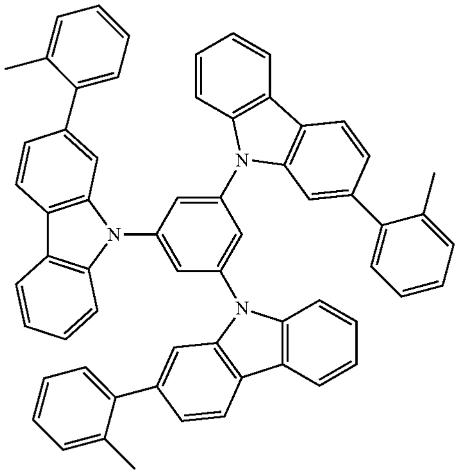
(6-43)
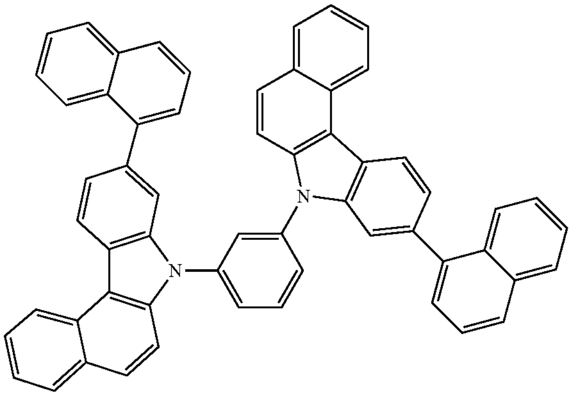
(6-44)
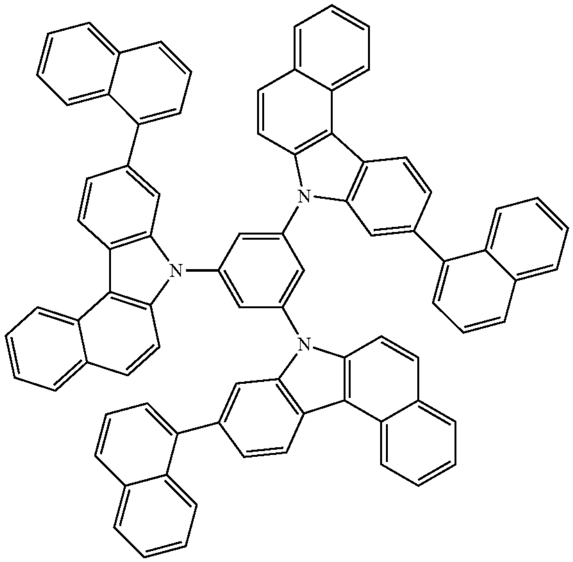
(6-45)
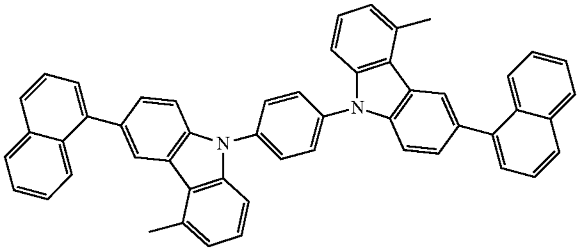
(6-46)
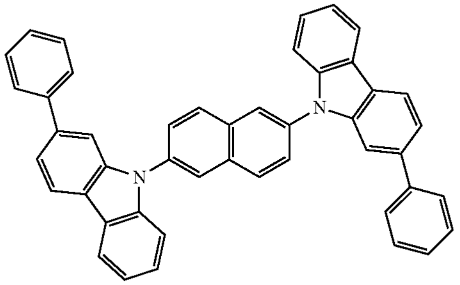

-continued
(6-47)
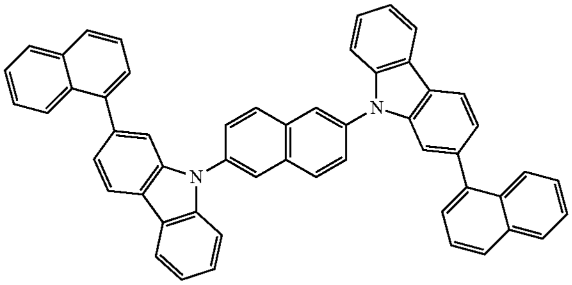
(6-48)
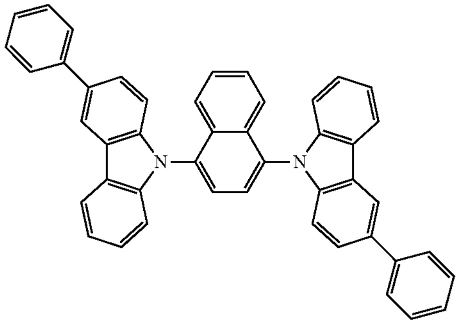
(6-49)
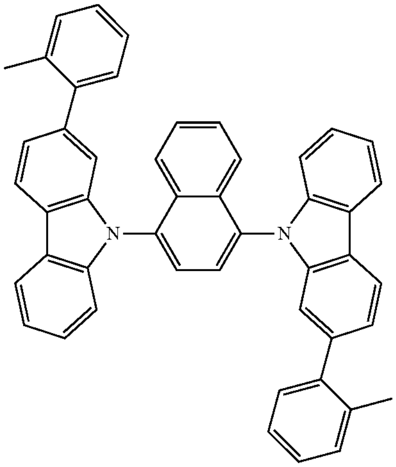
(6-50)
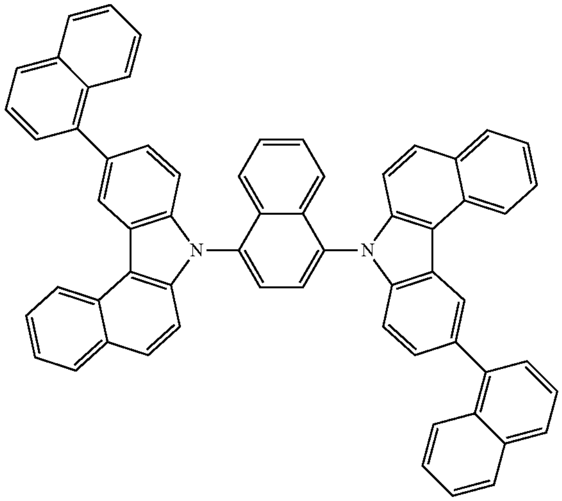
(6-51)
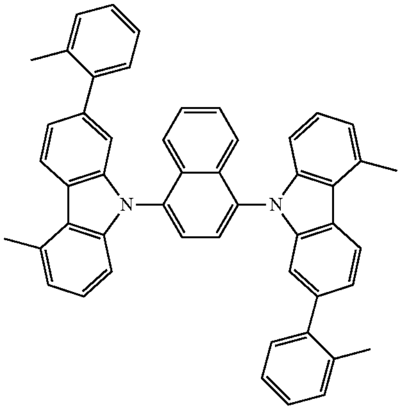
(6-52)
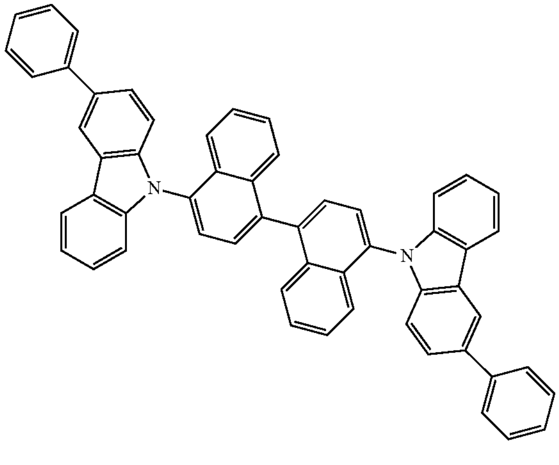

-continued
(6-53)
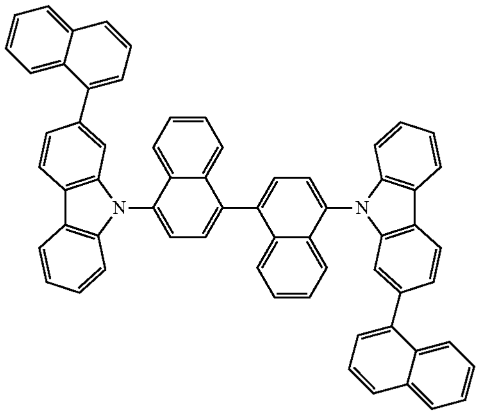
(6-54)
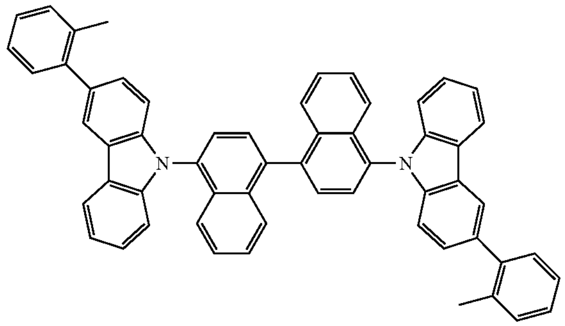
(6-55)
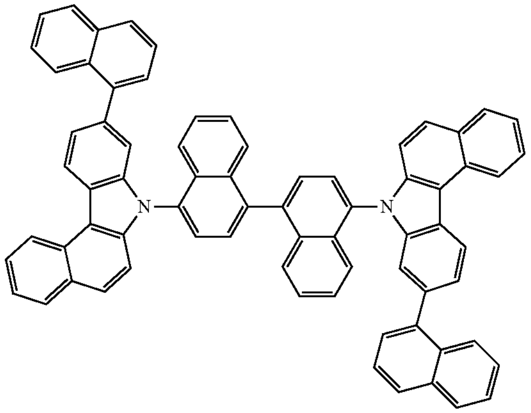
(6-56)
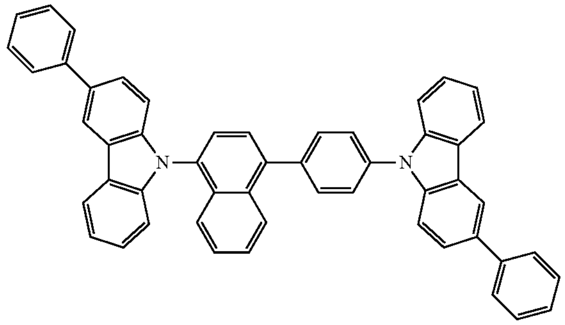
(6-57)
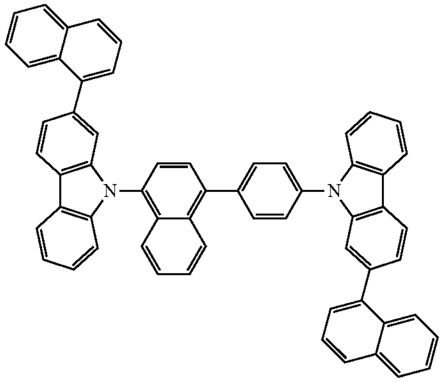
(6-58)
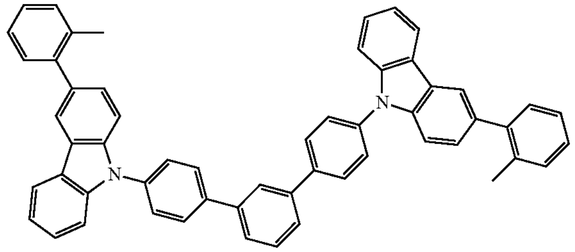
(6-59)
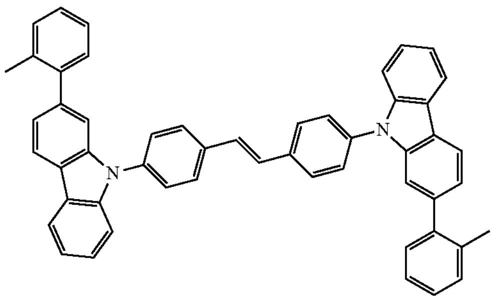
(6-60)
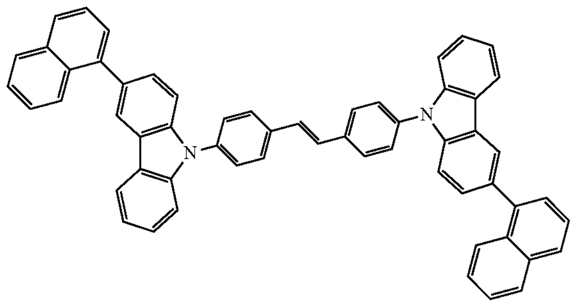

-continued
(6-61)
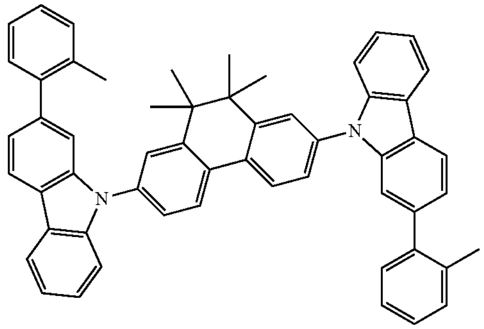
(6-62)
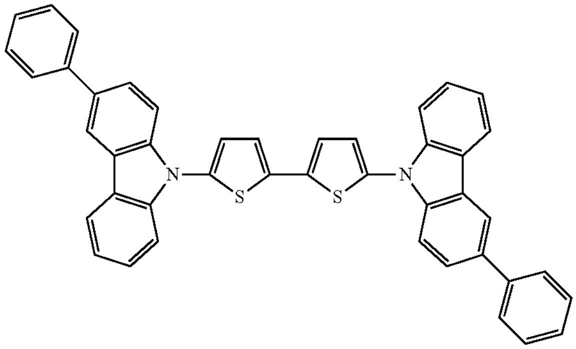
(6-63)
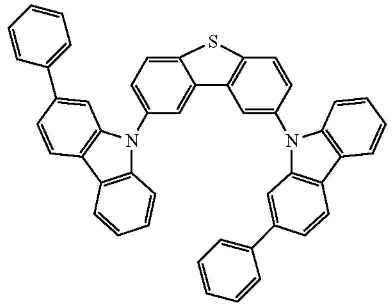
(6-64)
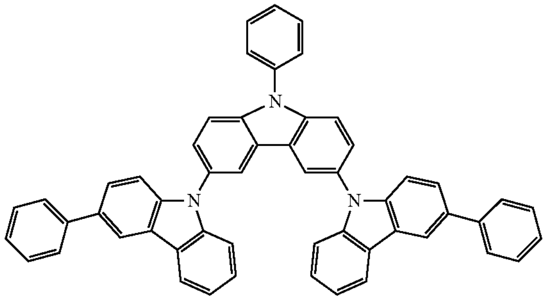
(6-65)
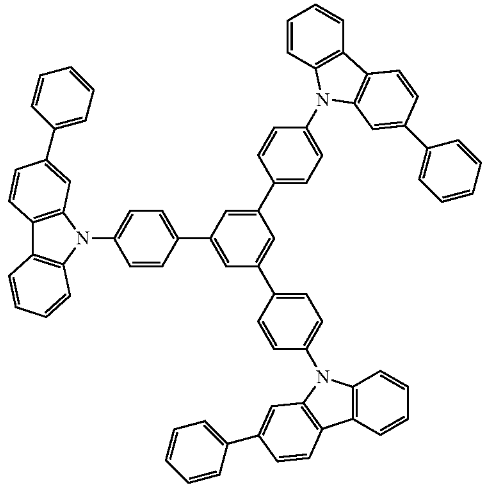
(6-66)
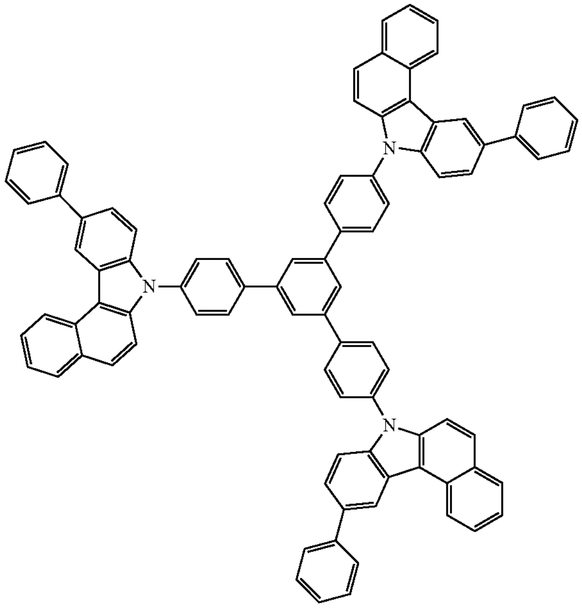

-continued
(6-67)
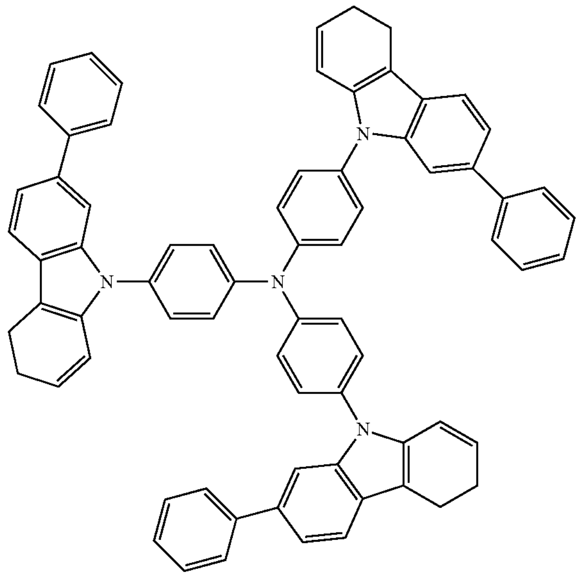
(6-68)
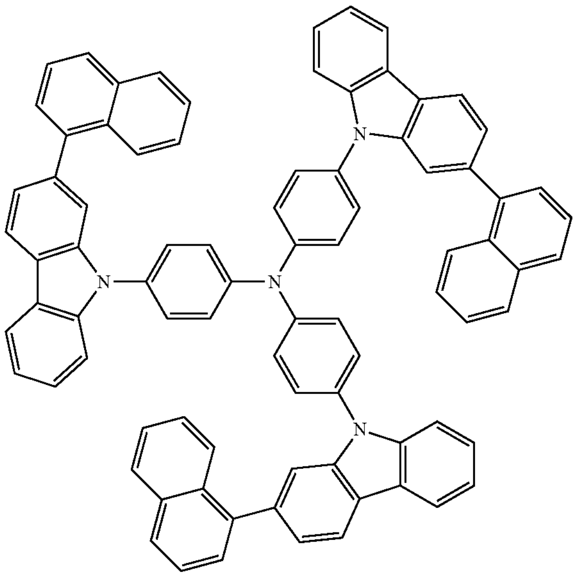
(6-69)
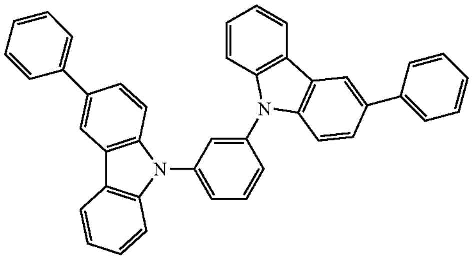
(6-70)
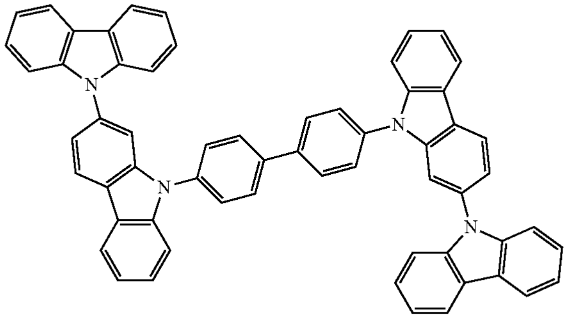
(6-71)
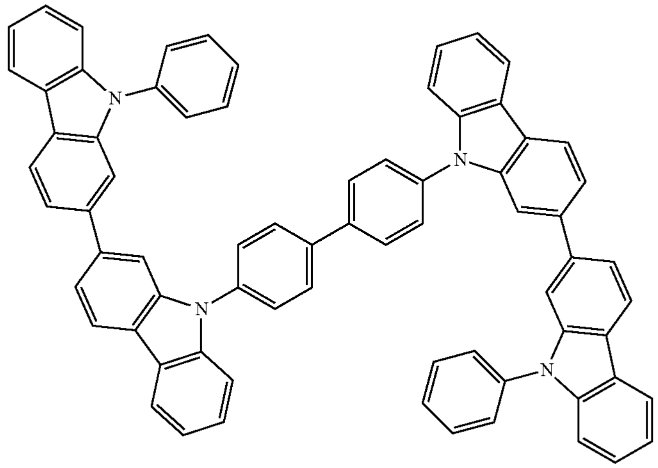

-continued
(6-72)
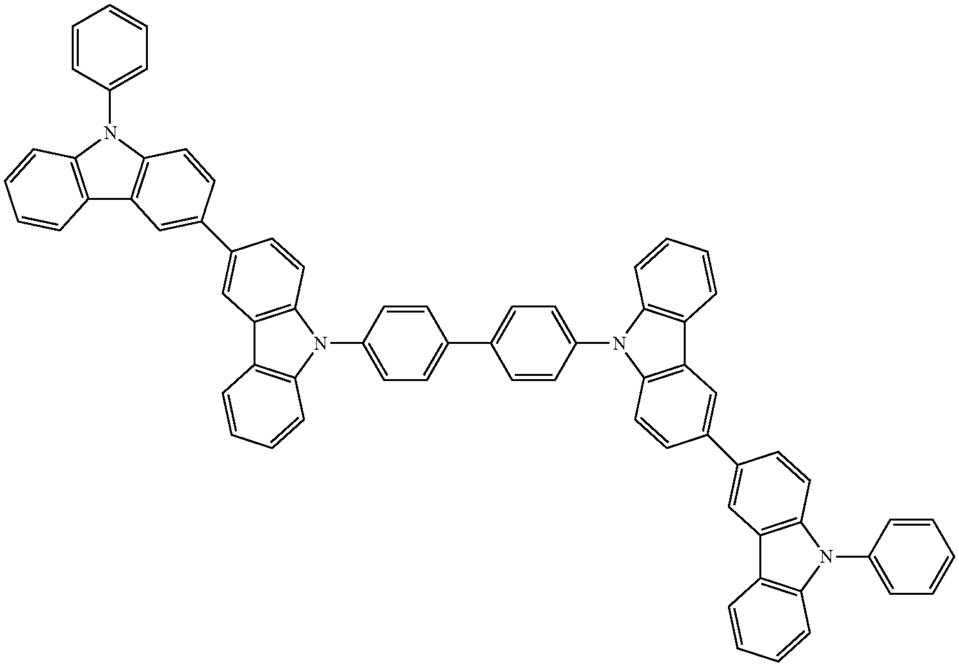
(6-73)
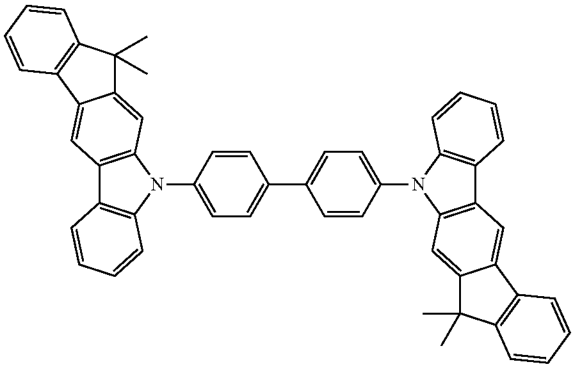
(6-74)
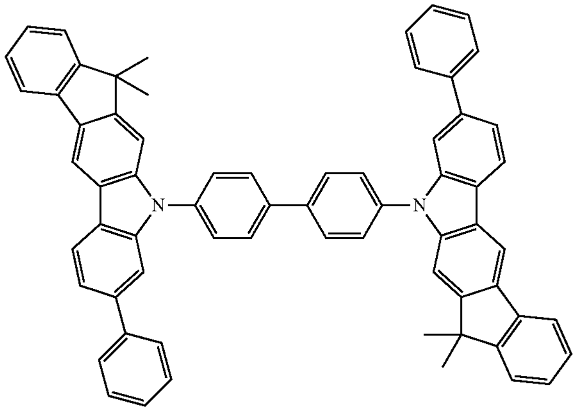
(6-75)
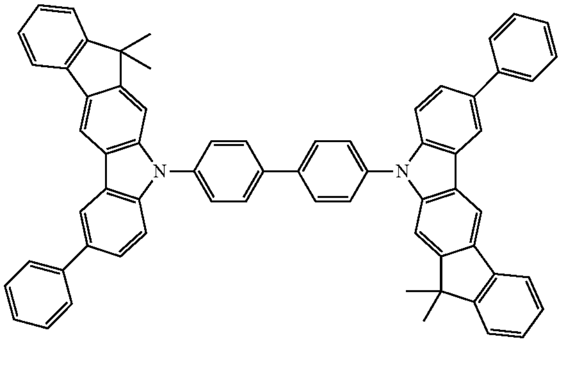
(6-76)
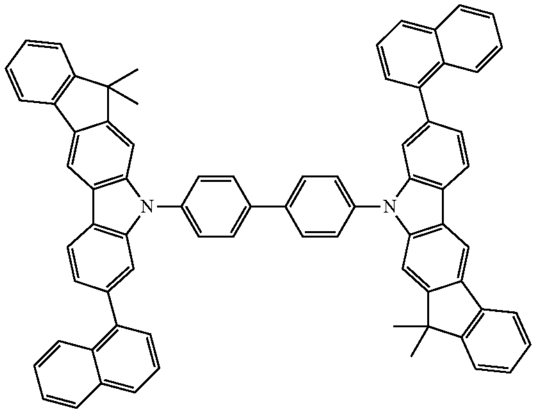

-continued
(6-77)
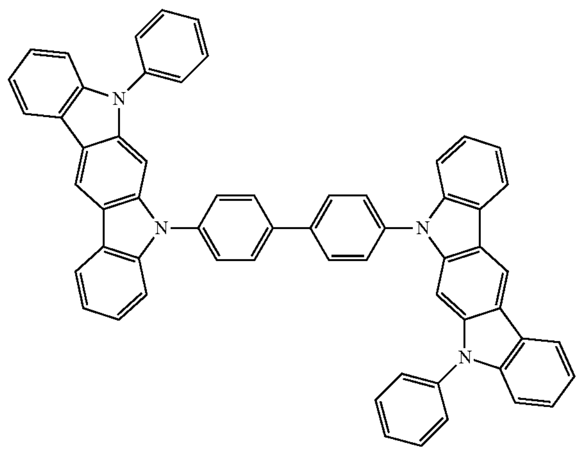
(6-78)
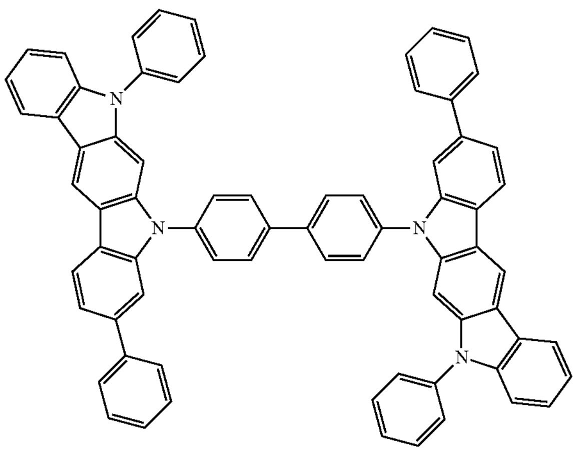
(6-79)
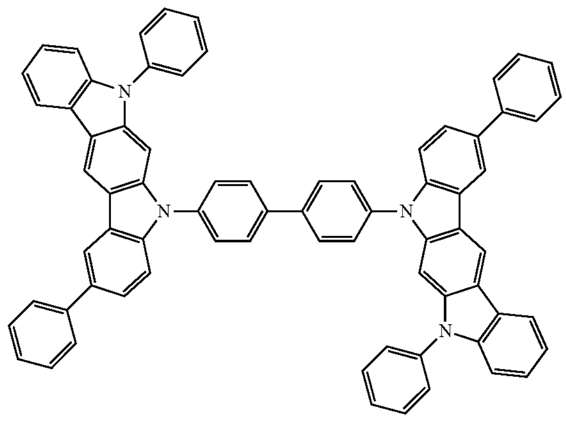
(6-80)
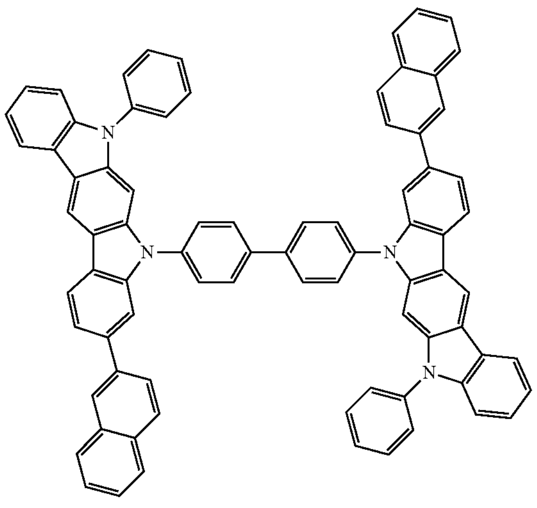
(6-81)
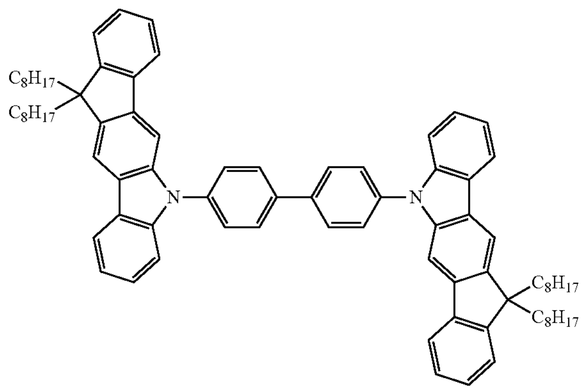
(6-82)
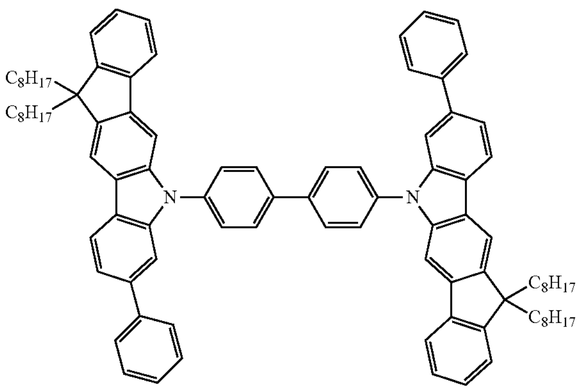

-continued
(6-83)
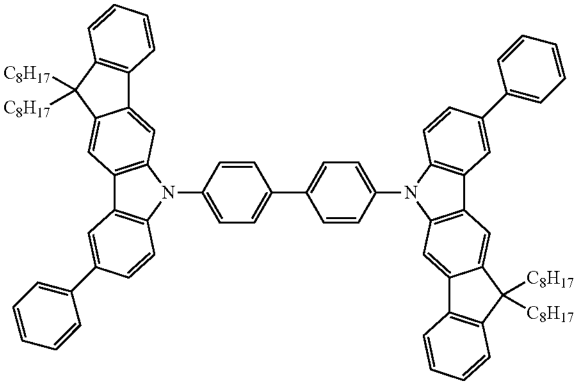
(6-84)
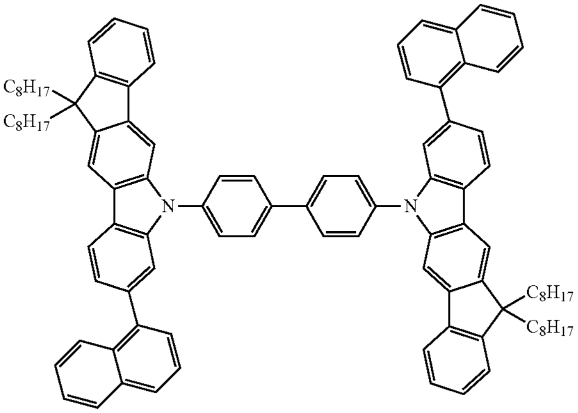
(6-85)
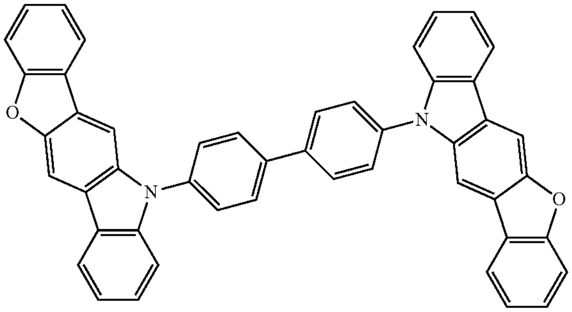
(6-86)
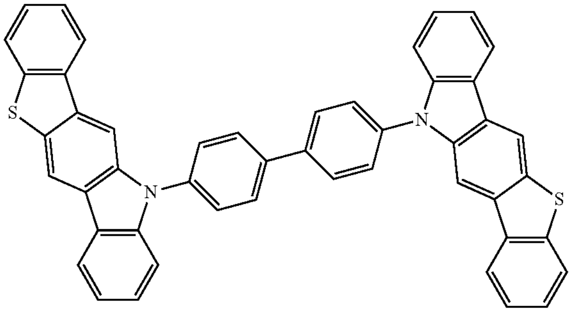
(6-87)
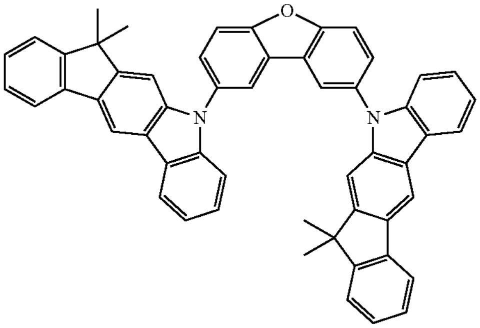
(6-88)
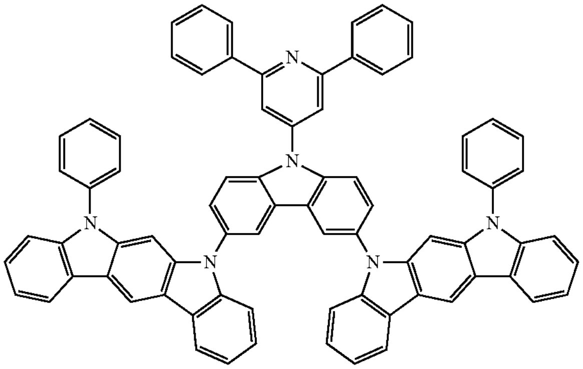
(6-89)
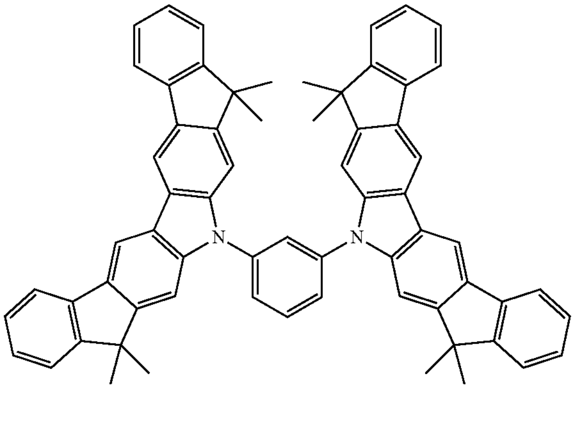
(6-90)
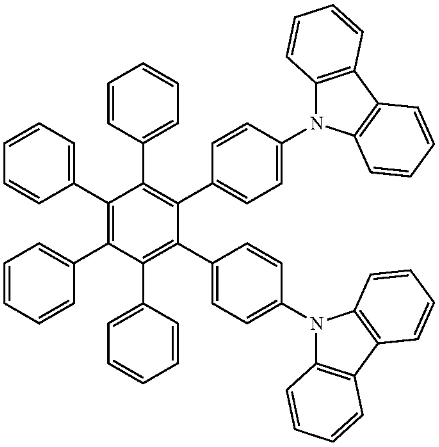

-continued (6-91)

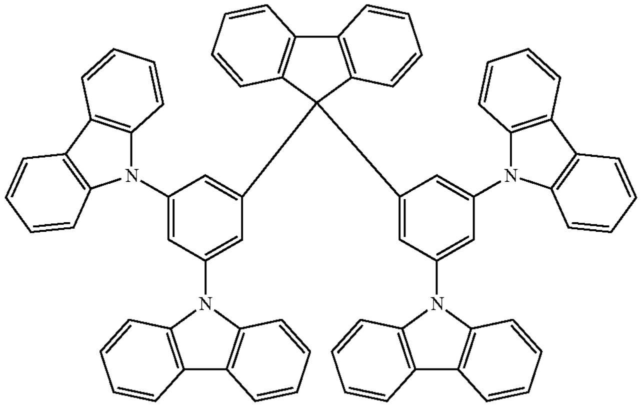

The carbazole compounds of the formula (6) employed in accordance with the invention can be synthesised by standard methods of organic chemistry, as also disclosed in detail in WO 2008/086851. The contents of this specification are incorporated into the present application by way of reference.

Thus, it is known that 2-nitrobiphenyl derivatives can be reacted with a trialkyl phosphite to give the corresponding carbazole derivatives (M. Tavasli et al., *Synthesis* 2005, 1619-1624). This reaction can be used to build up 2-aryl-substituted carbazole derivatives by firstly building up a corresponding aryl-substituted 2-nitrobiphenyl derivative, which is subsequently reacted with trialkyl phosphite. The 2-aryl-substituted carbazole derivative can be coupled to a dibromoaromatic compound in a Hartwig-Buchwald coupling under standard conditions to give the compound of the formula (6). The various methods and reaction conditions for carrying out the Hartwig-Buchwald coupling are known to the person skilled in the art of organic synthesis. Instead of a dibromoaromatic compound, it is also possible to use corresponding compounds containing different leaving groups, for example chlorine, iodine, triflate, tosylate or sulfonates in general. The use of trisubstituted aromatic compounds or compounds containing even more leaving groups enables compounds of the formula (6) in which the index q stands for 2 or more to be synthesised correspondingly.

The synthesis of compounds of the formula (6) is depicted in Scheme 1 below, where, for the purposes of clarity, q was selected to be 1 and no substituents R or $R^7$ are depicted:

Scheme 1:

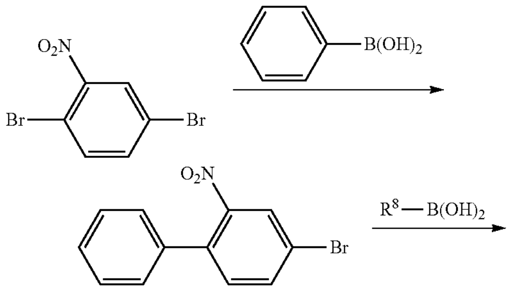

-continued

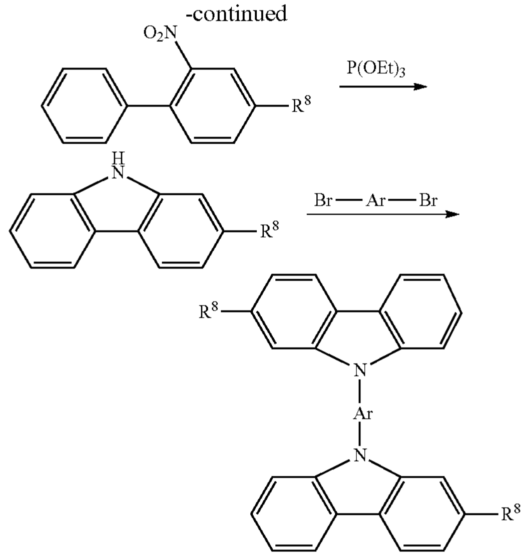

The neutral compound in the sense of the present invention is preferably a pure hydrocarbon compound, in particular an aromatic hydrocarbon compound.

According to a preferred embodiment of the present invention, the neutral compound is a compound of the formula (7):

(7)

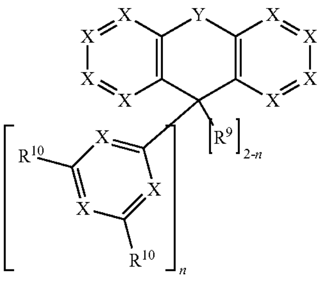

where the following applies to the symbols and indices used:

X is on each occurrence, identically or differently, $CR^9$; or two directly adjacent groups X stand for a unit of the following formula (8), formula (8)

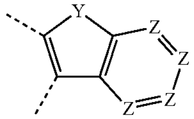

where the dashed bonds indicates the linking of the unit to the adjacent C atoms;

Y is on each occurrence, identically or differently, a single bond or a group selected from $C(R^9)_2$, $C(=C(R^9)_2)$, $Si(R^9)_2$, $C(R^9)_2—C(R^9)_2$ or $CR^9=CR^9$;

Z is on each occurrence, identically or differently, $CR^9$;

$R^9$ is on each occurrence, identically or differently, H, D, a straight-chain alkyl, alkenyl or alkynyl group having 1 to 40 C atoms or a branched or cyclic alkyl, alkenyl or alkynyl group having 3 to 40 C atoms, each of which may be substituted by one or more radicals $R^{11}$, or an aromatic or heteroaromatic ring system having 5 to 60 aromatic ring atoms, which may in each case be substituted by one or more radicals $R^{10}$, or a combination of these systems; two or more adjacent substituents $R^9$ here may also form a mono- or polycyclic, aliphatic or aromatic ring system with one another;

$R^{10}$ is on each occurrence, identically or differently, H, D or an aromatic or heteroaromatic ring system having 5 to 60 aromatic ring atoms, which may be substituted by one or more radicals $R^9$;

$R^{11}$ is on each occurrence, identically or differently, H, D or an aliphatic, aromatic and/or heteroaromatic hydrocarbon radical having 1 to 20 C atoms, in which, in addition, H atoms may be replaced by F; two or more adjacent substituents $R^{11}$ here may also form a mono- or polycyclic, aliphatic or aromatic ring system with one another; and n is 1 or 2.

The neutral compounds and thus also the compounds of the formula (7) preferably have a glass-transition temperature $T_g$ of greater than 70° C., particularly preferably greater than 100° C. and very particularly preferably greater than 110° C.

As evident from the formula (7), n=2 means that two aryl radicals which are substituted in the 3,5-position are bonded in the compound in the 9,9-position of the fluorene or the corresponding derivative, while n=1 means that one such aryl radical is present and furthermore a group $R^9$.

In an embodiment of the invention, the symbol X preferably stands, identically or differently on each occurrence, for $CR^9$.

The symbol Z in the unit of the formula (7) preferably stands for $CR^9$.

A preferred embodiment of the compounds of the formula (7) are the compounds of the formula (9), (10) and (11):

(9)

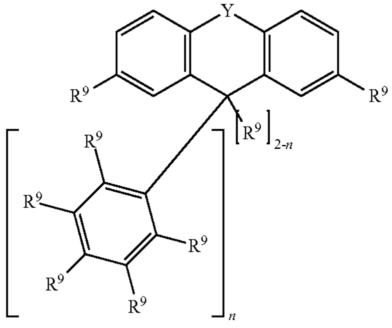

(10)

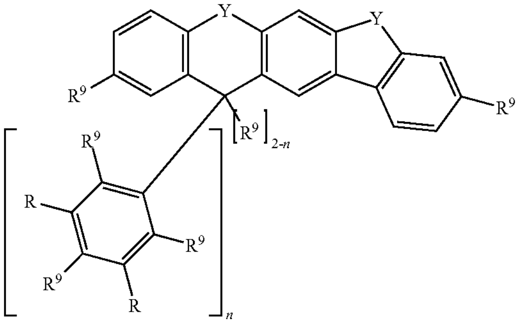

(11)

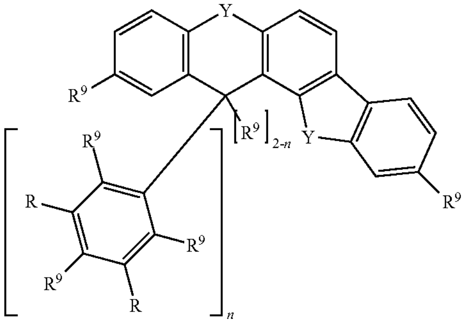

where the symbols and indices used have the meanings indicated above.

Preference is furthermore given to the compounds of the formulae (12), (13) and (14):

(12)

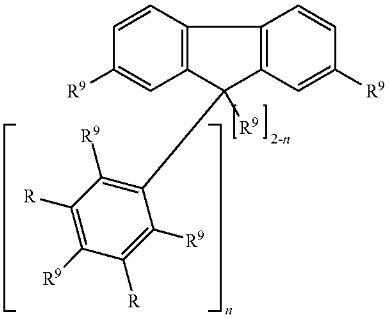

-continued (13)

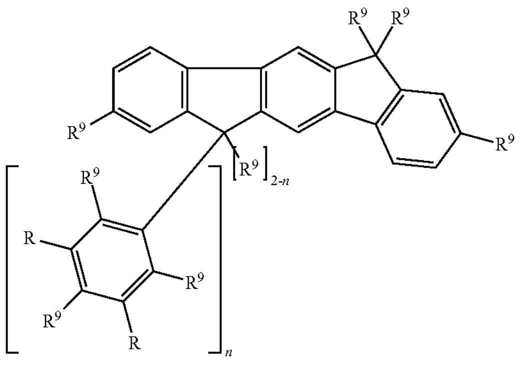

(14)

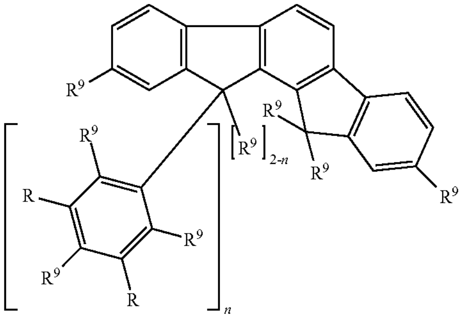

where the symbols and indices used have the meanings given above.

In a preferred embodiment of the invention, n=2.

A further preferred embodiment of the compounds of the formula (7) are the compounds of the formula (15):

(15)

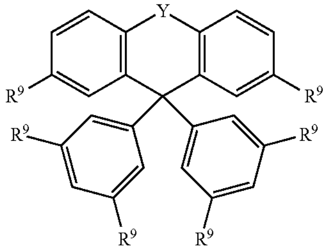

where the symbols used have the meanings indicated above.

A particularly preferred embodiment of the present invention are the compounds of the following formulae (16), (17) and (18)

(16)

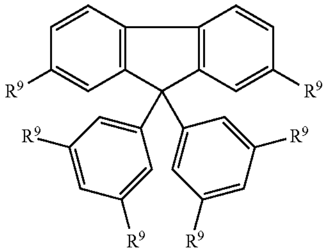

(17)

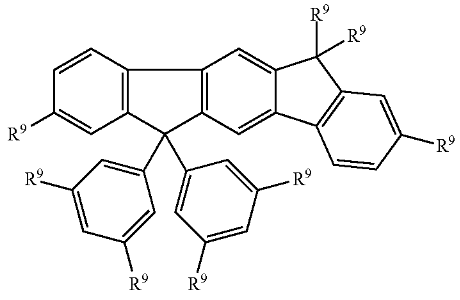

(18)

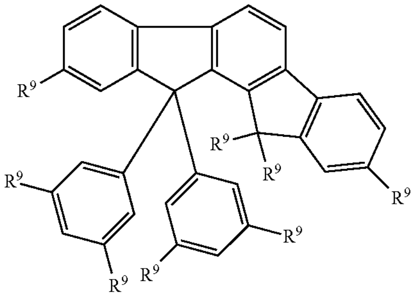

where the symbols and indices used have the meanings given above.

In a further embodiment of the present invention, the symbol $R^9$ in compounds of the above-mentioned formula (7) to (18) stands, identically or differently on each occurrence, for an aromatic or heteroaromatic ring system having 5 to 30 aromatic ring atoms, which may be substituted by one or more non-aromatic radicals $R^9$. Substituents $R^9$ which are furthermore preferred are halogen, preferably Br and I, O-tosylate, O-triflate, O—$SO_2R^{11}$, $B(OR^{11})_2$ and $Sn(R^{11})_3$, particularly preferably Br, since these are valuable intermediates in the synthesis of further compounds according to the invention.

In a further preferred embodiment of the present invention, all symbols $R^9$ in compounds of the above-mentioned formulae (7) to (18) are selected identically. This preference can be explained by the easier synthetic accessibility of the compounds.

Examples of preferred compounds of the formulae (7) to (18) are structures (7-1) to (7-32) depicted below.

(7-1)
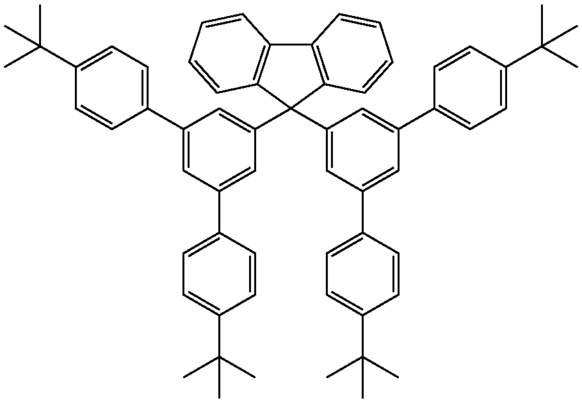
(7-2)
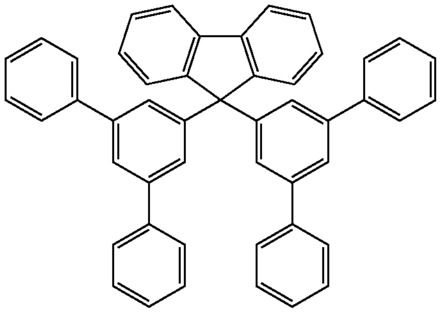
(7-3)
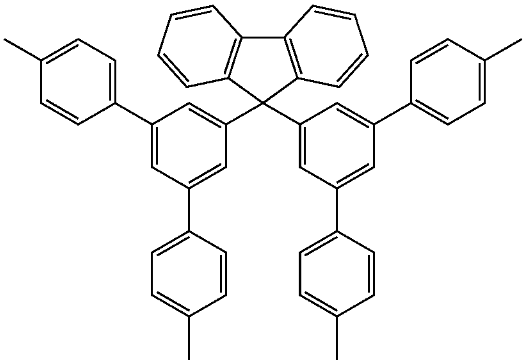
(7-4)
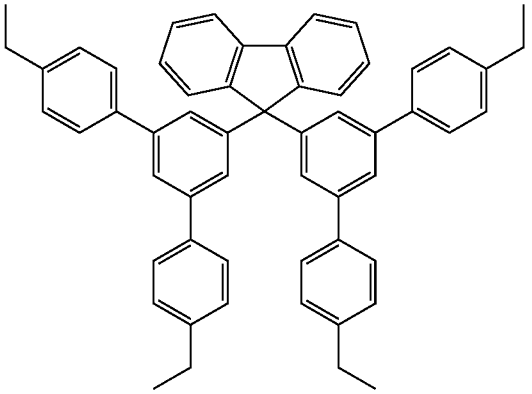
(7-5)
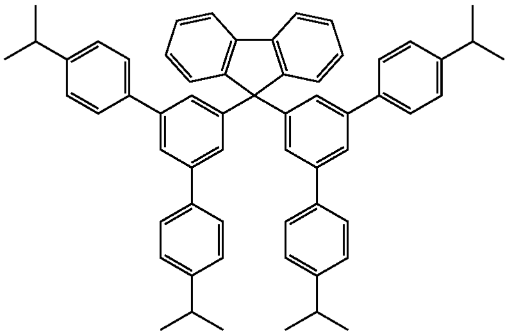
(7-6)
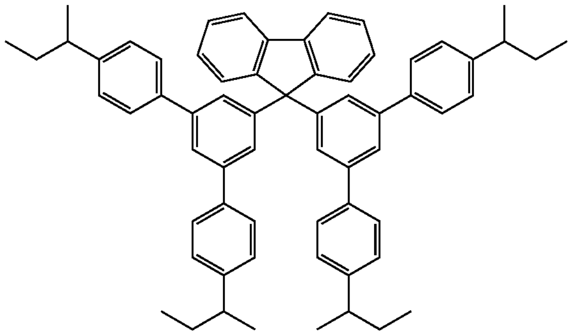
(7-7)
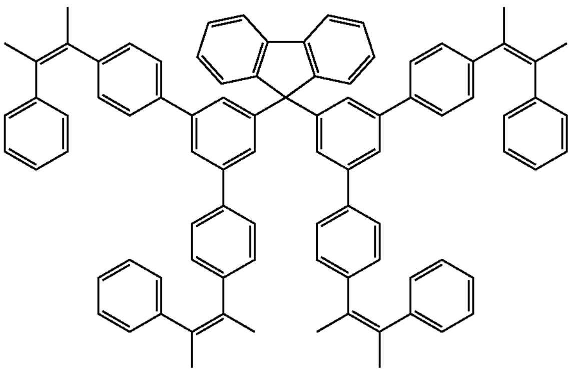
(7-8)
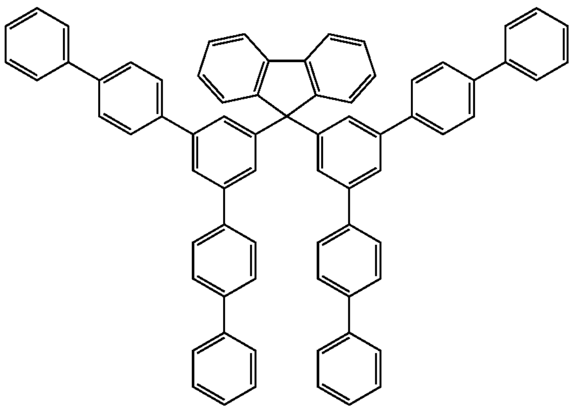

-continued
(7-9)
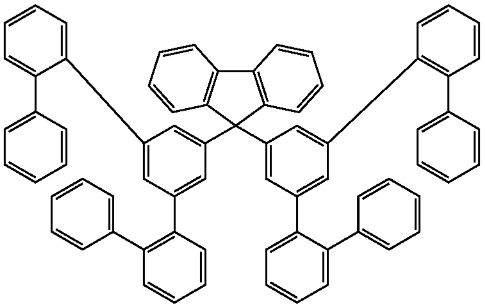
(7-10)
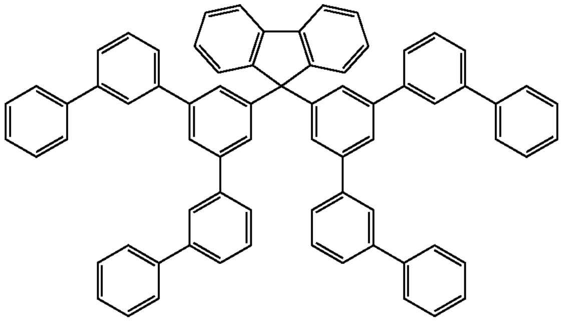
(7-11)
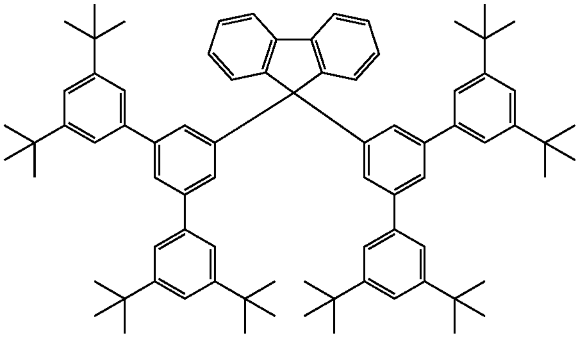
(7-12)
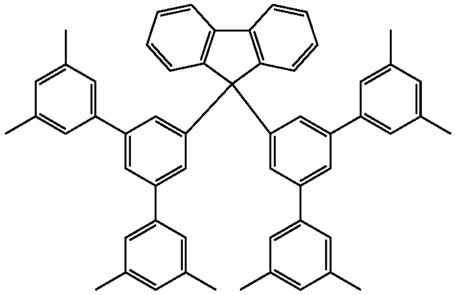
(7-13)
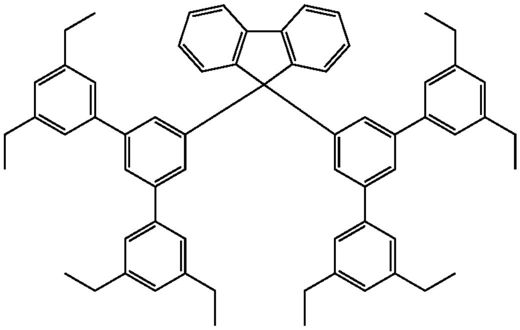
(7-14)
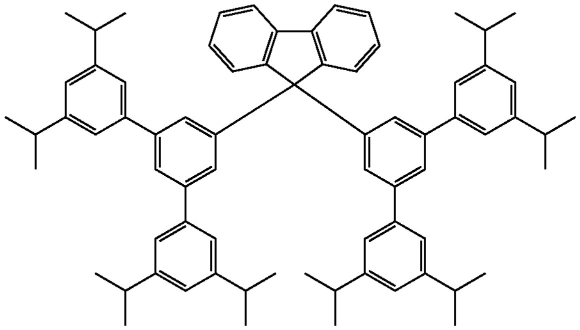
(7-15)
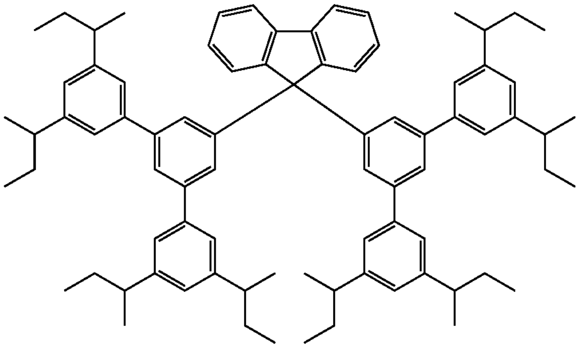
(7-16)
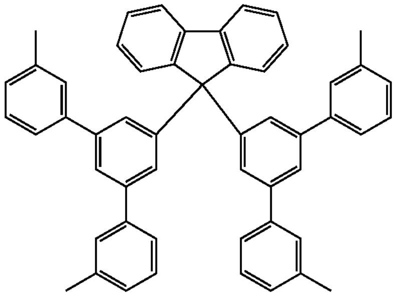

-continued
(7-17)
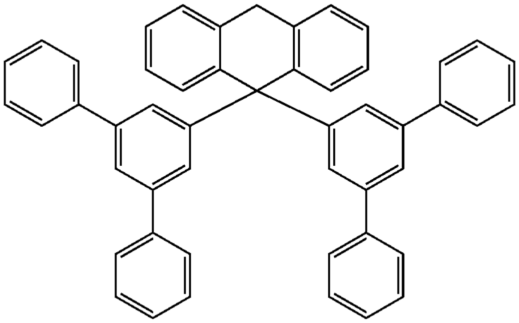
(7-18)
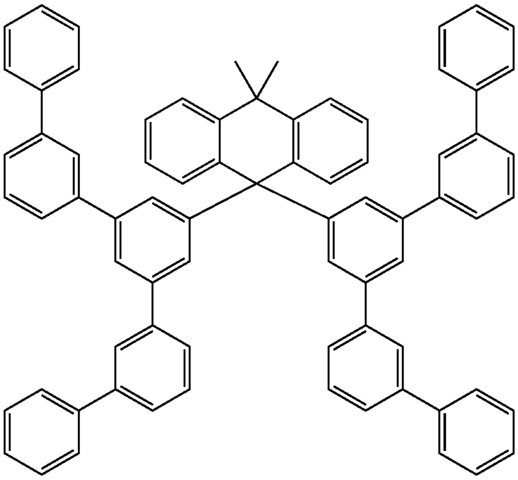
(7-19)
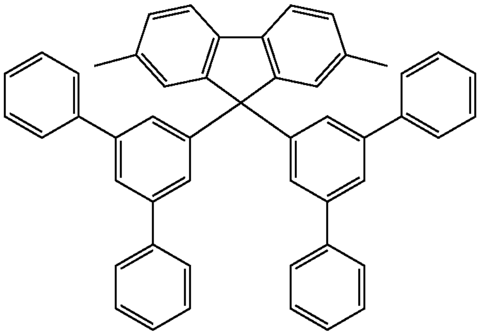
(7-20)
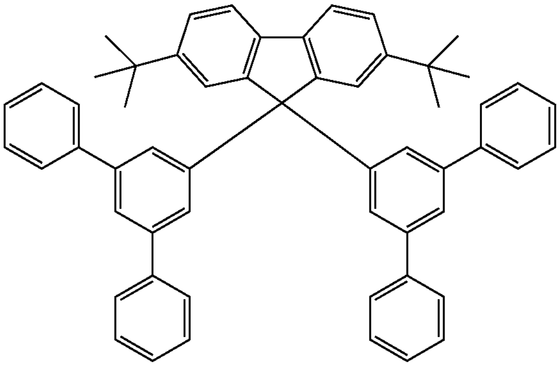
(7-21)
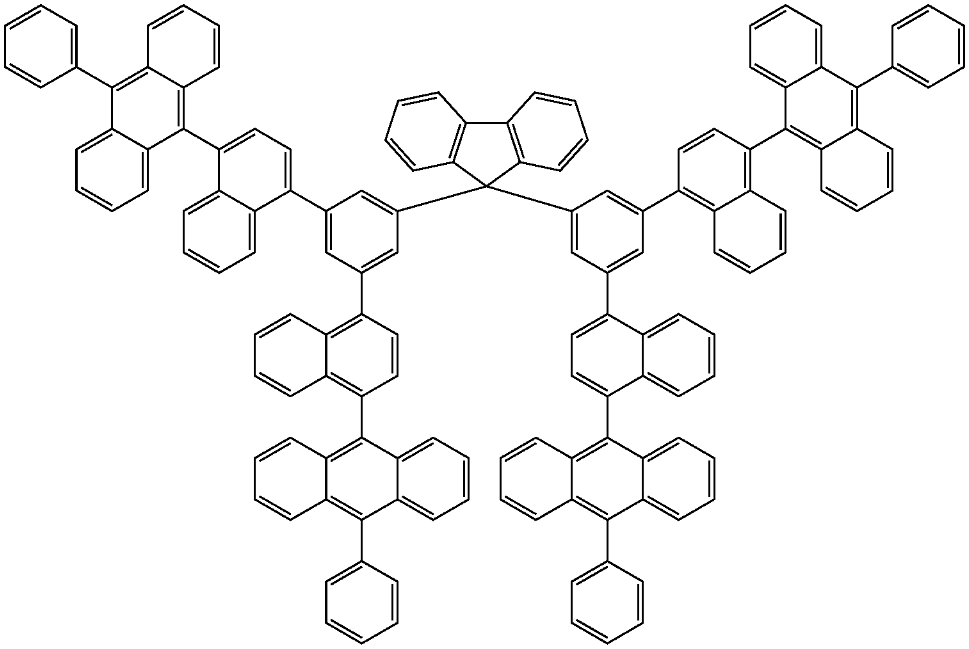

-continued
(7-22)
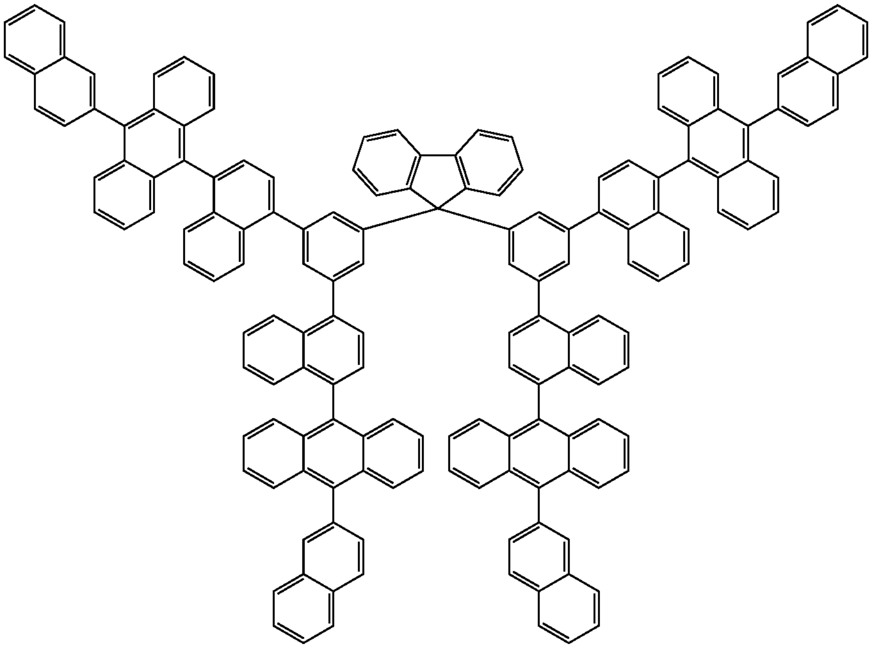
(7-23)
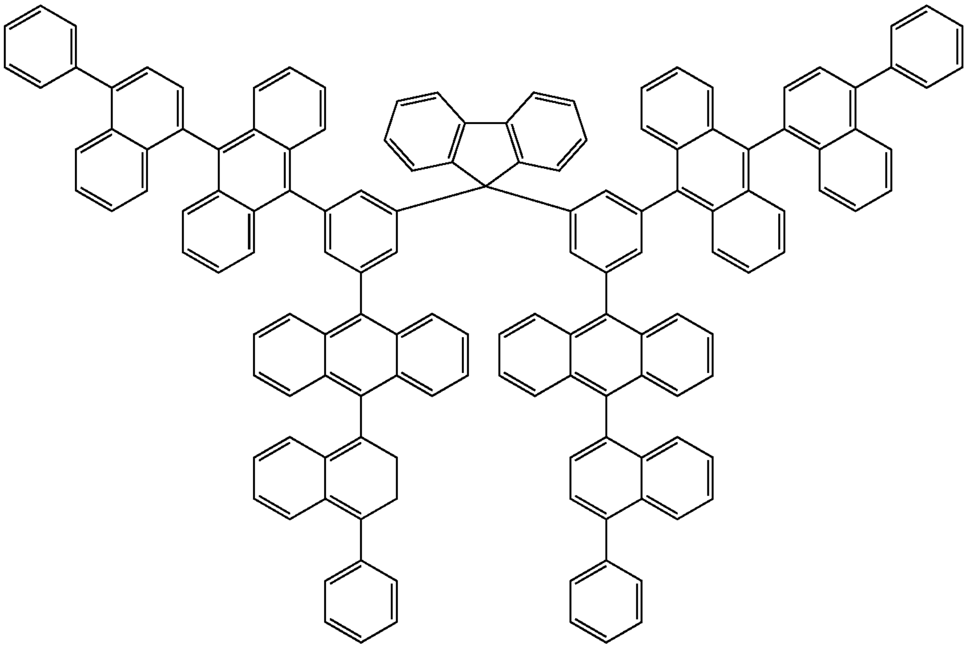

-continued
(7-24)
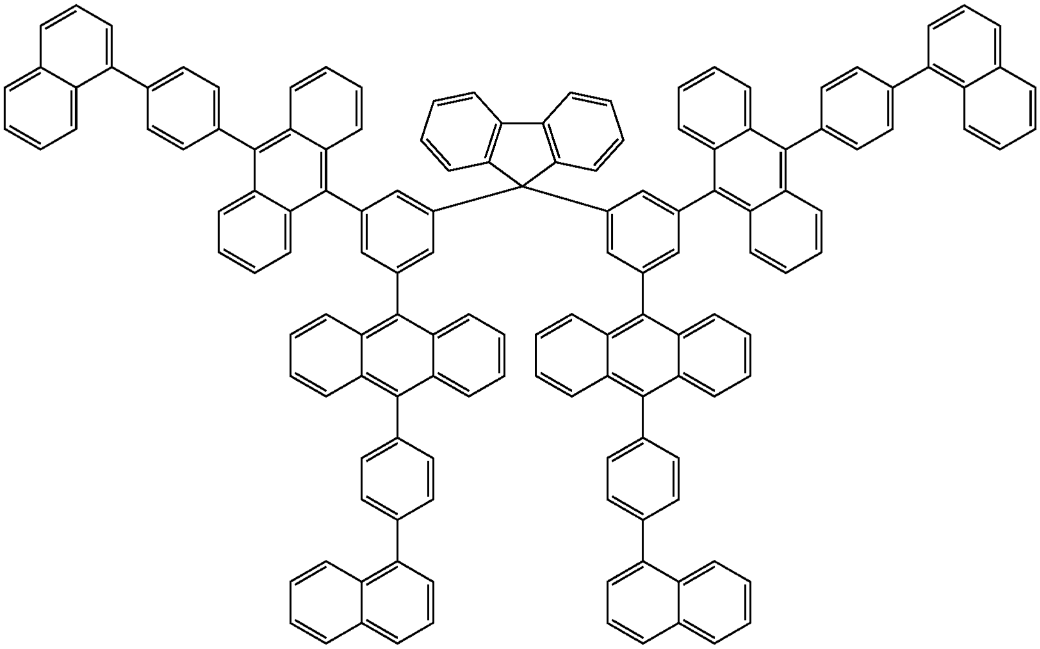
(7-25)
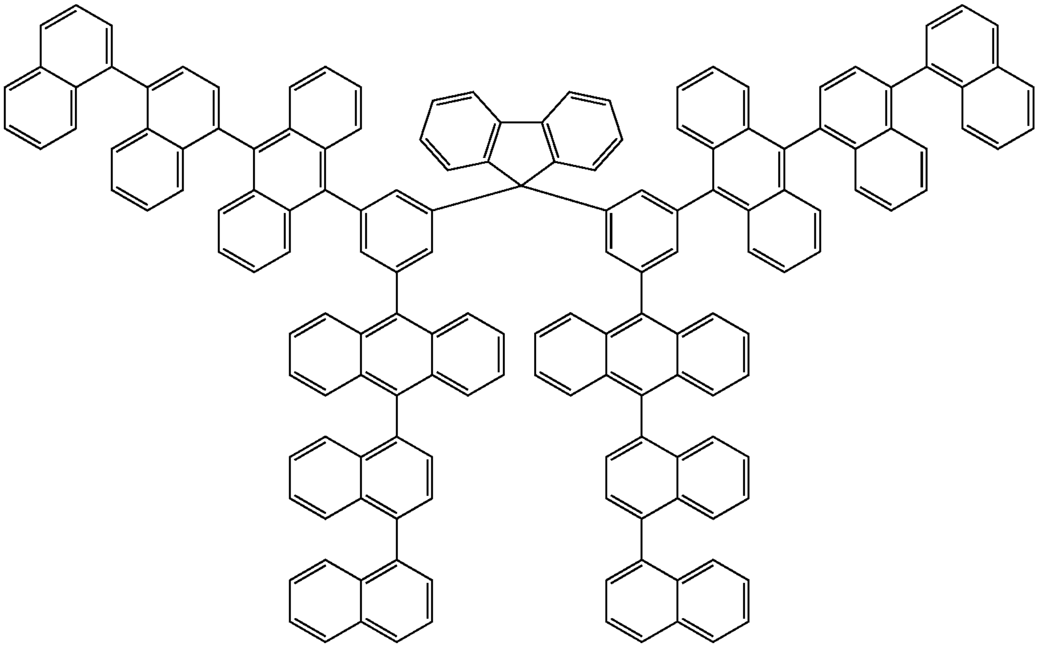

-continued
(7-26)
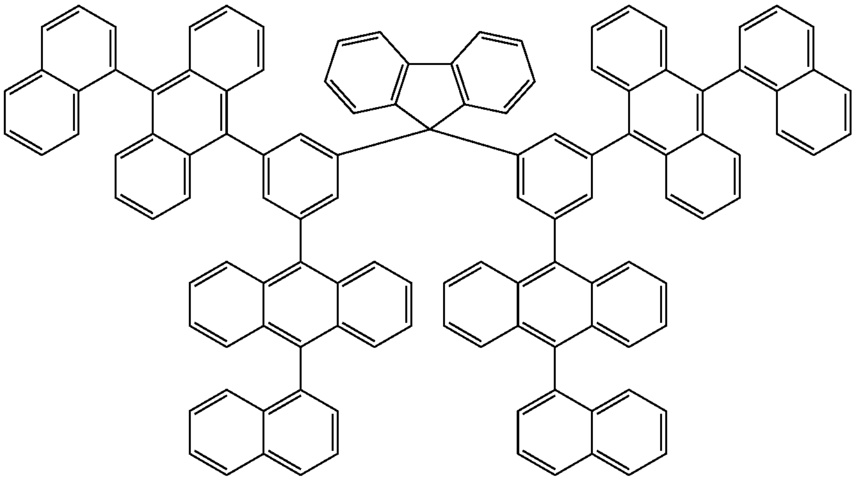
(7-27)
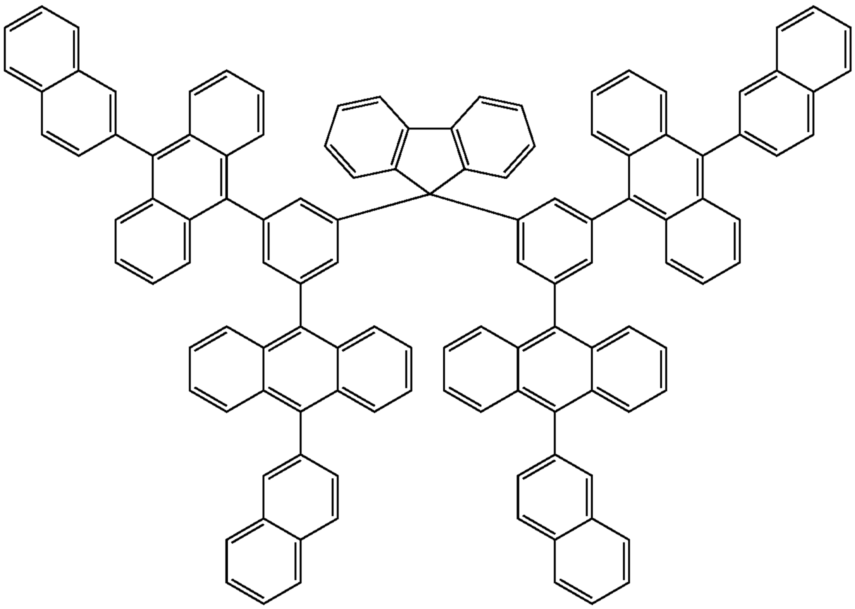
(7-28)
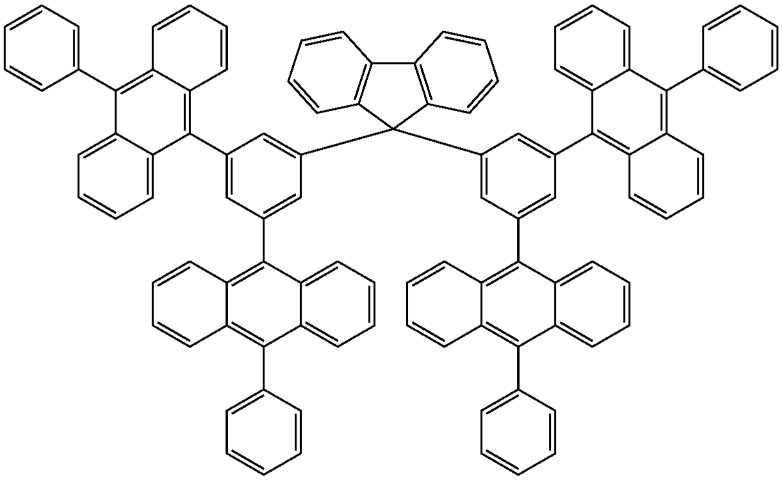

-continued
(7-29)
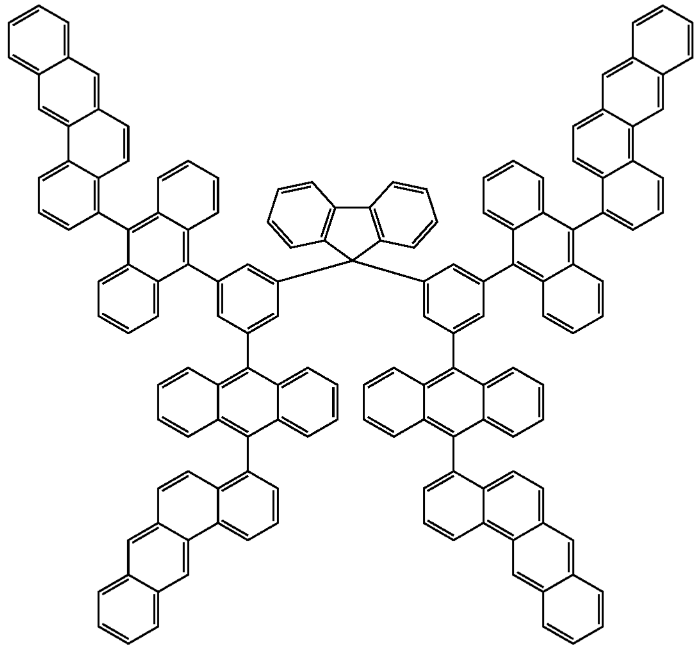
(7-30)
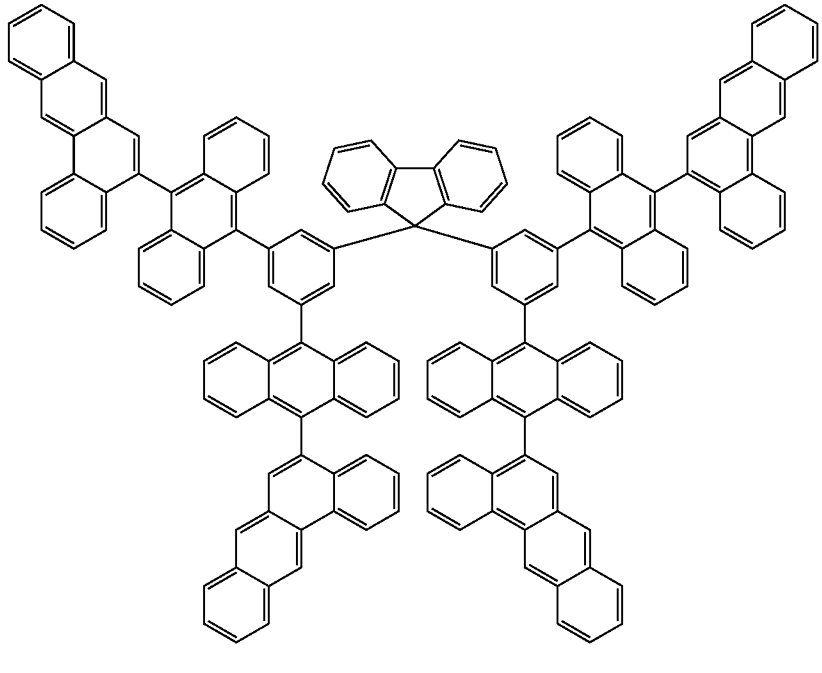

-continued (7-31)

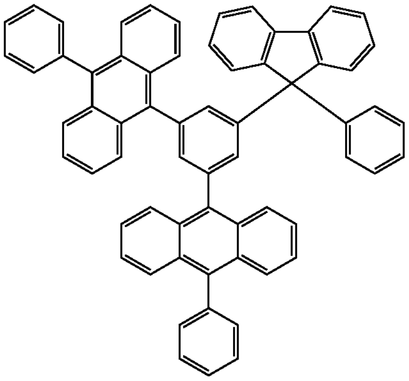

(7-32)

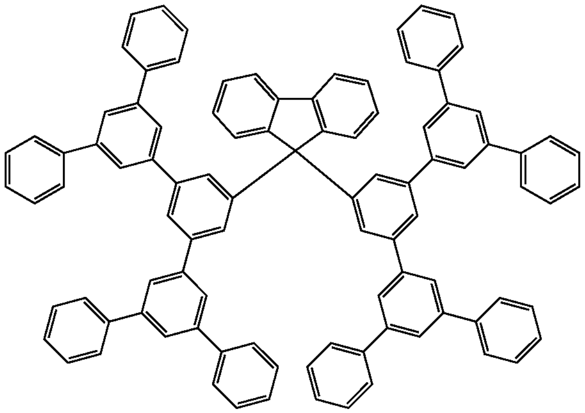

According to a further embodiment of the present invention, the neutral compound is a compound of the formula (19):

(19)

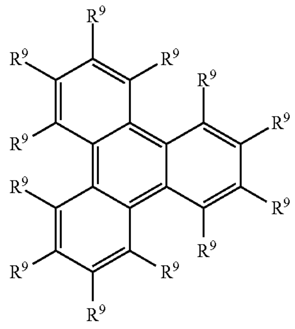

where $R^9$ can adopt the meanings indicated in relation to formula (7).

According to still a further embodiment of the present invention, the neutral compound is a compound of the formula (20):

(20)

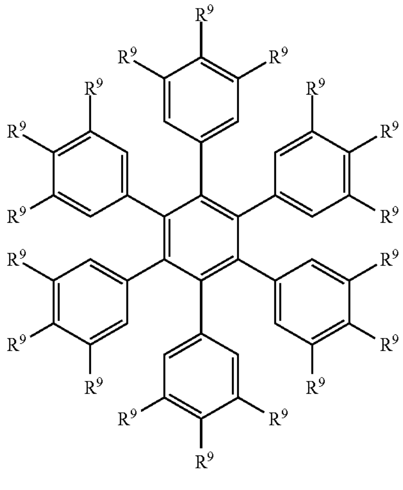

where $R^9$ can adopt the meanings indicated in relation to formula (7).

A particularly preferred neutral compound of the formula (20) is the following structure:

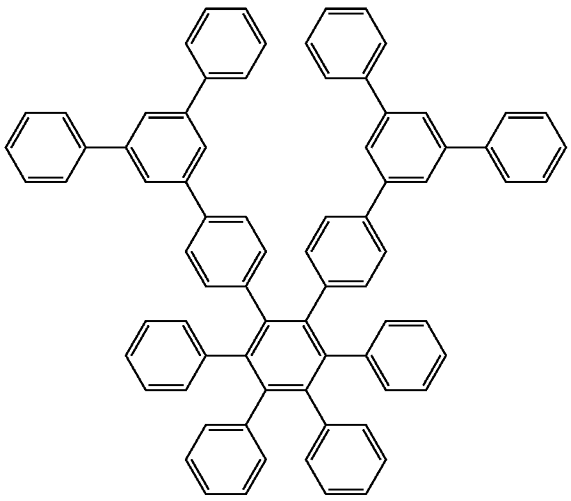

The compounds of the formula (7) according to the invention can be prepared by synthetic steps which are generally known to the person skilled in the art. The starting compound used for symmetrically substituted compounds according to the invention can be, for example, 3,3',5,5'-tetrabromobenzophenone (*Eur. J. Org. Chem.* 2006, 2523-2529). This can be reacted, for example in accordance with Scheme 2, by reaction with a substituted or unsubstituted 2-lithiobiphenyl, 2-lithiodiphenyl ether, 2-lithiodiphenyl thioether, 2-(2-lithiophenyl)-2-phenyl-1,3-dioxolane or 2-lithiophenyldiphenylamine to give the corresponding triarylmethanols, which are then cyclised under acidic conditions, for example in the presence of acetic acid and a mineral acid, such as hydrogen bromide. The organolithium compounds required for this reaction can be prepared by transmetallation of the corresponding aryl bromides (2-bromobiphenyl, 2-bromodiphenyl ether, 2-bromodiphenyl thioether, 2-(2-bromophenyl)-2-phenyl-1,3-dioxolane, 2-bromophenyldiphenylamine, etc.) using alkyllithium compounds, such as n-butyllithium. It is of course possible to employ the corresponding Grignard compounds analogously.

Scheme 2

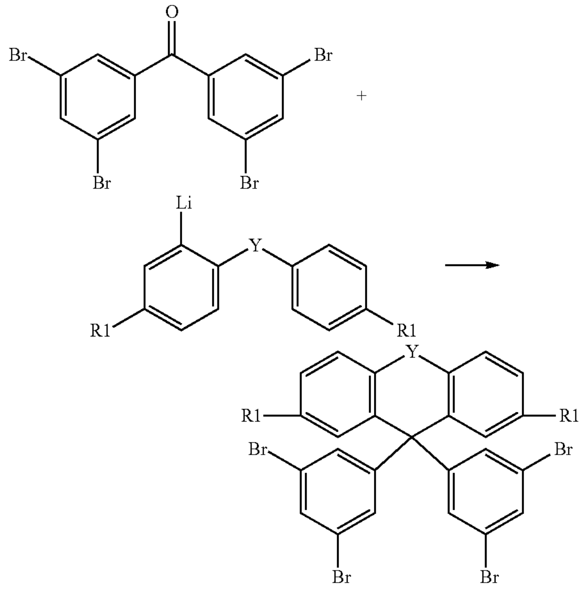

The tetrabromides generated in this way can be converted further by methods known to the person skilled in the art. The palladium-catalysed reaction with boronic acids (Suzuki coupling) or palladium-catalysed reaction with organozinc compounds (Negishi coupling) results in aromatic or heteroaromatic compounds according to the invention (Scheme 3).

Scheme 3

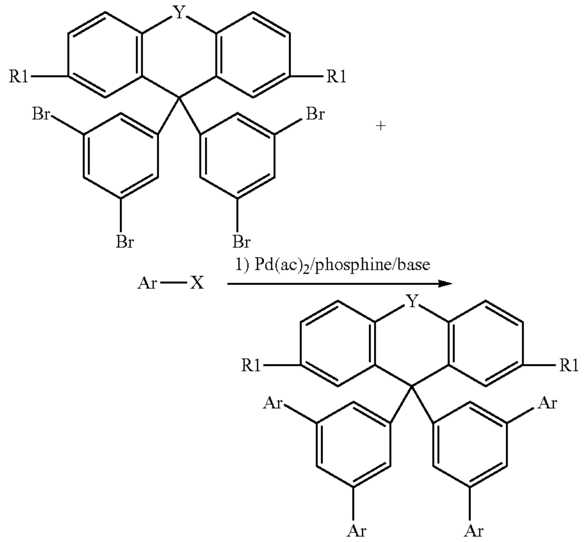

Ar = aromatic/heteroaromatic hydrocarbon X = $B(OH)_2$, ZnBr, MgBr, etc.

The bromine function can be converted by transmetallation using organolithium compounds or Grignard compounds into an electrophilic group, which are then coupled to a multiplicity of electrophiles, such as, for example, aryl-boron halides, aldehydes, ketones, nitriles, esters, halogen esters, carbon dioxide, arylphosphine halides, halosulfinic acids, haloarylsulfonic acids, etc., where the resultant compounds may be end products according to the invention or alternatively intermediates which can be reacted further.

Asymmetrically substituted compounds according to the invention can be obtained by the sequence according to Scheme 4 starting from fluorenone and analogous aryl ketones by addition of an aryl-metal compound, for example 1-lithio-3,5-dibromobenzene, onto the carbonyl function, conversion of the brominated aromatic compound by one of the methods mentioned above with build-up of the one functionality and subsequent introduction of the other functionality via acid-catalysed Friedel-Crafts arylation on 1,3-dibromobenzene and conversion of the brominated aromatic compound by one of the methods mentioned above (see, for example, *Org. Lett.* 2001, 3(15), 2285.).

Scheme 4

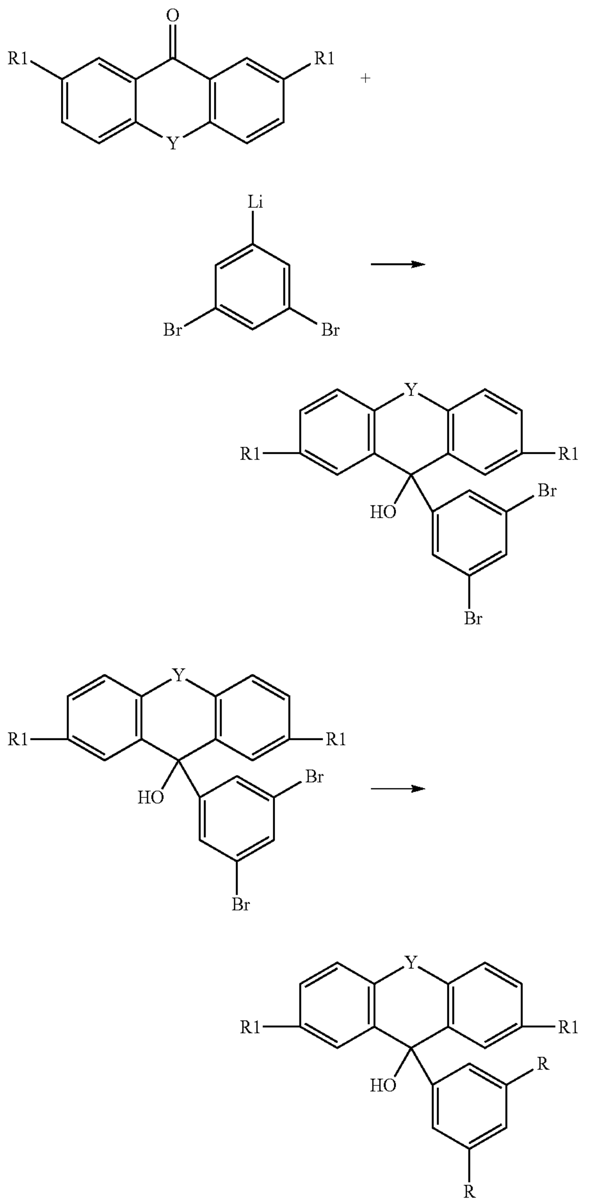

-continued

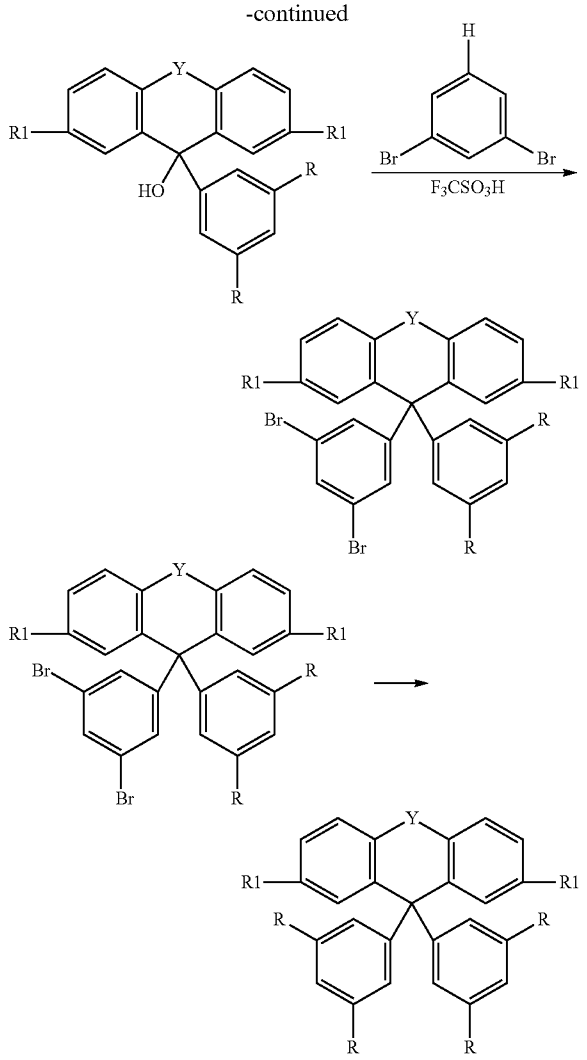

The corresponding indenofluorene derivatives, indenocarbazole derivatives and the further derivatives of the formula (7) can be synthesised correspondingly.

The compounds described above and employed in accordance with the invention, in particular compounds which are substituted by reactive leaving groups, such as bromine, iodine, triflate, tosylate, boronic acid or boronic acid ester, can be used as monomers for the generation of corresponding dimers, trimers, tetramers, pentamers, oligomers, polymers or as core of dendrimers. The oligomerisation or polymerisation here preferably takes place via the halogen functionality or the boronic acid functionality.

As already stated above, the mixture according to the invention also comprises a triplet emitter compound. A triplet emitter compound (phosphorescent compound) in the sense of the present invention is a compound which exhibits luminescence from an excited state having relatively high spin multiplicity, i.e. a spin state >1, in particular from an excited triplet state, at room temperature. For the purposes of the present invention, all luminescent transition-metal complexes containing transition metals from the second and third transition-metal series, in particular all luminescent iridium, platinum and copper compounds, are to be regarded as phosphorescent compounds.

In a preferred embodiment of the present invention, the triplet emitter compound is a red-phosphorescent compound or a green-phosphorescent compound.

Suitable as triplet emitter compound (phosphorescent compound) are, in particular, compounds which emit light, preferably in the visible region, on suitable excitation and in addition contain at least one atom having an atomic number greater than 20, preferably greater than 38 and less than 84, particularly preferably greater than 56 and less than 80. Compounds which contain copper, molybdenum, tungsten, rhenium, ruthenium, osmium, rhodium, iridium, palladium, platinum, silver, gold or europium, in particular compounds which contain iridium, platinum or copper, are preferably used as triplet emitter compound.

Particularly preferred mixtures according to the invention comprise, as triplet emitter compound, a compound of the formulae (21) to (24),

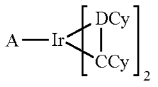
formula (21)

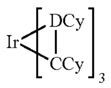
formula (22)

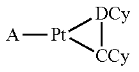
formula (23)

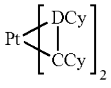
formula (24)

where the following applies to the symbols used:

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^1$ (as defined above); the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^3$;

A is, identically or differently on each occurrence, a monoanionic, bidentate-chelating ligand, preferably a diketonate ligand; and $R^1$ has on each occurrence, identically or differently, the meaning of the radical $R^1$, as defined above.

The formation of ring systems between a plurality of radicals $R^1$ also enables a bridge to be present between the groups DCy and CCy. Furthermore, the formation of ring systems between a plurality of radicals $R^1$ also enables a bridge to be present between two or three ligands CCy-DCy or between one or two ligands CCy-DCy and the ligand A, resulting in a polydentate or polypodal ligand system.

Examples of the emitters described above are revealed by WO 00/70655, WO 01/41512, WO 02/02714, WO 02/15645, EP 1191613, EP 1191612, EP 1191614, WO 04/081017, WO 05/033244, WO 05/042550, WO 05/113563, WO 06/008069, WO 06/061182, WO 06/081973, DE 102008015526, DE 102008027005 and DE 102009007038. In general, all phosphorescent complexes as used in accordance with the prior art for phosphorescent OLEDs or PLEDs and as are known to the person skilled in the art in the area of organic electroluminescence are suitable, and the person skilled in the art will be able to use further phosphorescent compounds without inventive step. In particular, the person skilled in the art knows which phosphorescent complexes emit with which emission colour.

Examples of suitable phosphorescent compounds are structures (T-1) to (T-140) shown in the following table.

(T-1)

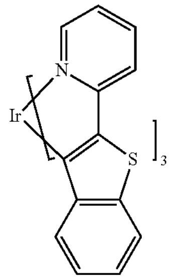

(T-2)

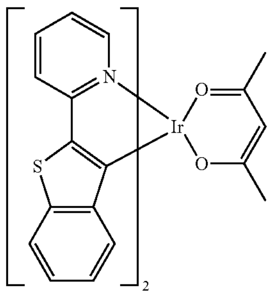

(T-3)

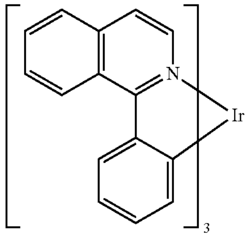

(T-4)

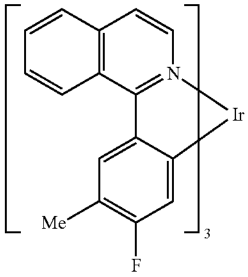

(T-5)

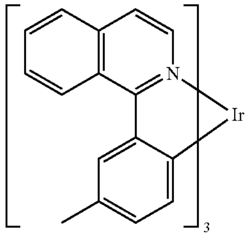

-continued (T-6)

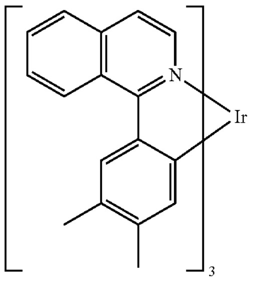

(T-7)

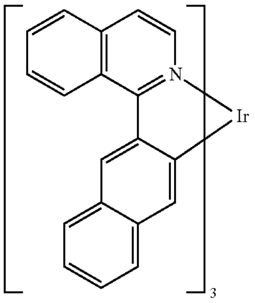

(T-8)

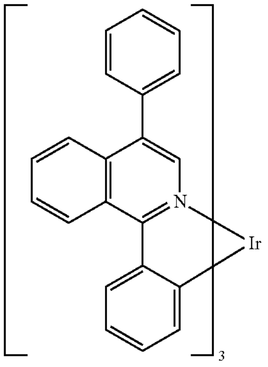

(T-9)

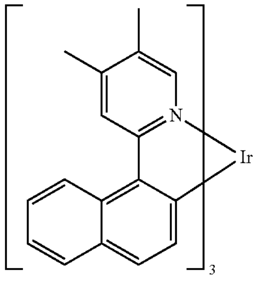

(T-10)

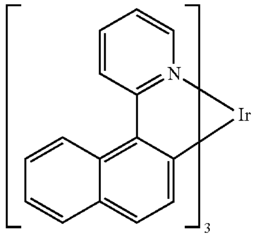

-continued
(T-11)
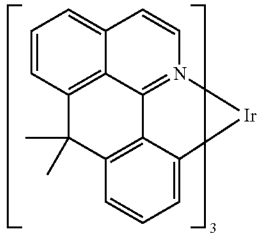
(T-12)
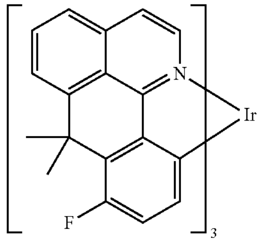
(T-13)
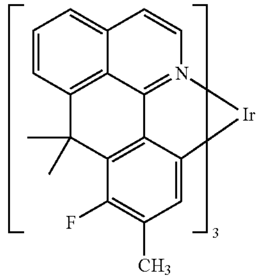
(T-14)
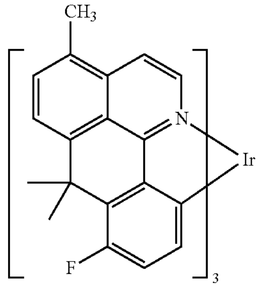
(T-15)
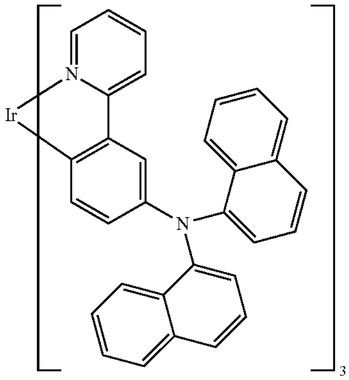
-continued
(T-16)
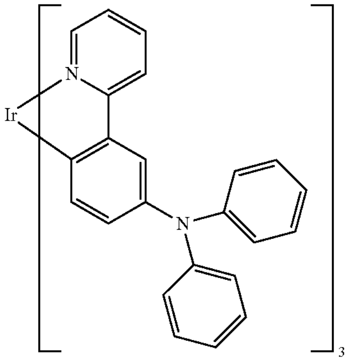
(T-17)
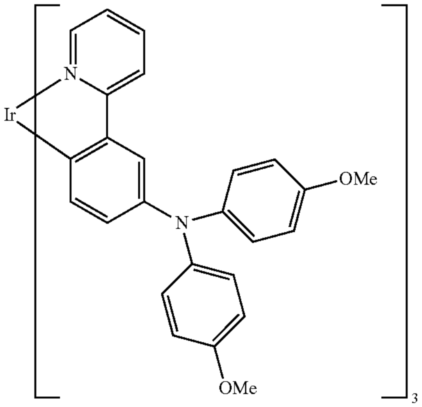
(T-18)
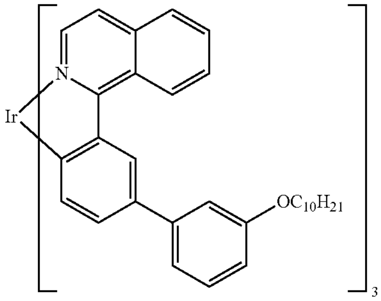
(T-19)
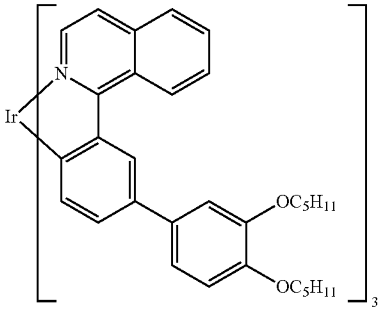

-continued
(T-20)
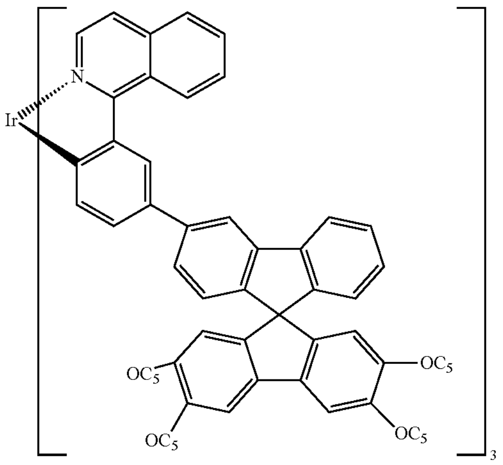
(T-21)
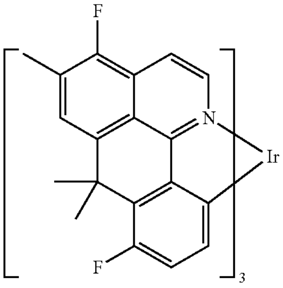
(T-22)
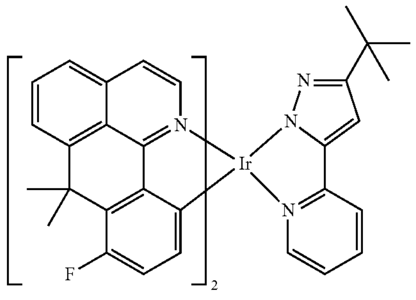
(T-23)
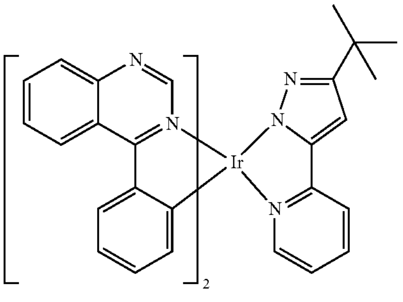
(T-24)
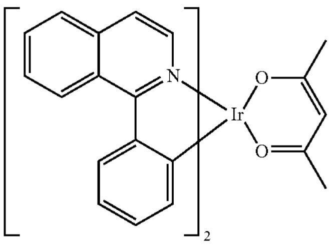
-continued
(T-25)
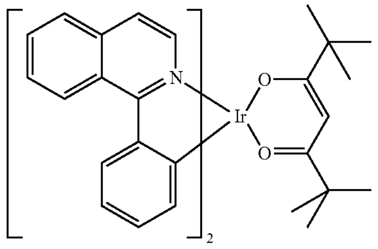
(T-26)
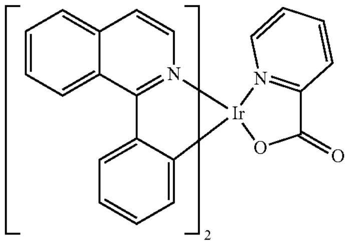
(T-27)
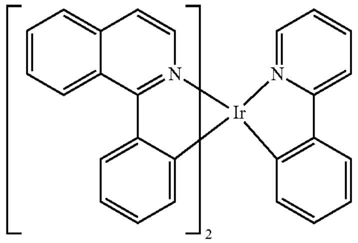
(T-28)
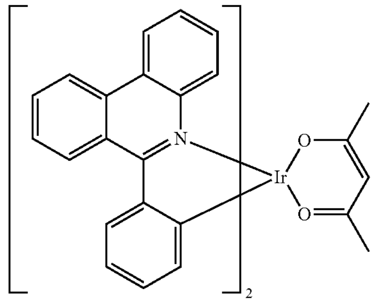
(T-29)
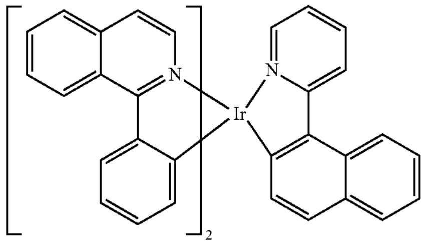
(T-30)
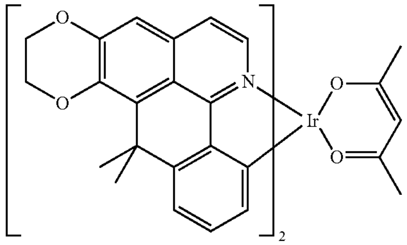

-continued
(T-31)
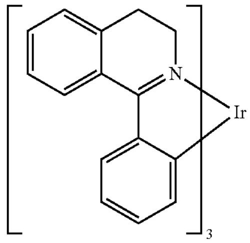
(T-32)
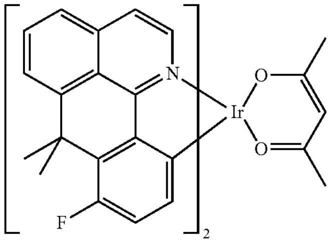
(T-33)
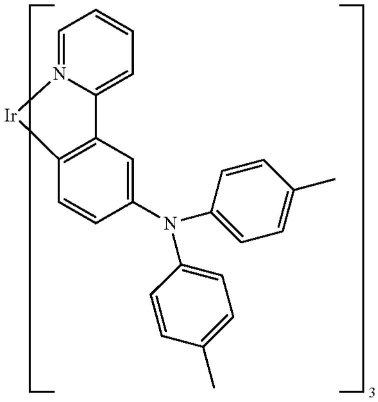
(T-34)
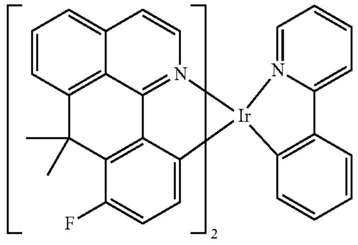
(T-35)
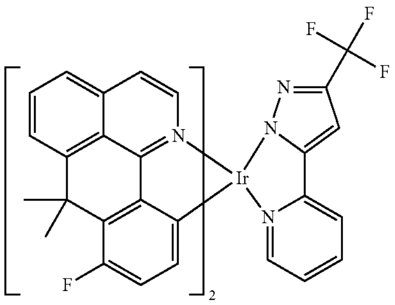
-continued
(T-36)
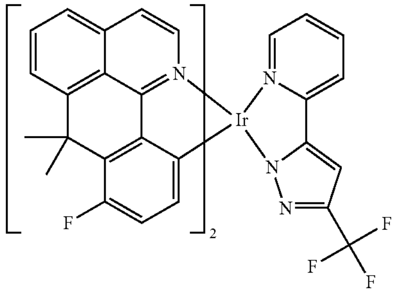
(T-37)
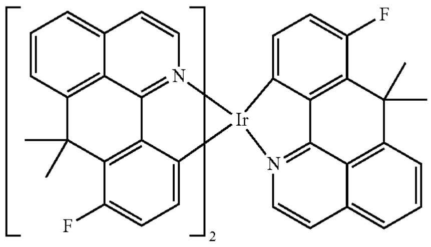
(T-38)
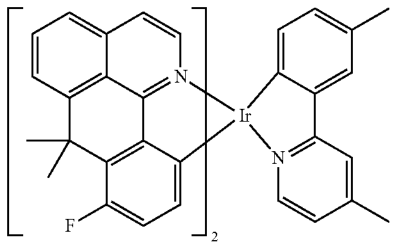
(T-39)
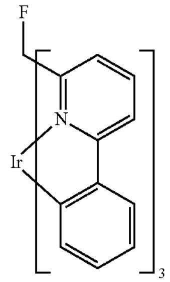
(T-40)
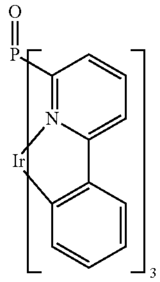
(T-41)
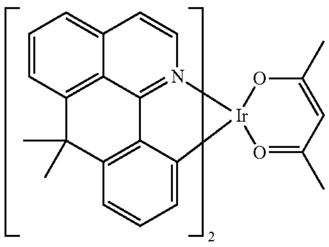

-continued
(T-42)
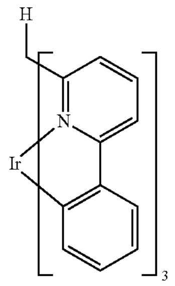
(T-43)
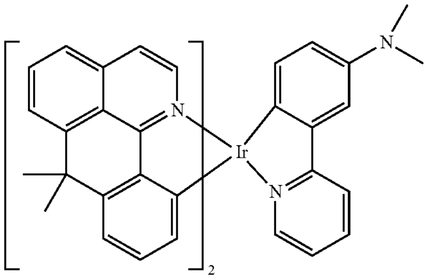
(T-44)
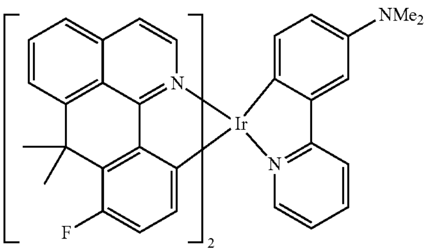
(T-45)
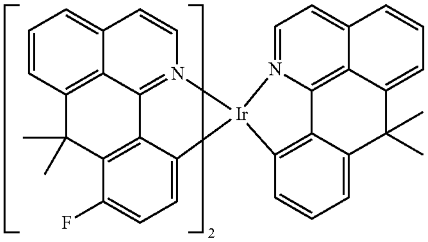
(T-46)
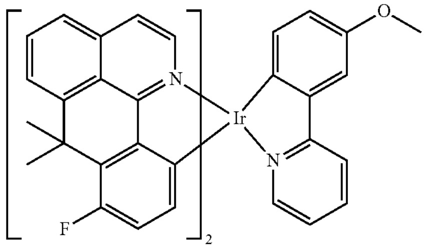
(T-47)
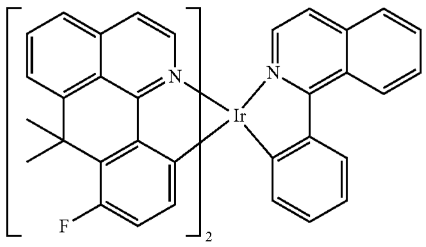
-continued
(T-48)
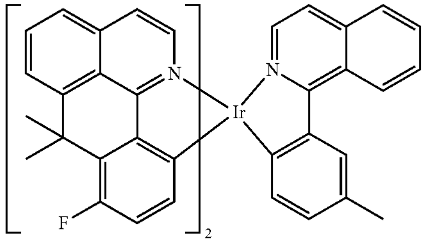
(T-49)
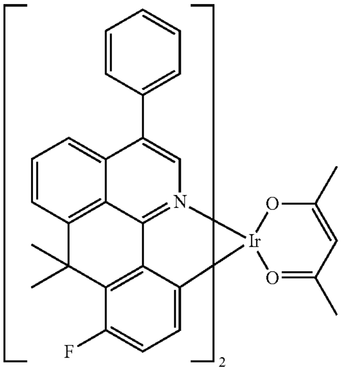
(T-50)
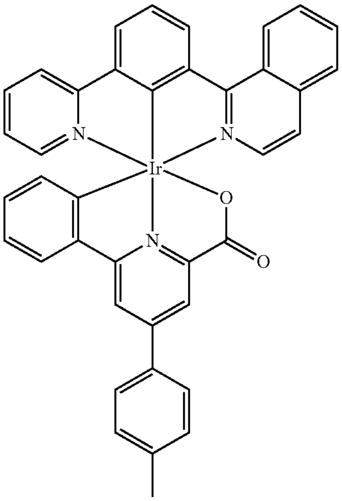
(T-51)
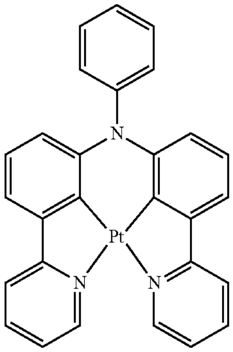

-continued
(T-52)
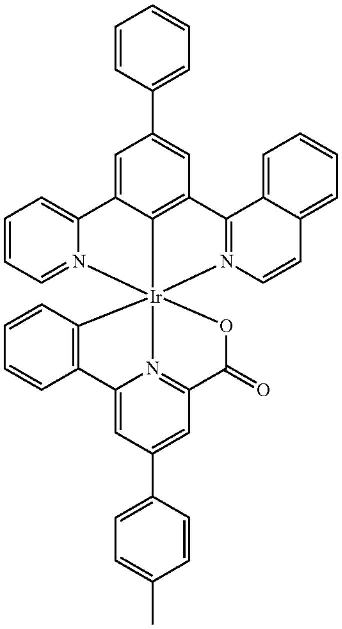
(T-53)
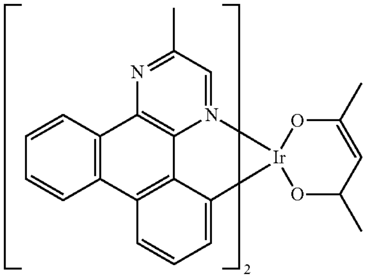
(T-54)
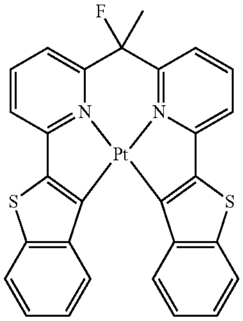
(T-55)
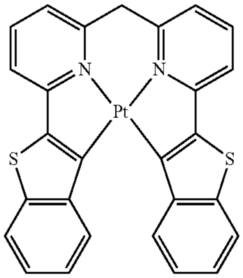
-continued
(T-56)
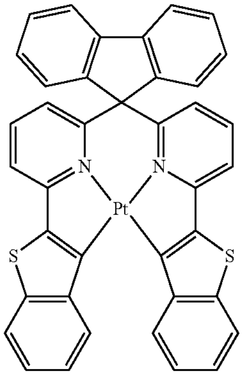
(T-57)
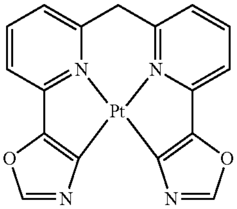
(T-58)
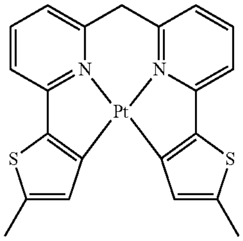
(T-59)
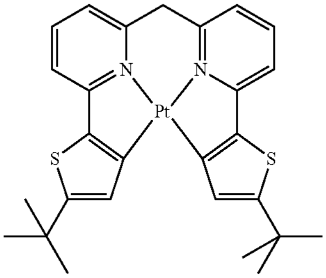
(T-60)
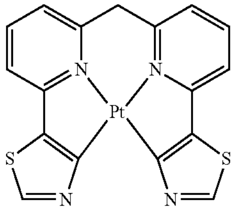
(T-61)
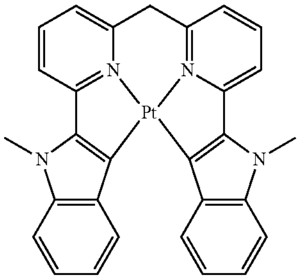

-continued
(T-62)
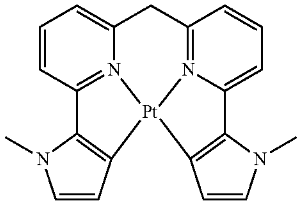
(T-63)
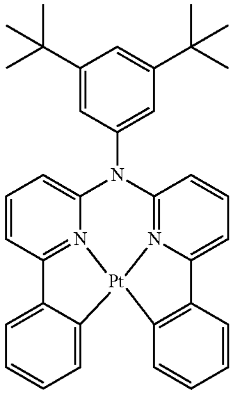
(T-64)
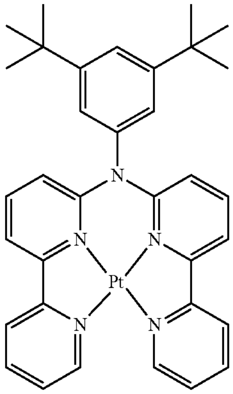
(T-65)
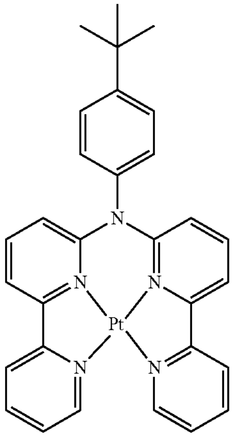
-continued
(T-66)
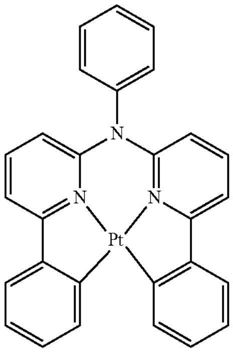
(T-67)
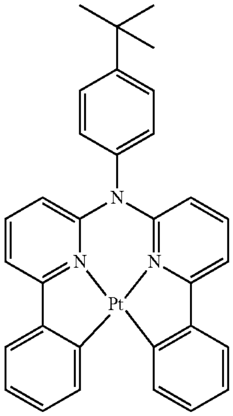
(T-68)
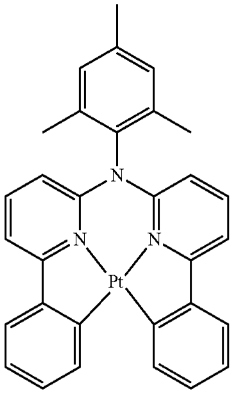
(T-69)
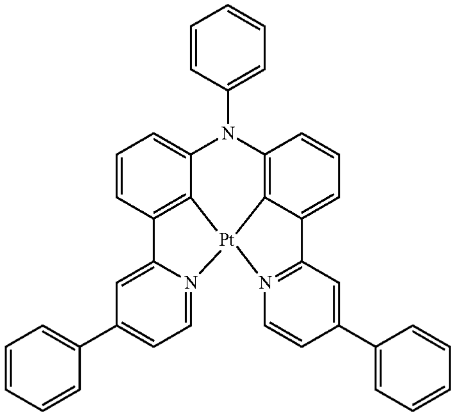

-continued
(T-70)
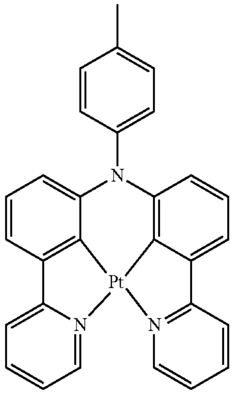
(T-71)
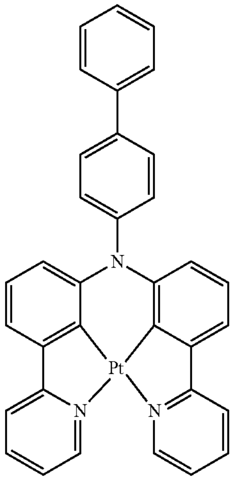
(T-72)
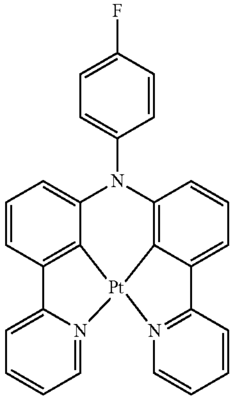
-continued
(T-73)
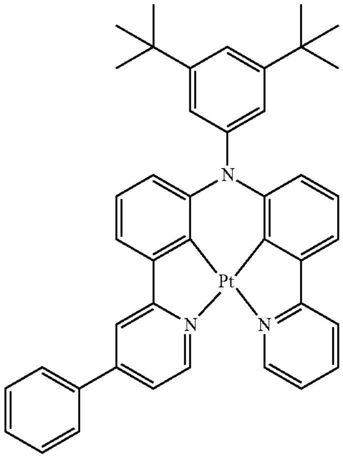
(T-74)
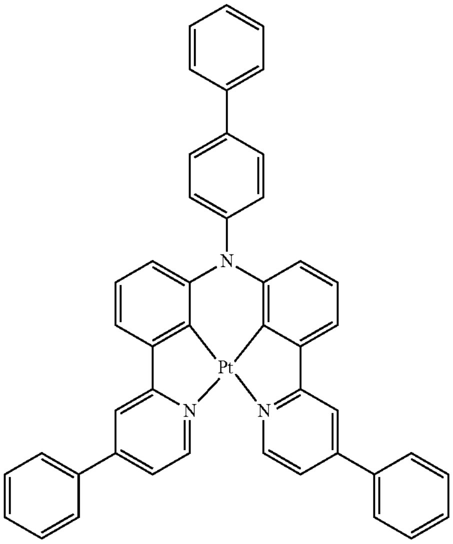
(T-75)
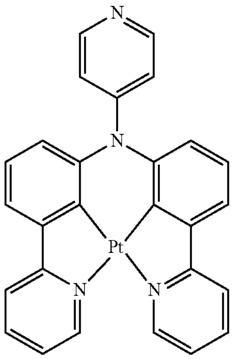

-continued
(T-76)
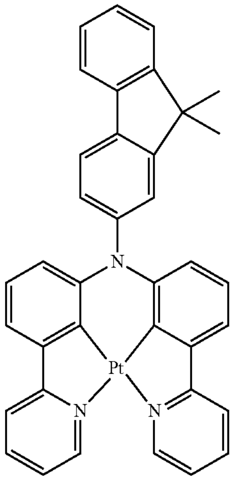
(T-77)
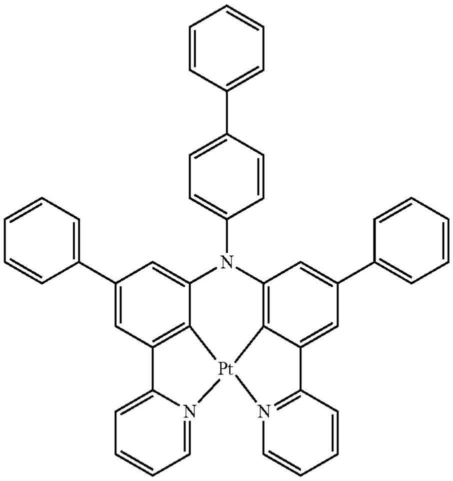
(T-78)
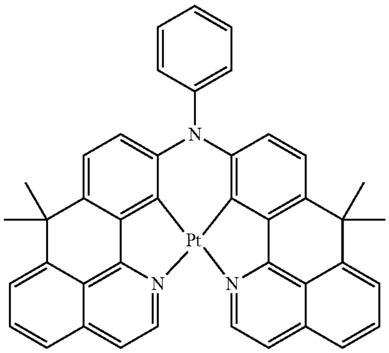
-continued
(T-79)
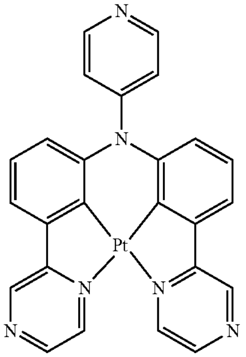
(T-80)
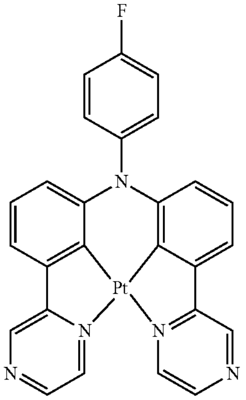
(T-81)
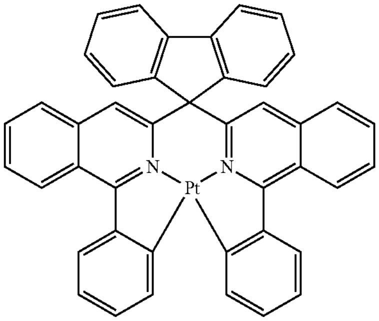
(T-82)
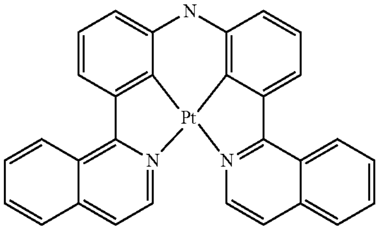
(T-83)
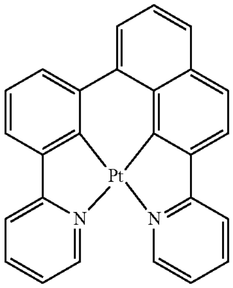

-continued
(T-84)
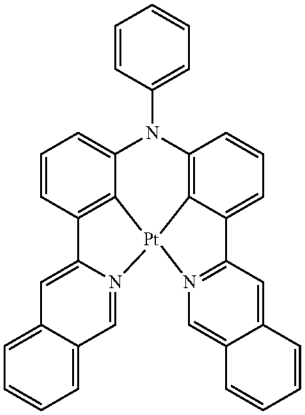
(T-85)
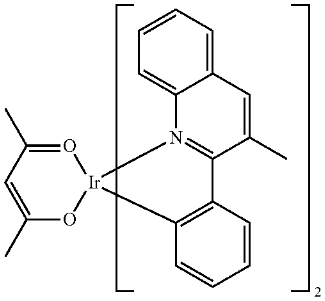
(T-86)
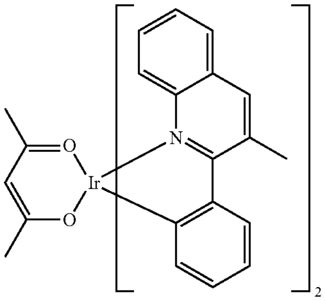
(T-87)
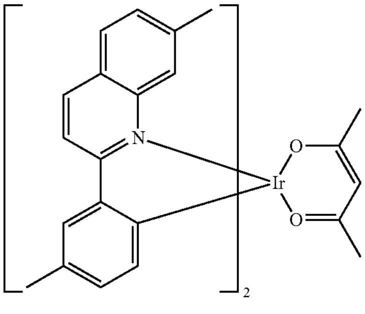
(T-88)
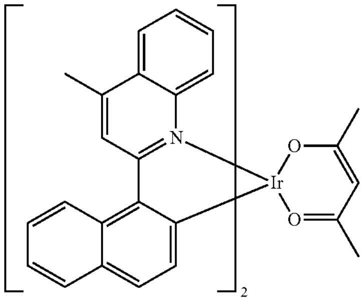
-continued
(T-89)
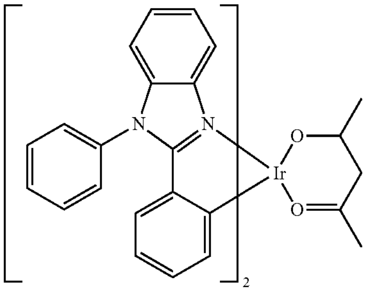
(T-90)
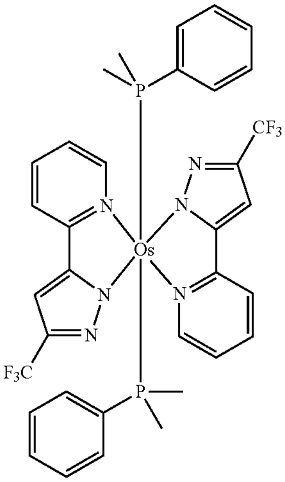
(T-91)
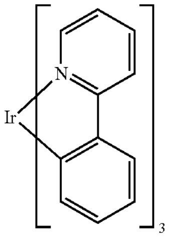
(T-92)
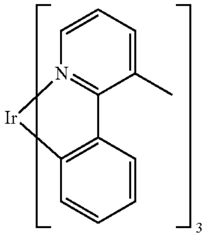
(T-93)
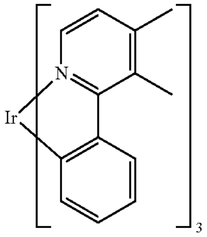

-continued
(T-94)
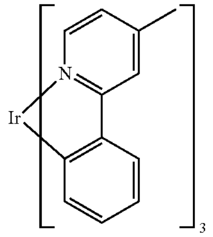
(T-95)
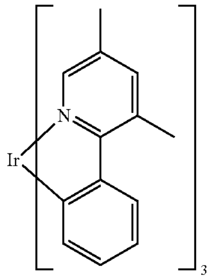
(T-95)
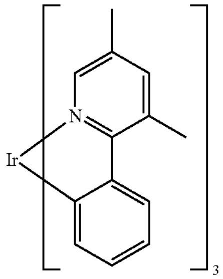
(T-96)
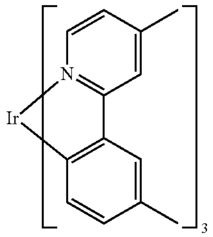
(T-97)
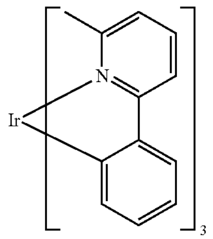
-continued
(T-98)
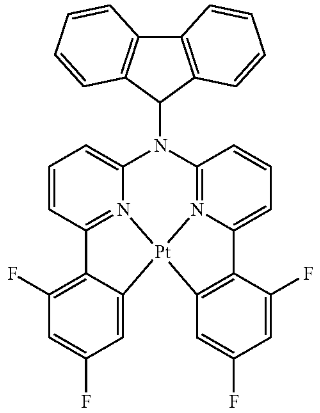
(T-99)
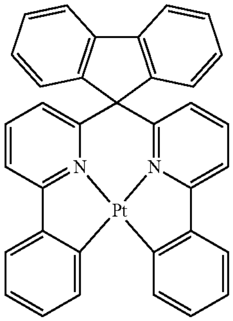
(T-100)
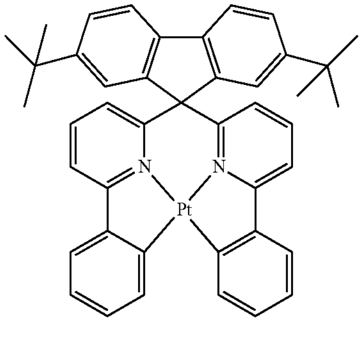
(T-101)
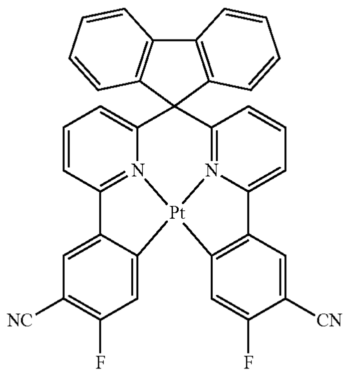

-continued
(T-102)
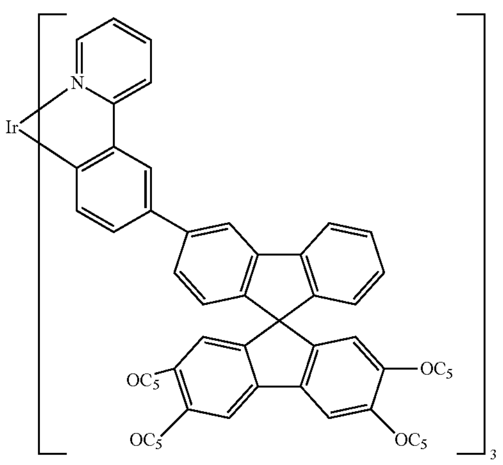
(T-103)
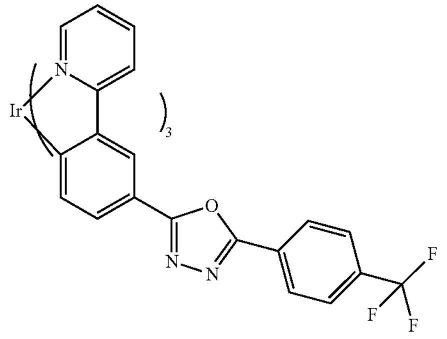
(T-104)
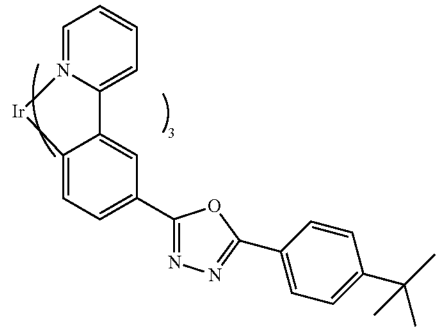
(T-105)
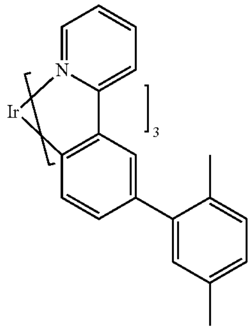
-continued
(T-106)
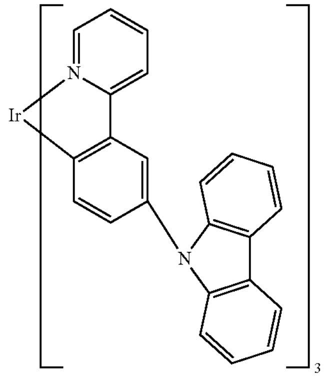
(T-107)
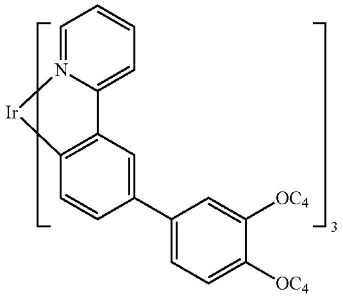
(T-108)
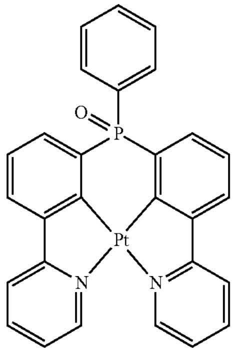
(T-109)
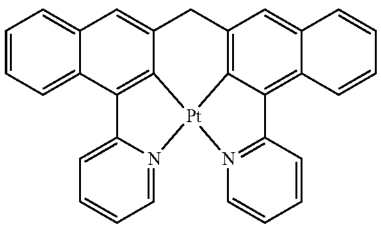

-continued
(T-110)
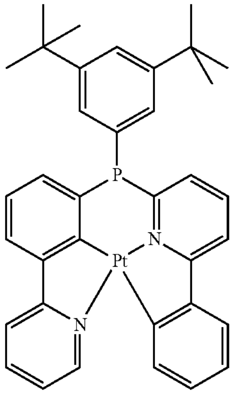
(T-111)
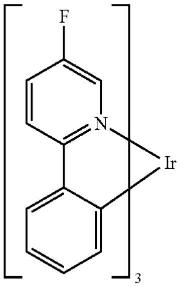
(T-112)
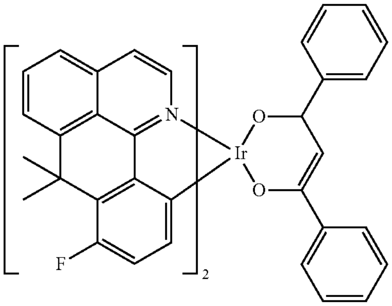
(T-113)
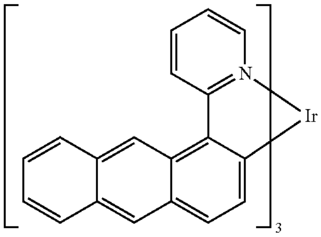
(T-114)
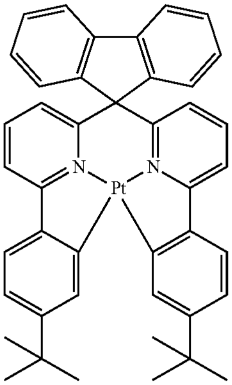
-continued
(T-115)
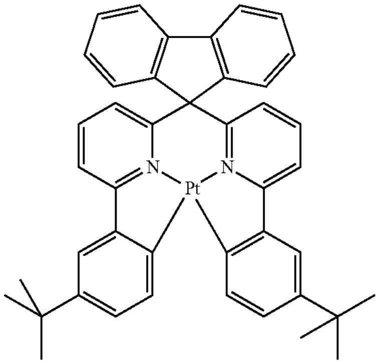
(T-116)
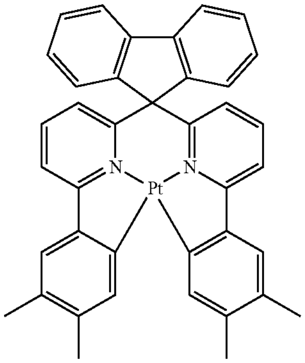
(T-117)
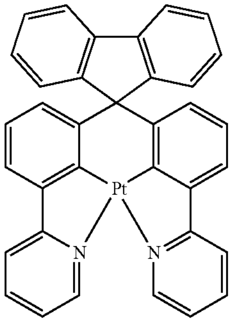
(T-118)
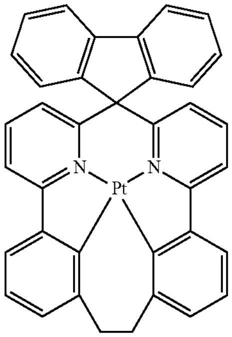

-continued
(T-119)
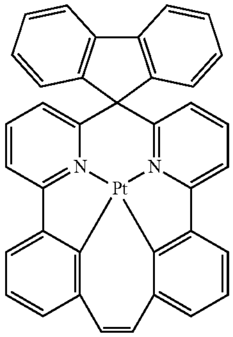
(T-120)
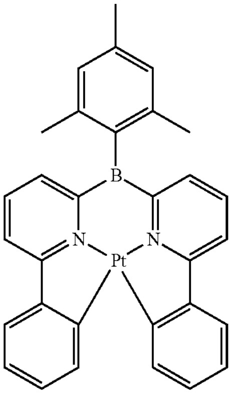
(T-121)
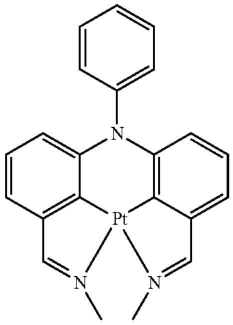
(T-122)
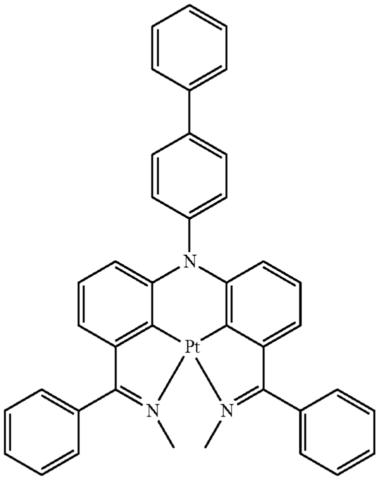
(T-123)
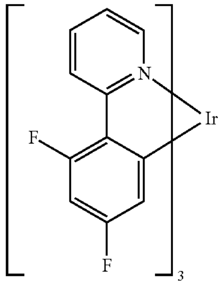
(T-124)
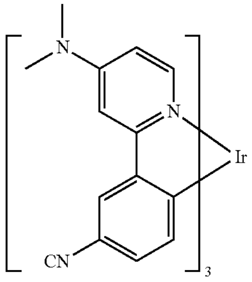
(T-125)
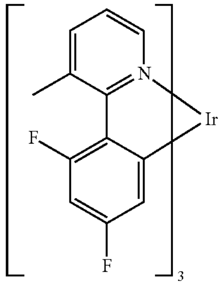
(T-126)
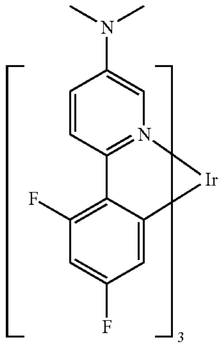
(T-127)
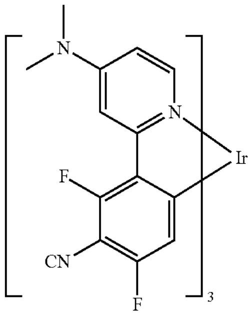

-continued
(T-128)
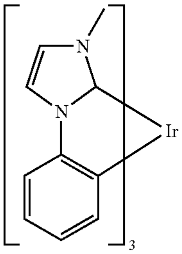
(T-129)
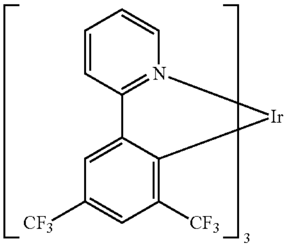
(T-130)
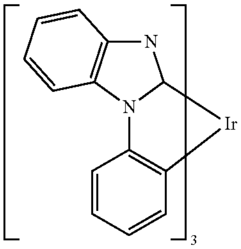
(T-131)
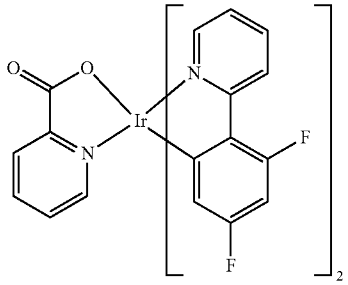
(T-132)
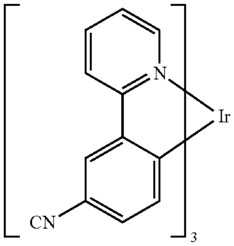
(T-133)
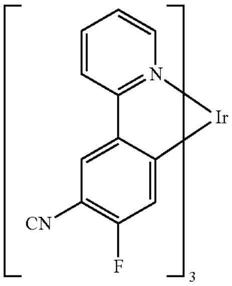
-continued
(T-134)
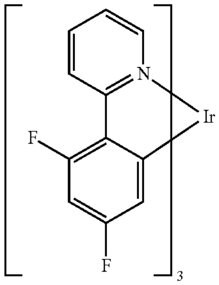
(T-135)
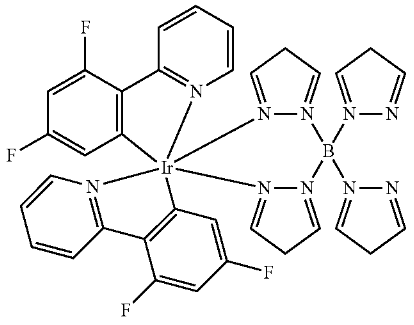
(T-136)
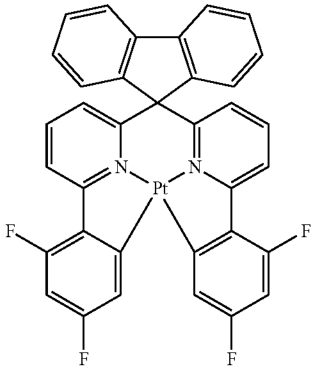
(T-137)
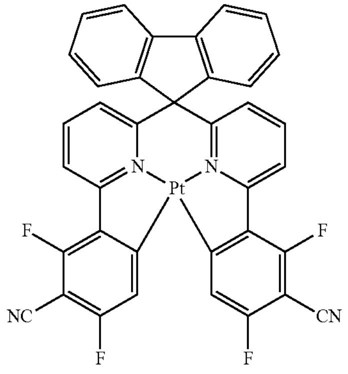

-continued (T-138)

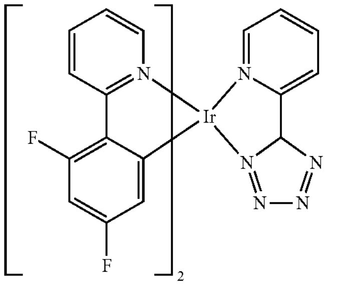

(T-139)

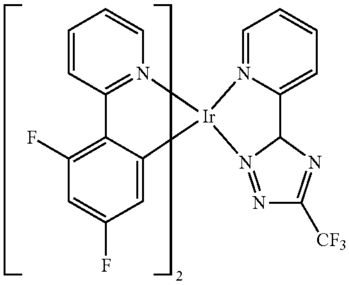

(T-140)

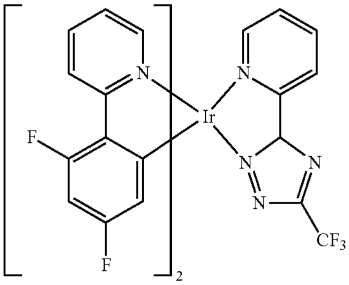

The mixture according to the invention preferably comprises:

a) 1 to 70% by weight, particularly preferably 5 to 60% by weight and very particularly preferably 10 to 50% by weight of the polymer containing at least one L=X structural unit, b) 0.1 to 40% by weight, particularly preferably 0.5 to 30% by weight and very particularly preferably 1 to 25% by weight of triplet emitter, c) 1 to 70% by weight, particularly preferably 5 to 60% by weight and very particularly preferably 10 to 50% by weight of carbazole compound or neutral soluble compound.

In a further embodiment of the present invention, the mixture furthermore comprises one or more solvents. The mixture is thus in the form of a formulation. The formulation is eminently suitable for the production of layers from solution.

Suitable and preferred solvents are, for example, toluene, anisole, xylenes, methyl benzoate, dimethylanisoles, trimethylbenzenes, tetralin, veratrols, tetrahydrofuran, chlorobenzene or dichlorobenzene, as well as mixtures thereof.

The mixture according to the invention is suitable for use in organic electroluminescent devices (OLEDs, PLEDs), in particular in a luminescent layer of such devices.

The present invention therefore furthermore relates to the use of the mixture according to the invention in organic electronic devices.

The electronic device here is selected from the group consisting of organic electroluminescent devices (OLEDs, PLEDs), organic field-effect transistors (O-FETs), organic thin-film transistors (O-TFTs), organic light-emitting transistors (O-LETs), organic integrated circuits (O-ICs), organic solar cells (O-SCs), organic field-quench devices (O-FQDs), light-emitting electrochemical cells (LECs), organic photoreceptors, organic laser diodes (O-lasers) or optically pumped organic lasers.

Particular preference is given here to the use of the mixture according to the invention in organic electroluminescent devices.

The present invention still furthermore relates to organic electronic devices containing the mixture according to the invention, in particular organic electroluminescent devices comprising anode, cathode and at least one emitting layer, which is characterised in that at least one layer comprises a mixture according to the invention.

Apart from cathode, anode and the at least one emitting layer which was described above, the organic electroluminescent device may also comprise further layers. These are selected, for example, from in each case one or more hole-injection layers, hole-transport layers, hole-blocking layers, electron-transport layers, electron-injection layers, electron-blocking layers, exciton-blocking layers, charge-generation layers and/or organic or inorganic p/n junctions. In addition, interlayers which control, for example, the charge balance in the device may be present. In particular, such interlayers may be appropriate as interlayer between two emitting layers, in particular as interlayer between a fluorescent layer and a phosphorescent layer. Furthermore, the layers, in particular the charge-transport layers, may also be doped. Doping of the layers may be advantageous for improved charge transport. However, it should be pointed out that each of the layers mentioned above does not necessarily have to be present, and the choice of layers is always dependent on the compounds used. The use of layers of this type is known to the person skilled in the art, and he will be able to use all materials in accordance with the prior art that are known for layers of this type for this purpose without inventive step.

It is furthermore possible to use more than one emitting layer, for example two or three emitting layers, which preferably have different emission colours. A particularly preferred embodiment of the present invention relates to a white-emitting organic electroluminescent device. This is characterised in that it emits light having CIE colour coordinates in the range from 0.28/0.29 to 0.45/0.41. The general structure of a white-emitting electroluminescent device of this type is disclosed, for example, in WO 05/011013.

The cathode of the electroluminescent device according to the invention preferably comprises metals having a low work function, metal alloys or multilayered structures comprising different metals, such as, for example, alkaline-earth metals, alkali metals, main-group metals or lanthanoids (for example Ca, Ba, Mg, Al, In, Mg, Yb and Sm). In the case of multilayered structures, further metals which have a relatively high work function, such as, for example, Ag, may also be used in addition to the said metals, in which case combinations of the metals, such as, for example, Ca/Ag or Ba/Ag, are generally used. Preference is likewise given to metal alloys, in particular alloys comprising an alkali metal or alkaline-earth metal and silver, particularly preferably an alloy of Mg and Ag. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides or carbonates (for example LiF, $Li_2O$, CsF, $Cs_2CO_3$, $BaF_2$, MgO and NaF). The layer thickness of this layer is preferably between 0.5 and 5 nm.

The anode of the electroluminescent device according to the invention preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example $Al/Ni/NiO_x$, $Al/PtO_x$) may also be preferred. At least one of the electrodes here must be transparent in order to facilitate the coupling-out of light. A preferred structure uses a transparent anode. Preferred anode materials here are conductive mixed metal oxides. Particular preference is given to indium tin oxide (ITO) or indium zinc oxide (IZO). Preference is furthermore given to conductive, doped organic materials, in particular conductive doped polymers.

The device is correspondingly (depending on the application) structured, provided with contacts and finally hermetically sealed, since the lifetime of devices of this type is drastically shortened in the presence of water and/or air.

In general, all further materials as employed in accordance with the prior art in organic electroluminescent devices can be employed in combination with the mixture according to the invention in the emitting layer.

Very particular preference is given to an organic electroluminescent device which is characterised in that one or more layers are produced from solution, such as, for example, by spin coating, or by means of any desired printing process, such as, for example, screen printing, flexographic printing or offset printing, but particularly preferably LITI (light induced thermal imaging, thermal transfer printing) or ink-jet printing. Soluble systems are necessary for this purpose, as are provided by the mixture according to the invention.

The organic electroluminescent device can also be produced as a hybrid system by applying one or more layers from solution and applying one or more further layers by vapour deposition.

Preference is thus furthermore given to an organic electroluminescent device which is characterised in that one or more layers are coated by means of a sublimation process, in which the materials are vapour-deposited in vacuum sublimation units at an initial pressure of less than $10^{-5}$ mbar, preferably less than $10^{-6}$ mbar. However, it should be noted that the initial pressure may also be even lower, for example less than $10^{-7}$ mbar.

Preference is likewise given to an organic electroluminescent device which is characterised in that one or more layers are coated by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and thus structured (for example M. S. Arnold et al., *Appl. Phys. Lett.* 2008, 92, 053301).

These processes are generally known to the person skilled in the art and can be applied by him to the organic electroluminescent devices according to the invention without inventive step.

The organic electroluminescent devices according to the invention have the following surprising advantages over the prior art:

1. The organic electroluminescent device according to the invention has very high efficiency.
2. The organic electroluminescent device according to the invention at the same time has an improved lifetime.

The invention will be described in greater detail by the following examples without wishing to restrict it thereby. The person skilled in the art will be able to produce further organic electroluminescent devices according to the invention without inventive step.

WORKING EXAMPLES

Examples 1 to 7

Preparation of the Monomers

The following syntheses are carried out, unless indicated otherwise, under a protective-gas atmosphere in dried solvents. Starting materials, monomer M6 and solvents can be purchased commercially (for example from Merck). Compound 1 can be prepared analogously to WO 2004/041091. Monomer M4 can be prepared in accordance with *Org. Lett.*, 10, 23, 5429-5432, 2008, and monomer M5 can be prepared in accordance with *Org. Lett.*, 7, 24, 5361-5364, 2005.

Example 1

Preparation of Compound 4 (M1)

Compound 4 is prepared as follows:

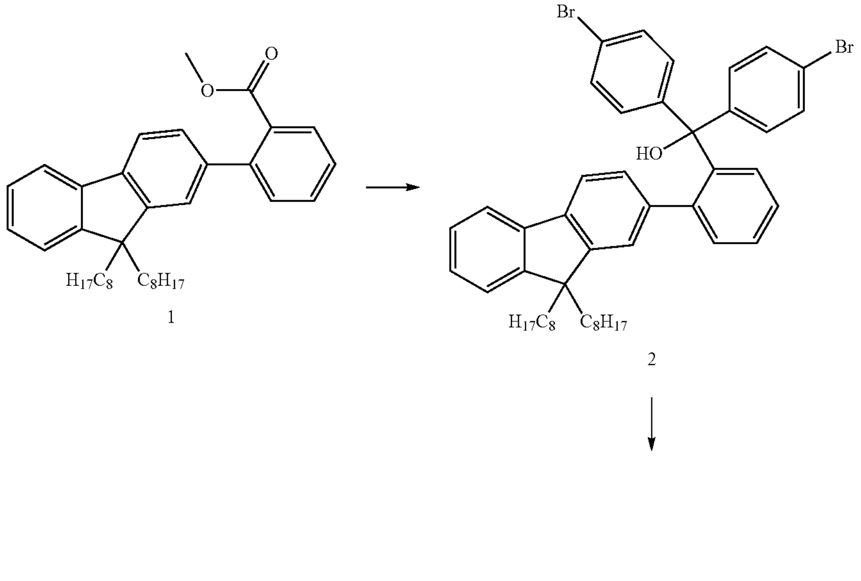

1

2

-continued

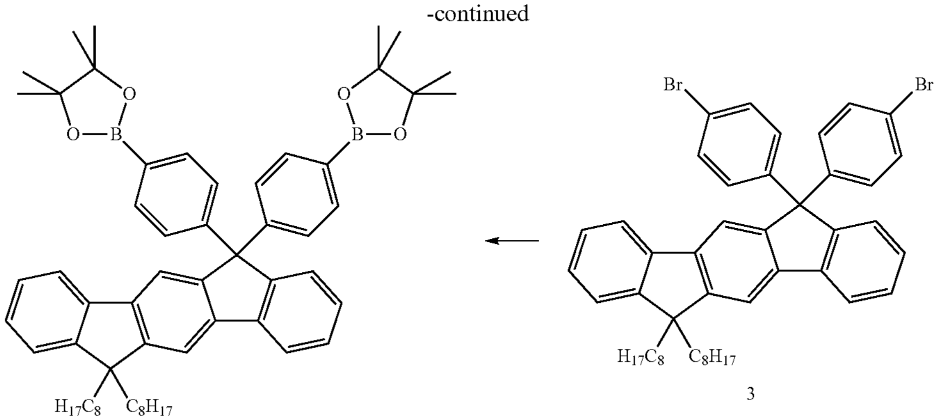

4

3

1.1 Compound 2

2

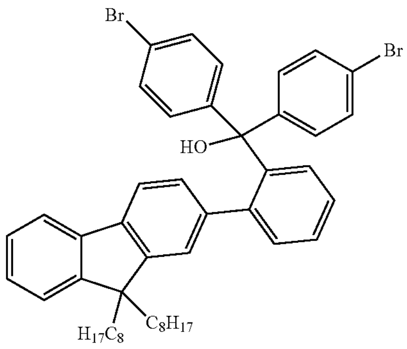

104.3 g (2 molar equivalents, 0.442 mol) of 1,4-dibromobenzene are initially introduced in 300 ml of THF and cooled to −75° C. in an acetone/dry-ice bath. 117 ml (2 molar equivalents, 0.442 mol) of n-butyllithium (2.5 M in hexane) are added dropwise at such a rate that the internal temperature does not exceed −69° C., the mixture is subsequently stirred at −72° C. for a further 1 hour. 116 g (1 molar equivalent, 0.221 mol) of compound 1 are then dissolved in 220 ml of THF and slowly added dropwise at −72° C. that the internal temperature does not exceed −69° C. The reaction solution is stirred at −70° C. for a further hour and at room temperature overnight.

120 ml of acetic acid (50%) are added to the batch. The phases are separated. The aqueous phase is extracted with heptane. The combined organic phases are extracted with water, dried over $Na_2SO_4$, filtered and evaporated under reduced pressure.

$^1$H NMR ($CDCl_2$, δ (ppm), J (Hz)): 0.51 (s broad, 4H), 0.81 (t, 6H, J=7.25), 0.94-1.25 (m, 20H), 1.55-1.85 (m, 4H), 6.73 (d, 1H, J=8.0), 6.87-6.90 (m, 2H), 6.95-7.05 (m broad, 4H), 7.21 (d, 1H, J=7.55), 7.24 (d, 1H, J=7.75), 7.28-7.36 (m, 4H), 7.42 (d, 4H, J=8.6), 7.56 (d, 1H, 7.75), 7.66-7.68 (m, 1H)

1.2 Compound 3

3

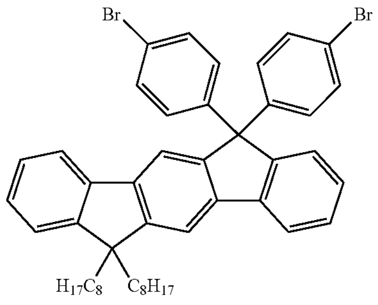

177.4 g (1 molar equivalent, 0.22 mol) of compound 2 are dissolved in 353.2 ml (2.8 molar equivalents, 6.1 mol) of acetic acid and warmed to reflux. 19.6 ml (1.1 molar equivalents, 0.24 mol) of concentrated hydrochloric acid are added under reflux, and the mixture is heated under reflux for 1.5 hours. After a TLC check (heptane/ethyl acetate), 2×2 ml of concentrated hydrochloric acid are metered in, reaction time 3 hours. When the reaction is complete, 25 ml of water is carefully added. A further 50 ml of water is subsequently added for phase separation. The mixture is extracted with dichloromethane (DCM), the combined organic phases are then extracted with water and $NaHCO_3$, dried over sodium sulfate, filtered and evaporated under reduced pressure.

The purification is carried out by recrystallisation (acetonitrile/toluene) and gives a white solid (99%).

$^1$H NMR ($CDCl_2$, δ (ppm), J (Hz)): 0.65-0.75 (m, 4H), 0.79 (t, 6H, J=7.25), 0.99-1.25 (m, 20H), 1.98-2.01 (m, 4H), 7.10 (d, 4H, J=8.75), 7.26-7.29 (m, 3H), 7.33-7.41 (m, 7H), 7.57 (s, 1H), 7.60-7.62 (m, 1H), 7.71 (s, 1H), 7.84 (d, 1H, 7.55)

1.3 Compound 4

4

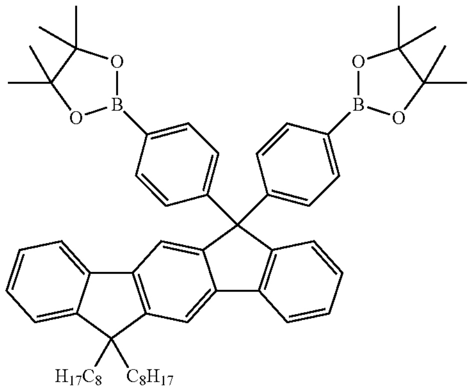

250 ml of dioxane, 19.33 g (2 molar equivalents, 0.076 mol) of bis(pinacolato)diborane and 10.83 g (2.9 molar equivalents, 0.11 mol) of potassium acetate are added to 30 g (1 molar equivalent, 0.038 mol) of compound 3. 1.11 g (1.4 mmol) of 1,1-bis(diphenylphosphine)ferrocenepalladium(II) chloride (complex with dichloromethane (1:1), Pd: 13%) are subsequently added. The batch is heated to 110° C. After a TLC check, the batch is cooled to room temperature, and 200 ml of water is added. A further 50 ml of water is subsequently added for phase separation. The mixture is extracted with ethyl acetate, the combined organic phases are then dried over sodium sulfate, filtered and evaporated under reduced pressure.

The purification is carried out via a column (heptane/ethyl acetate) and by recrystallisation (heptane) and gives a white solid (100%).

$^1$H NMR ($CDCl_2$, δ (ppm), J (Hz)): 0.65-0.75 (m, 4H), 0.80 (t, 6H, J=7.25), 0.99-1.23 (m, 20H), 1.28 (s, 24H), 1.98-2.01 (m, 4H), 7.23 (d, 4H, J=8.2), 7.26-7.28 (m, 3H), 7.32-7.34 (m, 1H), 7.37-7.40 (m, 2H), 7.57-7.59 (m, 1H), 7.62 (s, 1H), 7.68 (d, 4H, J=8.25), 7.71 (s, 1H), 7.84 (d, 1H, 7.40)

Example 2

Preparation of Compound 8 (M2)

Compound 8 is prepared as follows:

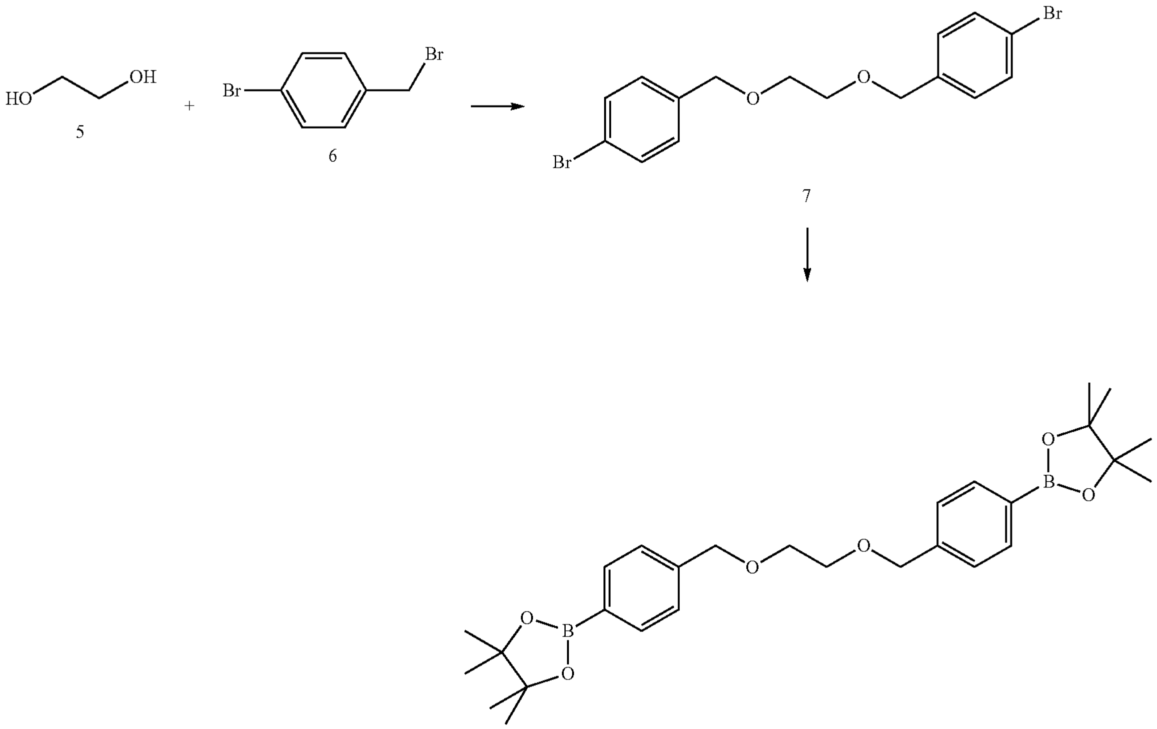

5 6 7 8

2.1 Compound 7

7

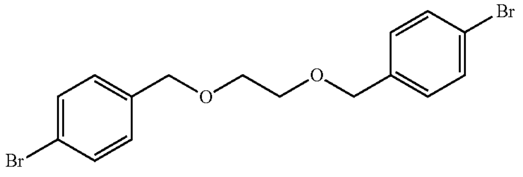

80.02 g of NaH (10 molar equivalents, 2.0 mol) are initially introduced in 600 ml of THF, 11.3 ml of ethylene glycol (1 molar equivalent, 0.2 mol) in 200 ml of THF are added under protective gas at about 0° C., and, after a stirring time of 1 hour at 0° C., a solution of 100 g of 4-bromobenzyl bromide (2 molar equivalents, 0.4 mmol) in 300 ml of THF is slowly added dropwise at 0° C. The batch is stirred under reflux for 36 hours, subsequently cooled at 0° C., and 200 ml of water are slowly added dropwise at 0° C. The aqueous phase is extracted by shaking three times with DCM. The combined organic phases are dried over $Na_2SO_4$, filtered and evaporated in a rotary evaporator. Recrystallisation from ethanol gives the product 7 (30.6 g, 38%).

$^1H$ NMR ($CDCl_3$, δ (ppm), J (Hz)): 3.64 (s, 4H), 4.52 (s, 4H), 7.21 (d, 4H, J=8.4), 7.46 (d, 4H, J=8.4)

2.2 Compound 8

8

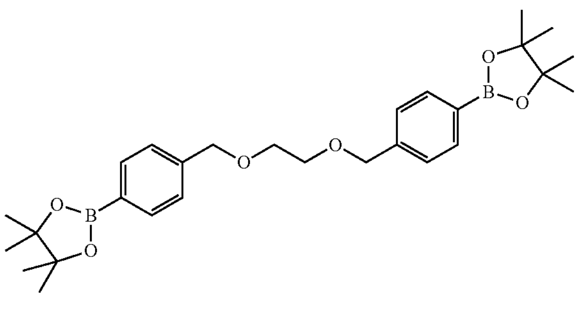

200 ml of THF, 52.53 g (2.2 molar equivalents, 206.9 mmol) of bis(pinacolato)diborane in 100 ml of THF, 60.78 g (6.6 molar equivalents, 619.3 mmol) of potassium acetate in 200 ml of THF and 2.71 g (0.04 molar equivalents, 3.7 mmol) of 1,1-bis(diphenylphosphine)ferrocenepalladium (II) chloride (complex with dichloromethane (1:1), Pd: 13%) are added to 37.29 g (1 molar equivalent, 93.2 mmol) of compound 7. The batch is stirred at 80° C. for 5 hours, and 200 ml of ice-water are slowly added dropwise. The aqueous phase is extracted by shaking three times with DCM. The combined organic phases are dried over $Na_2SO_4$, filtered and evaporated in a rotary evaporator. Recrystallisation from heptane gives the product 8 (9.1 g, 20%).

$^1H$ NMR ($CDCl_2$, δ (ppm), J (Hz)): 1.32 (s, 24H), 3.65 (s, 4H), 4.57 (s, 4H), 7.35 (d, 4H, J=7.9), 7.79 (d, 4H, J=7.9)

Example 3

Preparation of Compound 13 (M3)

Compound 13 is prepared as follows:

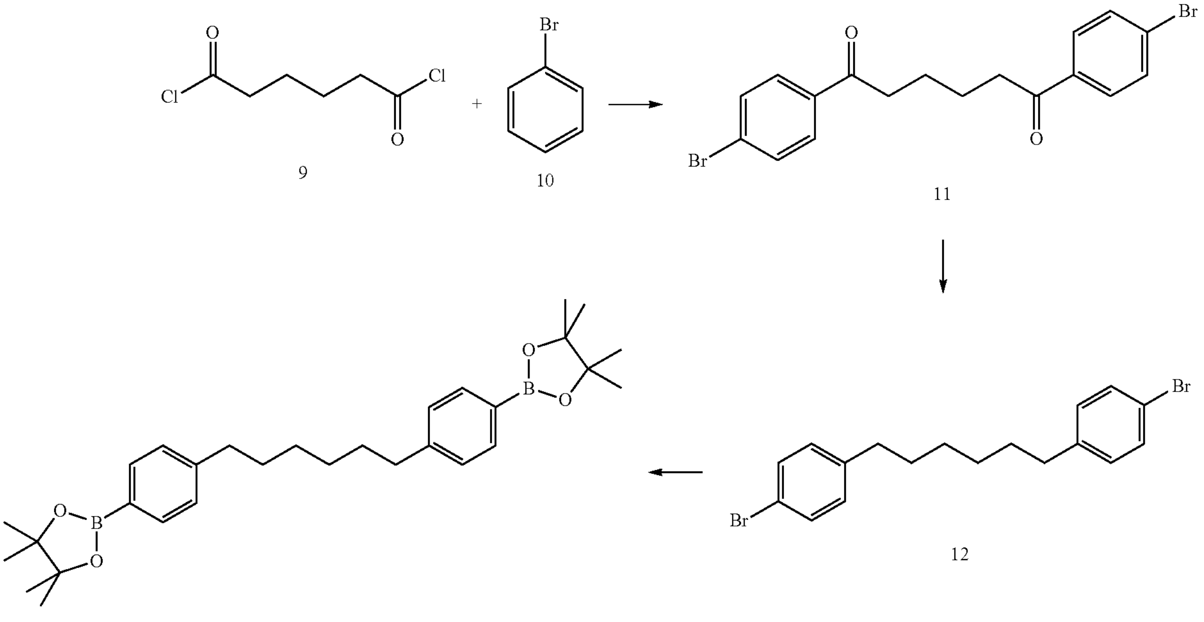

9 10 11 12 13

3.1 Compound 11

11

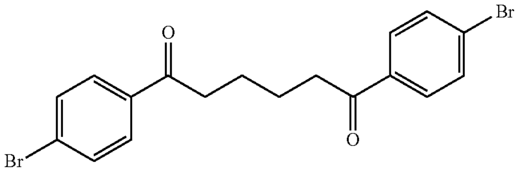

218.55 g of aluminium chloride (2.4 molar equivalents, 1.64 mol) are initially introduced in 288 ml (4.0 molar equivalents, 2.73 mol) of bromobenzene. 100 ml of adipoyl chloride (1 molar equivalent, 0.68 mmol) is added dropwise under protective gas at room temperature. The batch is stirred at 50° C. for 1 hour, and 200 ml of water are slowly added dropwise at 0° C. The aqueous phase is extracted by shaking three times with DCM. The combined organic phases are dried over $Na_2SO_4$, filtered and evaporated in a rotary evaporator. Recrystallisation from ethanol gives the product 11 (74.0 g, 26%).

$^1$H NMR ($CDCl_3$, δ (ppm), J (Hz)): 1.81-1.85 (m, 4H), 2.97-3.02 (m, 4H), 7.60 (d, 4H, J=8.6), 7.81 (d, 4H, J=8.6)

3.2 Compound 12

12

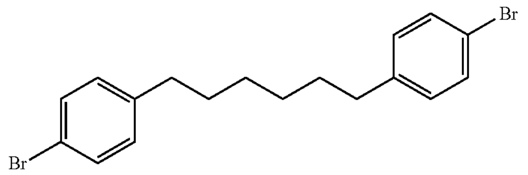

68.20 g (1 molar equivalent, 0.16 mol) of compound 11 and 72.38 g (8 molar equivalents, 1.29 mol) of KOH are initially introduced in 1 l of triethylene glycol. 39.57 g of hydrazine hydrate (7.5 molar equivalents, 1.21 mol) is slowly added dropwise under protective gas at room temperature. The batch is stirred at 160° C. for 28 hours, and 400 ml of water are slowly added dropwise at 0° C. The aqueous phase is extracted by shaking three times with DCM. The combined organic phases are dried over $Na_2SO_4$, filtered and evaporated in a rotary evaporator. Filtration on silica gel gives the product 12 (10.3 g, 16%).

$^1$H NMR ($CDCl_3$, δ (ppm), J (Hz)): 1.29-1.35 (m, 4H), 1.56-1.60 (m, 4H), 2.52-2.55 (m, 4H), 7.02 (d, 4H, J=8.4), 7.38 (d, 4H, J=8.4)

Compound 13

13

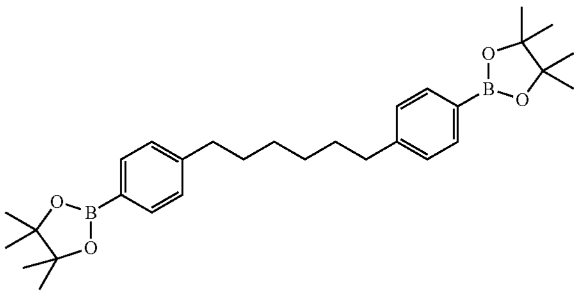

55 ml of THF, 14.22 g (2.2 molar equivalents, 56 mmol) of bis(pinacolato)diborane in 30 ml of THF, 16.19 g (6.6 molar equivalents, 165 mmol) of potassium acetate in 50 ml of THF and 0.73 g (0.04 molar equivalents, 1 mmol) of 1,1-bis(diphenylphosphine)ferrocenepalladium(II) chloride (complex with dichloromethane (1:1), Pd: 13%) are added to 10.10 g (1 molar equivalent, 25 mmol) of compound 12. The batch is stirred at 80° C. for 3 hours, and 200 ml of ice-water are slowly added dropwise. The aqueous phase is extracted by shaking three times with DCM. The combined organic phases are dried over $Na_2SO_4$, filtered and evaporated in a rotary evaporator. Recrystallisation from heptane gives the product 13 (5.10 g, 19%).

$^1$H NMR ($CDCl_3$, δ (ppm), J (Hz)): 1.33 (s, 24H), 1.57-1.61 (m, 4H), 2.58-2.61 (m, 4H), 7.17 (d, 4H, J=7.9), 7.72 (d, 4H, J=7.9)

Example 4

M4

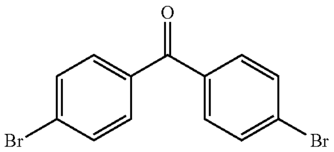

Example 5

M5

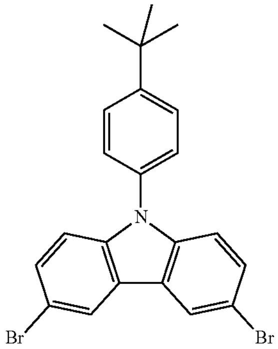

Example 6

M6

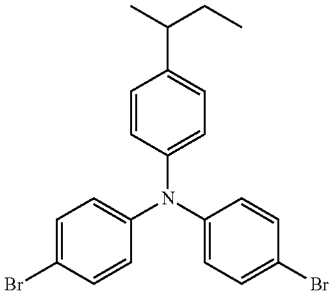

Examples 7 to 13

Preparation of the Polymers

Polymers P1 to P7 according to the invention and comparative polymers V1 and V2 are synthesised by SUZUKI coupling in accordance with WO 03/048225 A2 using the following monomers (percent data=mol %).

Example 7
Polymer P1
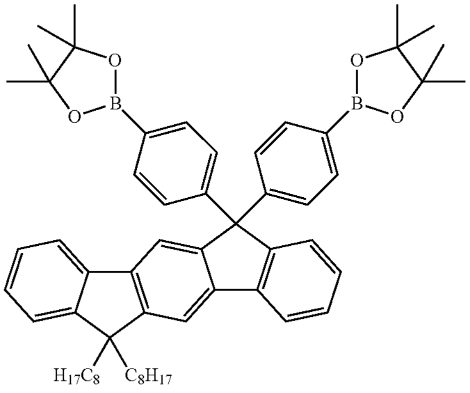
+
50% (M1)
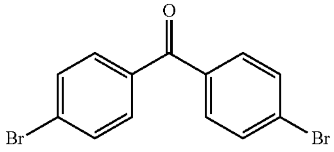
50% (M4)
Example 8
Polymer P2
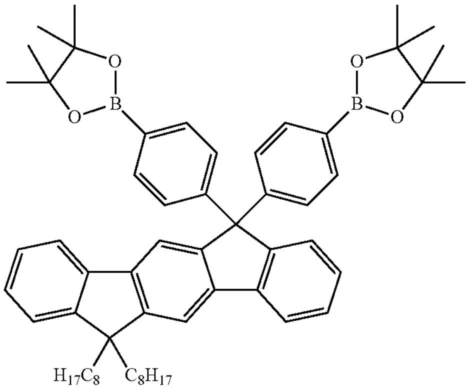
+
50% (M1)
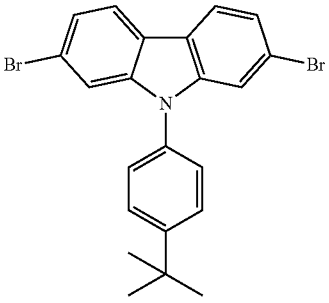
50% (M5)
Example 9
Polymer P3
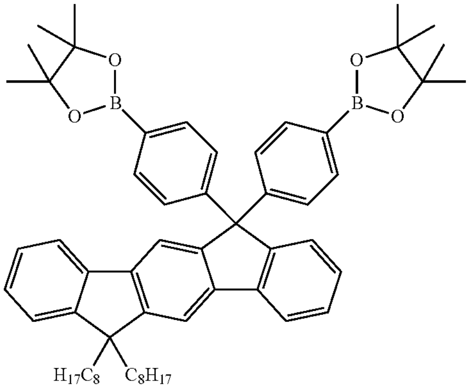
+
50% (M1)
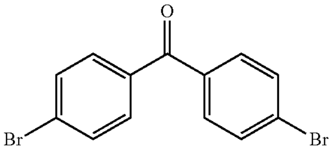
+
25% (M4)
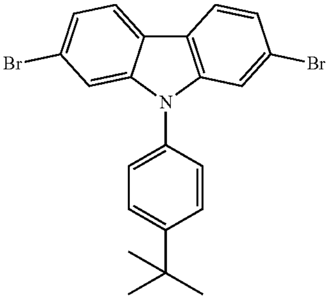
25% (M5)
Example 10
Polymer P4
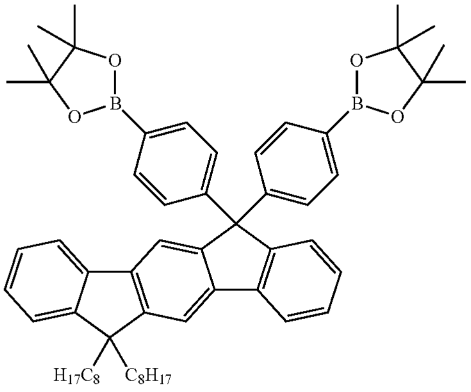
+
50% (M1)

-continued
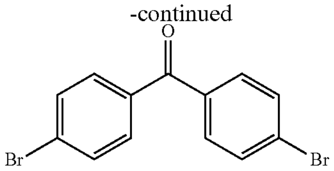
+
25% (M4)
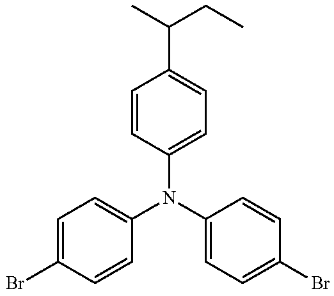
25% (M6)
Example 11
Polymer P5
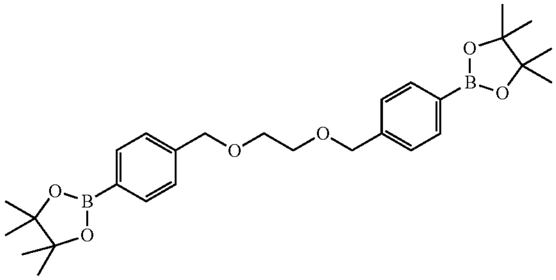
+
50% (M2)
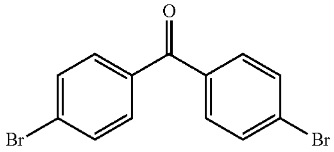
50% (M4)
Example 12
Polymer P6
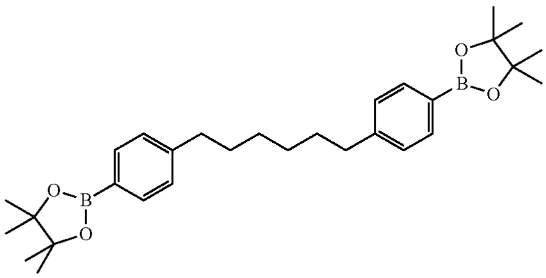
+
50% (M3)
-continued
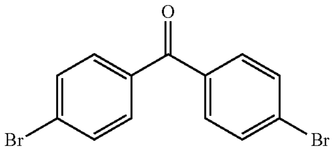
50% (M4)
Example 13
Polymer P7
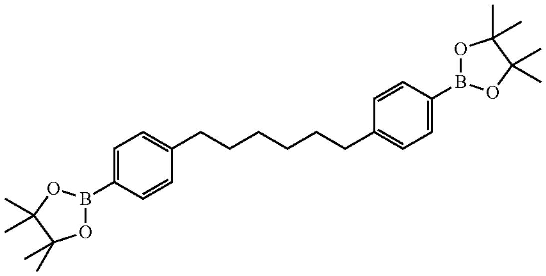
+
50% (M3)
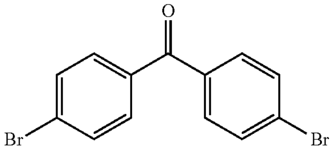
+
25% (M4)
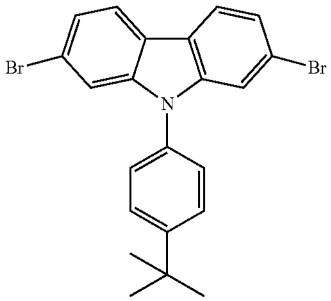
25% (M5)
Examples 14 to 45
Production of PLEDs
The structures of emitter T1, carbazoles C-1 to C-6 according to the invention and neutral compounds N-1 to N-3 according to the invention are depicted below for the purposes of clarity.

Structure of Emitter T1
T1
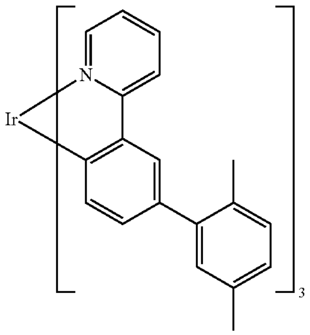
Structures of the Carbazole Compounds
C-1
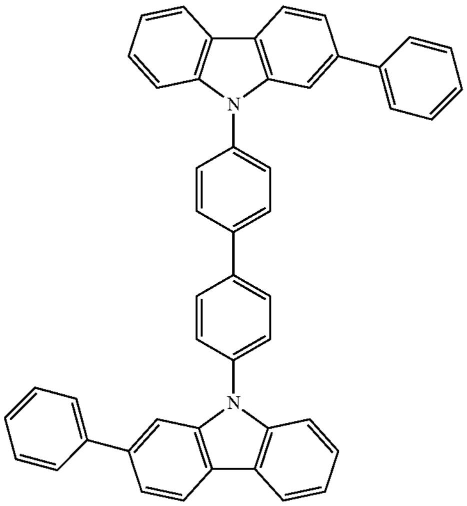
C-2
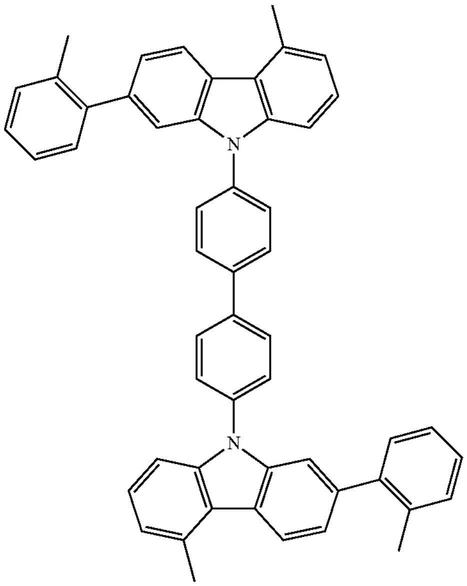
-continued
C-3
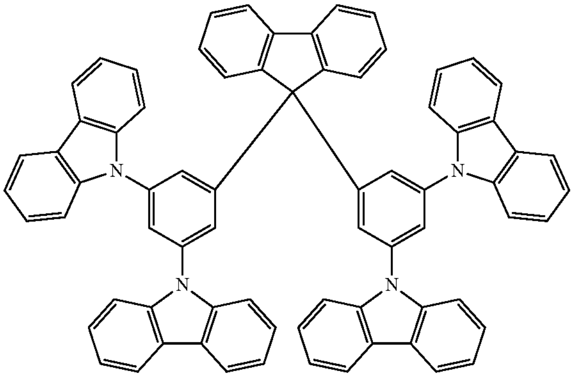
C-4
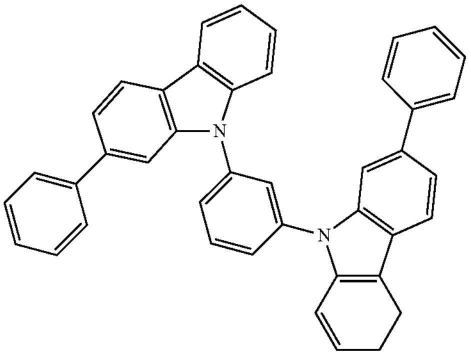
C-5
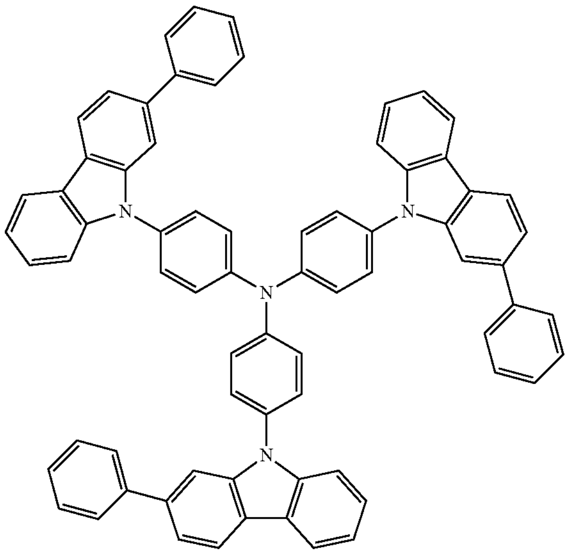

-continued

C-6

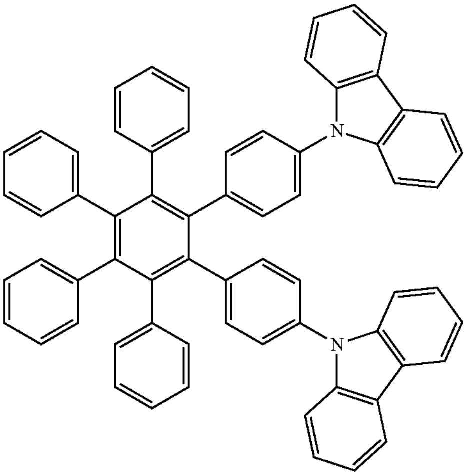

Structures of the Neutral Compounds

N-1

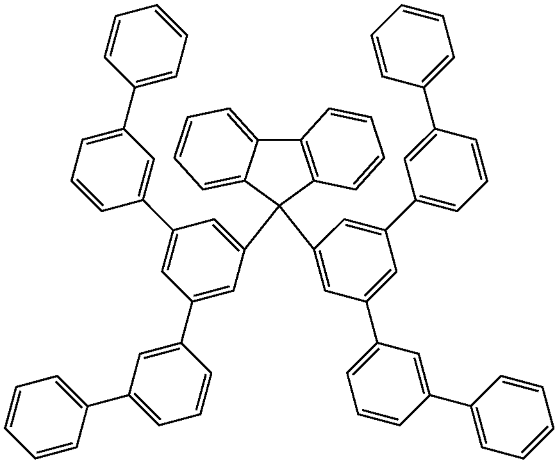

N-2

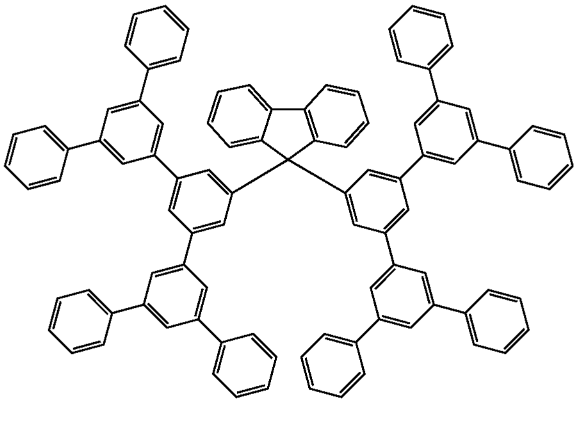

-continued

N-3

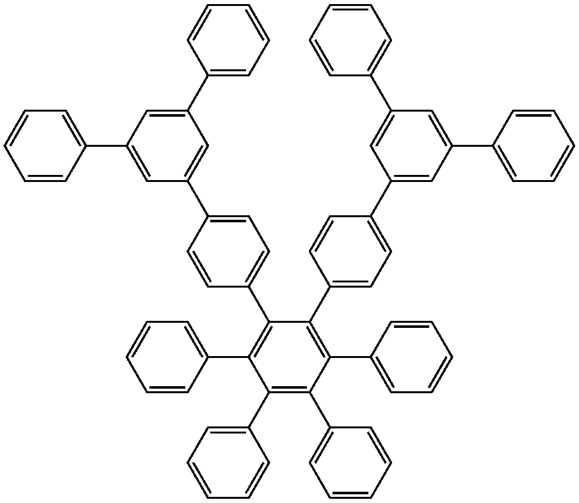 [SMILES: c1ccc(-c2cc(-c3ccccc3)cc(-c3ccc(-c4c(-c5ccccc5)c(-c5ccccc5)c(-c5ccccc5)c(-c5ccccc5)c4-c4ccc(-c5cc(-c6ccccc6)cc(-c6ccccc6)c5)cc4)cc3)c2)cc1]

The materials according to the invention are used from solution and result in significantly simpler devices having nevertheless good properties. In the present case, the compounds according to the invention are dissolved in toluene or chlorobenzene. The concentration employed in the examples given here is 20% by weight of the emitter, 40% by weight of polymer P1 to P7 and 40% by weight of compounds C-1 to C-6 or N-1 to N-3. The typical solids content of such solutions is between 16 and 25 g/l if, as here, the layer thickness of 80 nm which is typical for a device is to be achieved by means of spin coating.

FIG. 1 shows the typical structure of a device of this type. The EML comprises the jointly dissolved matrix materials and the emitter in the form of an amorphous layer.

The production of a polymeric organic light-emitting diode (PLED) has already been described many times in the literature (for example in WO 2004/037887 A2). In order to explain the present invention in illustrative terms, PLEDs are produced with polymers P1 to P3 and comparative polymer V1 by spin coating. A typical device has the structure depicted in FIG. 1.

To this end, specially manufactured substrates from Technoprint are used in a layout designed specifically for this purpose (FIG. 2, diagram on the left: ITO structure applied to the glass support, diagram on the right: complete electronic structure with ITO, vapour-deposited cathode and optional metallisation of the leads). The ITO structure (indium tin oxide, a transparent, conductive anode) was applied to soda-lime glass by sputtering in a pattern such that 4 pixels measuring 2×2 mm are obtained with the cathode vapour-deposited at the end of the production process.

The substrates are cleaned with deionised water and a detergent (Deconex 15 PF) in a clean room and then activated by UV/ozone plasma treatment. An 80 nm layer of PEDOT (PEDOT is a polythiophene derivative (Baytron P VAI 4083sp.) from H. C. Starck, Goslar, which is supplied as an aqueous dispersion) is then applied by spin coating, likewise in a clean room. The spin rate required depends on the degree of dilution and the specific spin-coater geometry (typical for 80 nm: 4500 rpm). In order to remove residual water from the layer, the substrates are dried by heating on a hotplate at 180° C. for 10 minutes. Then, under an inert-gas atmosphere (in the present case: argon), firstly 20 nm of an interlayer (typically a hole-dominated polymer, here HIL- 012 from Merck) and then 80 nm of the emitter layer are applied from toluene or chlorobenzene solution (concentration 5 g/l of interlayer, for the emitter layer in each case 16 to 25 g/l). Both layers are dried by heating at 180° C. for at least 10 minutes. The Ba/AI cathode is then vapour-deposited in the pattern indicated through a vapour-deposition mask (high-purity metals from Aldrich, particularly barium 99.99% (Order No. 474711); vapour-deposition units from Lesker or others, typical vacuum level $5\times10^{-6}$ mbar). Finally, the device is encapsulated in order to protect, in particular, the cathode against air and atmospheric moisture.

Between EML and cathode, further layers (for example HBL and ETL) can be applied by vapour deposition, the interlayer may also be replaced by one or more layers which merely have to satisfy the condition of not being detached again by the subsequent processing step of EML deposition from solution.

The solution-processed devices are characterised by standard methods, the OLED examples mentioned are not optimised.

Figure 3:
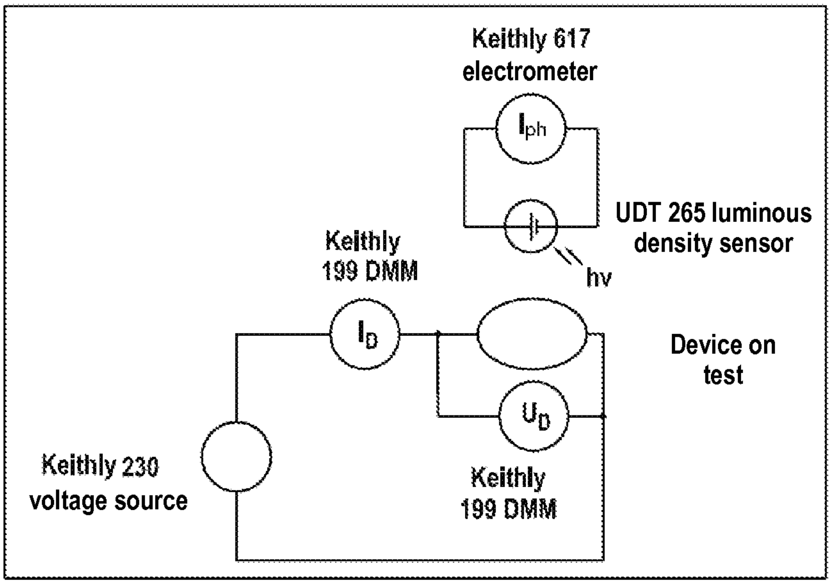
FIG. 3 illustrates a typical measurement set up.

To this end, the devices are clamped into holders manufactured specifically for the substrate size and provided with spring contacts. A photodiode with eye response filter can be placed directly on the measurement holder in order to exclude influences from extraneous light. The typical measurement set-up is depicted in FIG. 3.

The voltages are typically increased from 0 to max. 20 V in 0.2 V steps and reduced again. For each measurement point, the current through the device and the photocurrent obtained is measured by the photodiode. In this way, the IVL data of the test devices are obtained. Important parameters are the maximum efficiency measured ("max. eff." in cd/A) and the voltage required for 100 cd/$m^2$.

In order, in addition, to know the colour and the precise electroluminescence spectrum of the test devices, the voltage required for 100 cd/$m^2$ is applied again after the first measurement, and the photodiode is replaced by a spectrum measurement head. This is connected to a spectrometer (Ocean Optics) by an optical fibre. The colour coordinates (CIE: Commission International de l'éclairage, 1931 standard observer) can be derived from the measured spectrum.

Of particular importance for the usability of the materials is the lifetime of the devices. This is measured in a measurement set-up which is very similar to the first evaluation by setting an initial luminous density (for example 1000 cd/$m^2$). The current required for this luminous density is kept constant, while the voltage typically increases and the luminous density decreases. The lifetime is reached when the initial luminous density has dropped to 50% of the initial value.

In Table 1, the device results without compounds C-1 to C-6 or N-1 to N-3 according to the invention are compared with those obtained by a mixed layer comprising the materials according to the invention.

TABLE 1

Results in the device configuration of FIG. 1

| Examples | EML 80 nm | Max. eff. [cd/A] | Voltage [V] at 100 cd/$m^2$ | CIE (x, y) | Lifetime [h], initial luminance 1000 cd/$m^2$ |
|---|---|---|---|---|---|
| 14 (comp.) | P1:T1 | 28.4 | 5.30 | 0.35/0.61 | 970 |
| 15 | P1:C-1:T1 | 33.6 | 4.22 | 0.34/0.62 | 5000 |
| 16 | P1:C-2:T1 | 31.3 | 4.25 | 0.34/0.62 | 3200 |
| 17 | P1:C-3:T1 | 32.8 | 4.37 | 0.35/0.61 | 3370 |
| 18 | P1:C-4:T1 | 31.9 | 4.23 | 0.34/0.62 | 6140 |
| 19 | P1:C-5:T1 | 28.0 | 4.31 | 0.35/0.61 | 2410 |
| 20 | P1:N-1:T1 | 32.7 | 4.31 | 0.34/0.62 | 4870 |
| 21 | P1:N-3:T1 | 31.2 | 4.31 | 0.34/0.62 | 3270 |
| 22 (comp.) | P1:P2:T1 | 36.1 | 4.84 | 0.34/0.62 | 890 |
| 23 | P1:P2:C-1:T1 | 37.4 | 4.24 | 0.34/0.62 | 3100 |
| 24 (comp.) | P3:T1 | 31.2 | 5.84 | 0.34/0.62 | 3290 |
| 25 | P3:C-1:T1 | 34.2 | 5.47 | 0.33/0.62 | 5470 |
| 26 | P3:N-3:T1 | 26.7 | 5.37 | 0.34/0.62 | 6870 |
| 27 (comp.) | P4:T1 | 25.8 | 5.60 | 0.33/0.62 | 486 |
| 28 | P4:C-6:T1 | 29.2 | 4.47 | 0.33/0.62 | 2470 |
| 29 | P4:N-3:T1 | 33.7 | 4.51 | 0.34/0.62 | 3530 |
| 30 (comp.) | P5:T1 | 17.4 | 5.70 | 0.34/0.62 | 360 |
| 31 | P5:C-1:T1 | 25.4 | 4.22 | 0.33/0.62 | 2710 |
| 32 | P5:N-3:T1 | 26.6 | 4.31 | 0.34/0.62 | 1870 |
| 33 (comp.) | P6:T1 | 22.8 | 5.58 | 0.34/0.61 | 835 |
| 34 | P6:C-1:T1 | 27.6 | 4.66 | 0.34/0.62 | 3780 |
| 35 | P6:C-2:T1 | 29.9 | 4.62 | 0.34/0.62 | 3200 |
| 36 | P6:C-3:T1 | 30.0 | 4.67 | 0.34/0.62 | 3460 |
| 37 | P6:C-6:T1 | 31.5 | 4.65 | 0.34/0.62 | 2710 |
| 38 | P6:N-2:T1 | 30.3 | 4.63 | 0.34/0.62 | 3590 |
| 39 | P6:N-3:T1 | 31.5 | 4.66 | 0.34/0.62 | 3020 |
| 40 (comp.) | P7:T1 | 27.4 | 5.20 | 0.33/0.62 | 890 |
| 41 | P7:C-2:T1 | 29.7 | 4.52 | 0.34/0.62 | 5080 |
| 42 | P7:C-3:T1 | 30.1 | 4.57 | 0.34/0.62 | 3030 |
| 43 | P7:C-4:T1 | 33.7 | 4.45 | 0.34/0.62 | 4070 |
| 44 | P7:N-1:T1 | 32.2 | 4.53 | 0.34/0.62 | 2050 |
| 45 | P7:N-3:T1 | 32.4 | 4.56 | 0.34/0.62 | 3150 |

The invention claimed is:

1. A mixture comprising a) a polymer comprising a main-chain which contains at least one L=X structural unit, and wherein the content of the at least one structural unit in the polymer is up to 80 mol %, b) a triplet emitter compound and c) a carbazole compound, where the following applies to the symbols and indices used:

L is on each occurrence, identically or differently, $C(R^1)_2$, $PR^1$, $P(R^1)_3$, $S(R^1)_2$, or $(R^1)_2S(=O)$;

X is on each occurrence, identically or differently, O, S or $NR^2$;

$R^1$ is on each occurrence, identically or differently, H, D, F, CN, $N(R^2)_2$, a straight-chain, branched or cyclic alkyl, alkoxy or thioalkoxy group having 1 to 40 C atoms, which is optionally substituted by $R^3$ or also unsubstituted, where one or more non-adjacent $CH_2$ groups is optionally replaced by —$R^4C$═$CR^4$—, —C≡C—, $Si(R^4)_2$, $Ge(R^4)_2$, $Sn(R^4)_2$, C═O, C═S, C═Se, C═$NR^4$, —O—, —S—, —$NR^4$ or —$CONR^4$— and where one or more H atoms is optionally replaced by F, Cl, Br, I, CN or $NO_2$, or an aromatic or heteroaromatic ring system having 1 to 60 C atoms, which is optionally substituted by one or more radicals $R^3$, where two or more substituents $R^1$, together with the atoms to which they are bonded, may also form a mono- or polycyclic, aliphatic or aromatic ring system with one another; where at least one group $R^1$ has a bond to a further structural unit of the polymer;

$R^2$ is on each occurrence, identically or differently, a straight-chain, branched or cyclic alkyl or alkoxy group having 1 to 22 C atoms, in which, in addition, one or more non-adjacent C atoms is optionally replaced by —$R^4C$═$CR^4$—, —C≡C—, $Si(R^4)_2$, $Ge(R^4)_2$, $Sn(R^4)_2$, —$NR^4$—, —O—, —S—, —CO—O—, —O—CO—O—, where, in addition, one or more H atoms is optionally replaced by fluorine, an aryl, heteroaryl or aryloxy group having 1 to 40 C atoms, which may also be substituted by one or more radicals $R^3$, or OH or $N(R^3)_2$;

$R^3$ is on each occurrence, identically or differently, $R^4$ or CN, $B(R^4)_2$ or $Si(R^4)_3$;

$R^4$ is on each occurrence, identically or differently, H, D or an aliphatic or aromatic hydrocarbon radical having 1 to 20 C atoms, and wherein the triplet emitter compound contains at least one atom having an atomic number greater than 56 and less than 80.

2. The mixture according to claim 1, wherein the structural unit L=X of the polymer is a structural unit of the formula (1)

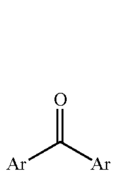

(1)

where the following applies to the symbols used:

Ar is on each occurrence, identically or differently, an aromatic or heteroaromatic ring system having 5 to 60 aromatic ring atoms, which may in each case be substituted by one or more groups $R^5$;

$R^5$ is on each occurrence, identically or differently, H, D, F, Cl, Br, I, CHO, $C(=O)Ar^1$, $P(=O)(Ar^1)_2$, $S(=O)Ar^1$, $S(=O)_2Ar^1$, $CR^6$═$CR^6Ar^1$, CN, $NO_2$, $Si(R^6)_3$, $B(OR^6)_2$, $B(R^6)_2$, $B(N(R^6)_2)_2$, $OSO_2R^6$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which is optionally substituted by one or more radicals $R^6$, where one or more non-adjacent $CH_2$ groups is optionally replaced by $R^6C$═$CR^6$, C≡C, $Si(R^6)_2$, $Ge(R^6)_2$, $Sn(R^6)_2$, C═O, C═S, C═Se, C═$NR^6$, $P(=O)(R^6)$, SO, $SO_2$, $NR^6$, O, S or $CONR^6$ and where one or more H atoms is optionally replaced by F, Cl, Br, I, CN or $NO_2$, or an aromatic or heteroaromatic ring system having 5 to 60 aromatic ring atoms, which may in each case be substituted by one or more radicals $R^6$, or an aryloxy or heteroaryloxy group having 5 to 60 aromatic ring atoms, which is optionally substituted by one or more radicals $R^6$, or a combination of these systems; two or more adjacent substituents $R^5$ here may also form a mono- or polycyclic, aliphatic or aromatic ring system with one another;

$Ar^1$ is on each occurrence, identically or differently, an aromatic or heteroaromatic ring system having 5 to 40 aromatic ring atoms, which is optionally substituted by one or more radicals $R^5$;

$R^6$ is on each occurrence, identically or differently, H, D, CN or an aliphatic, aromatic or heteroaromatic hydrocarbon radical having 1 to 20 C atoms, in which, in addition, H atoms is optionally replaced by F; two or more adjacent substituents $R^6$ here may also form a mono- or polycyclic, aliphatic or aromatic ring system with one another;

where at least one radical $R^5$ is a covalent bond to a further structural unit of the polymer.

3. The mixture according to claim 1, wherein the polymer contains at least one further structural unit which is different from the structural unit L=X, selected from a substituted or unsubstituted cis- or trans-indenofluorene structural unit or a structural unit containing two aromatic groups which are connected to one another via a linear $C_1$-$C_{10}$-alkyl group.

4. The mixture according to claim 1, wherein the carbazole compound is a compound of the formula (2)

(2)

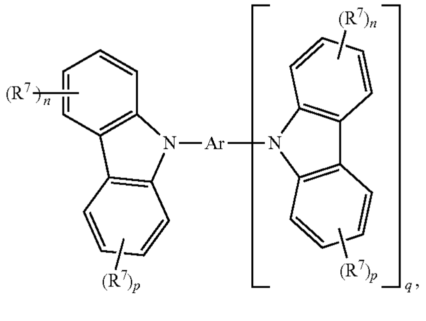

where the following applies to the symbols and indices used:

Ar is on each occurrence an aromatic or heteroaromatic ring system having 5 to 60 aromatic ring atoms, which is optionally substituted by one or more radicals $R^7$;

$R^7$ is on each occurrence, identically or differently, H, D, F, Cl, Br, I, $N(Ar^2)_2$, CN, $NO_2$, $Si(R^8)_3$, $B(OR^8)_2$, $C(=O)Ar^2$, $P(=O)(Ar^2)_2$, $S(=O)Ar^2$, $S(=O)_2Ar^2$, —$CR^8$═$CR^8(Ar^2)$, $OSO_2R^8$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals $R^8$, where one or more non-adjacent $CH_2$ groups is optionally replaced by $R^8C$═$CR^8$, C≡C, $Si(R^8)_2$, $Ge(R^8)_2$, $Sn(R^8)_2$, C═O, C═S, C═Se, C═$NR^8$, P(═O)($R^8$), SO, $SO_2$, $NR^8$, O, S or $CONR^8$ and where one or more H atoms is optionally replaced by F, Cl, Br, I, CN or $NO_2$, or an aromatic or heteroaromatic ring system having 5 to 60 aromatic ring atoms, which may in each case be substituted by one or more radicals $R^8$, or an aryloxy or heteroaryloxy group having 5 to 60 aromatic ring atoms, which is optionally substituted by one or more radicals $R^8$, or a combination of these systems; two or more substituents R here may also form a mono- or polycyclic, aliphatic or aromatic ring system with one another;

$R^7$ is on each occurrence, identically or differently, R, a group $Ar^2$ or F;

$Ar^2$ is on each occurrence, identically or differently, an aromatic or heteroaromatic ring system having 5 to 60 aromatic ring atoms, which is optionally substituted by one or more radicals $R^8$;

$R^8$ is on each occurrence, identically or differently, H, D or an aliphatic, aromatic and/or heteroaromatic hydrocarbon radical having 1 to 20 C atoms; or an aromatic or heteroaromatic ring system having 5 to 60 aromatic ring atoms, which is optionally substituted by one or more radicals R; two or more substituents $R^8$ here may also form a mono- or polycyclic, aliphatic, aromatic or heteroaromatic ring system with one another;

n is on each occurrence, identically or differently, 0, 1, 2, 3 or 4;

p is on each occurrence, identically or differently, 0, 1, 2, 3 or 4; and q is 1, 2, 3, 4 or 5.

5. The mixture according to claim 3, wherein the carbazole compound is a compound of the formula (2)

(2)

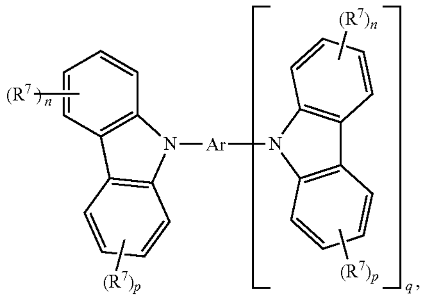

where the following applies to the symbols and indices used:

Ar is on each occurrence an aromatic or heteroaromatic ring system having 5 to 60 aromatic ring atoms, which is optionally substituted by one or more radicals $R^7$;

$R^7$ is on each occurrence, identically or differently, H, D, F, Cl, Br, I, $N(Ar^2)_2$, CN, $NO_2$, $Si(R^8)_3$, $B(OR^8)_2$, C(═O)$Ar^2$, P(═O)$(Ar^2)_2$, S(═O)$Ar^2$, S(═O)$_2Ar^2$, —$CR^8$═$CR^8(Ar^2)$, $OSO_2R^8$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals $R^8$, where one or more non-adjacent $CH_2$ groups is optionally replaced by $R^8C$═$CR^8$, C≡C, $Si(R^8)_2$, $Ge(R^8)_2$, $Sn(R^8)_2$, C═O, C═S, C═Se, C═$NR^8$, P(═O)($R^8$), SO, $SO_2$, $NR^8$, O, S or $CONR^8$ and where one or more H atoms is optionally replaced by F, Cl, Br, I, CN or $NO_2$, or an aromatic or heteroaromatic ring system having 5 to 60 aromatic ring atoms, which may in each case be substituted by one or more radicals $R^8$, or an aryloxy or heteroaryloxy group having 5 to 60 aromatic ring atoms, which is optionally substituted by one or more radicals $R^8$, or a combination of these systems; two or more substituents R here may also form a mono- or polycyclic, aliphatic or aromatic ring system with one another;

$R^7$ is on each occurrence, identically or differently, R, a group $Ar^2$ or F;

$Ar^2$ is on each occurrence, identically or differently, an aromatic or heteroaromatic ring system having 5 to 60 aromatic ring atoms, which is optionally substituted by one or more radicals $R^8$;

$R^8$ is on each occurrence, identically or differently, H, D or an aliphatic, aromatic and/or heteroaromatic hydrocarbon radical having 1 to 20 C atoms; or an aromatic or heteroaromatic ring system having 5 to 60 aromatic ring atoms, which is optionally substituted by one or more radicals R; two or more substituents $R^8$ here may also form a mono- or polycyclic, aliphatic, aromatic or heteroaromatic ring system with one another;

n is on each occurrence, identically or differently, 0, 1, 2, 3 or 4;

p is on each occurrence, identically or differently, 0, 1, 2, 3 or 4; and q is 1, 2, 3, 4 or 5.

6. The mixture according to claim 1, wherein the triplet emitter compound is a compound of the formulae (21) to (24), formula (21)

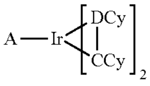

formula (22)

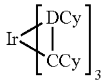

formula (23)

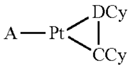

formula (24)

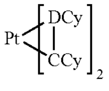

where the following applies to the symbols used:

DCy is, identically or differently on each occurrence, a cyclic group which contains at least one donor atom, via which the cyclic group is bonded to the metal, and which may in turn carry one or more substituents $R^3$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^1$;

A is, identically or differently on each occurrence, a monoanionic or bidentate-chelating ligand;

$R^1$ is on each occurrence, identically or differently, H, D, F, CN, $N(R^2)_2$, a straight-chain, branched or cyclic alkyl, alkoxy or thioalkoxy group having 1 to 40 C atoms, which is optionally substituted by $R^3$ or also unsubstituted, where one or more non-adjacent $CH_2$ groups is optionally replaced by $—R^4C═CR^4—$, —C═C—, $Si(R^4)_2$, $Ge(R^4)_2$, $Sn(R^4)_2$, C═O, C═S, C═Se, $C═NR^4$, —O—, —S—, $—NR^4$ or $—CONR^4—$ and where one or more H atoms is optionally replaced by F, Cl, Br, I, CN or $NO_2$, or an aromatic or heteroaromatic ring system having 1 to 60 C atoms, which is optionally substituted by one or more radicals $R^3$, where two or more substituents $R^1$, together with the atoms to which they are bonded, may also form a mono- or polycyclic, aliphatic or aromatic ring system with one another; where at least one group $R^1$ has a bond to a further structural unit of the polymer;

$R^2$ is on each occurrence, identically or differently, a straight-chain, branched or cyclic alkyl or alkoxy group having 1 to 22 C atoms, in which, in addition, one or more non-adjacent C atoms is optionally replaced by $—R^4C═CR^4—$, —C≡C—, $Si(R^4)_2$, $Ge(R^4)_2$, $Sn(R^4)_2$, $—NR^4—$, —O—, —S—, —CO—O—, —O—CO—O—, where, in addition, one or more H atoms is optionally replaced by fluorine, an aryl, heteroaryl or aryloxy group having 1 to 40 C atoms, which may also be substituted by one or more radicals $R^3$, or OH or $N(R^3)_2$;

$R^3$ is on each occurrence, identically or differently, $R^4$ or CN, $B(R^4)_2$ or $Si(R^4)_3$;

$R^4$ is on each occurrence, identically or differently, H, D or an aliphatic or aromatic hydrocarbon radical having 1 to 20 C atoms.

7. The mixture according to claim 1, wherein the triplet emitter compound is a compound of the formulae (21) to (24), formula (21)

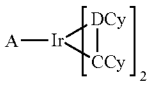

formula (22)

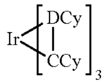

formula (23)

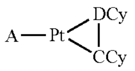

formula (24)

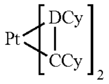

where the following applies to the symbols used:

DCy is, identically or differently on each occurrence, a cyclic group which contains at least one donor atom, via which the cyclic group is bonded to the metal, and which may in turn carry one or more substituents $R^3$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^1$;

A is, identically or differently on each occurrence, a diketonate ligand;

$R^1$ is on each occurrence, identically or differently, H, D, F, CN, $N(R^2)_2$, a straight-chain, branched or cyclic alkyl, alkoxy or thioalkoxy group having 1 to 40 C atoms, which is optionally substituted by $R^3$ or also unsubstituted, where one or more non-adjacent $CH_2$ groups is optionally replaced by $—R^4C═CR^4—$, —C═C—, $Si(R^4)_2$, $Ge(R^4)_2$, $Sn(R^4)_2$, C═O, C═S, C═Se, $C═NR^4$, —O—, —S—, $—NR^4$ or $—CONR^4—$ and where one or more H atoms is optionally replaced by F, Cl, Br, I, CN or $NO_2$, or an aromatic or heteroaromatic ring system having 1 to 60 C atoms, which is optionally substituted by one or more radicals $R^3$, where two or more substituents $R^1$, together with the atoms to which they are bonded, may also form a mono- or polycyclic, aliphatic or aromatic ring system with one another; where at least one group $R^1$ has a bond to a further structural unit of the polymer;

$R^2$ is on each occurrence, identically or differently, a straight-chain, branched or cyclic alkyl or alkoxy group having 1 to 22 C atoms, in which, in addition, one or more non-adjacent C atoms is optionally replaced by $—R^4C═CR^4—$, —C≡C—, $Si(R^4)_2$, $Ge(R^4)_2$, $Sn(R^4)_2$, $—NR^4—$, —O—, —S—, —CO—O—, —O—CO—O—, where, in addition, one or more H atoms is optionally replaced by fluorine, an aryl, heteroaryl or aryloxy group having 1 to 40 C atoms, which may also be substituted by one or more radicals $R^3$, or OH or $N(R^3)_2$;

$R^3$ is on each occurrence, identically or differently, $R^4$ or CN, $B(R^4)_2$ or $Si(R^4)_3$;

$R^4$ is on each occurrence, identically or differently, H, D or an aliphatic or aromatic hydrocarbon radical having 1 to 20 C atoms.

8. The mixture according to claim 5, wherein the triplet emitter compound is a compound of the formulae (21) to (24), formula (21)

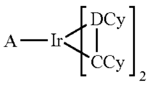

formula (22)

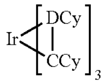

formula (23)

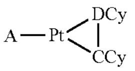

formula (24)

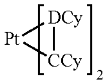

where the following applies to the symbols used:

DCy is, identically or differently on each occurrence, a cyclic group which contains at least one donor atom, via which the cyclic group is bonded to the metal, and which may in turn carry one or more substituents $R^3$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^1$;

A is, identically or differently on each occurrence, a monoanionic or bidentate-chelating ligand;

$R^1$ is on each occurrence, identically or differently, H, D, F, CN, $N(R^2)_2$, a straight-chain, branched or cyclic alkyl, alkoxy or thioalkoxy group having 1 to 40 C atoms, which is optionally substituted by $R^3$ or also unsubstituted, where one or more non-adjacent $CH_2$ groups is optionally replaced by —$R^4C$═$CR^4$—, —C≡C—, $Si(R^4)_2$, $Ge(R^4)_2$, $Sn(R^4)_2$, C═O, C═S, C═Se, C═$NR^4$, —O—, —S—, —$NR^4$ or —$CONR^4$— and where one or more H atoms is optionally replaced by F, Cl, Br, I, CN or $NO_2$, or an aromatic or heteroaromatic ring system having 1 to 60 C atoms, which is optionally substituted by one or more radicals $R^3$, where two or more substituents $R^1$, together with the atoms to which they are bonded, may also form a mono- or polycyclic, aliphatic or aromatic ring system with one another; where at least one group $R^1$ has a bond to a further structural unit of the polymer;

$R^2$ is on each occurrence, identically or differently, a straight-chain, branched or cyclic alkyl or alkoxy group having 1 to 22 C atoms, in which, in addition, one or more non-adjacent C atoms is optionally replaced by —$R^4C$═$CR^4$—, —C≡C—, $Si(R^4)_2$, $Ge(R^4)_2$, $Sn(R^4)_2$, —$NR^4$—, —O—, —S—, —CO—O—, —O—CO—O—, where, in addition, one or more H atoms is optionally replaced by fluorine, an aryl, heteroaryl or aryloxy group having 1 to 40 C atoms, which may also be substituted by one or more radicals $R^3$, or OH or $N(R^3)_2$;

$R^3$ is on each occurrence, identically or differently, $R^4$ or CN, $B(R^4)_2$ or $Si(R^4)_3$;

$R^4$ is on each occurrence, identically or differently, H, D or an aliphatic or aromatic hydrocarbon radical having 1 to 20 C atoms.

9. The mixture according to claim 5, wherein the triplet emitter compound is a compound of the formulae (21) to (24), formula (21)

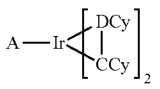

formula (22)

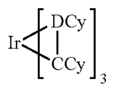

formula (23)

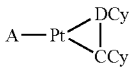

formula (24)

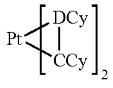

where the following applies to the symbols used:

DCy is, identically or differently on each occurrence, a cyclic group which contains at least one donor atom, via which the cyclic group is bonded to the metal, and which may in turn carry one or more substituents $R^3$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^1$;

A is, identically or differently on each occurrence, a diketonate ligand;

$R^1$ is on each occurrence, identically or differently, H, D, F, CN, $N(R^2)_2$, a straight-chain, branched or cyclic alkyl, alkoxy or thioalkoxy group having 1 to 40 C atoms, which is optionally substituted by $R^3$ or also unsubstituted, where one or more non-adjacent $CH_2$ groups is optionally replaced by —$R^4C$═$CR^4$—, —C≡C—, $Si(R^4)_2$, $Ge(R^4)_2$, $Sn(R^4)_2$, C═O, C═S, C═Se, C═$NR^4$, —O—, —S—, —$NR^4$ or —$CONR^4$— and where one or more H atoms is optionally replaced by F, Cl, Br, I, CN or $NO_2$, or an aromatic or heteroaromatic ring system having 1 to 60 C atoms, which is optionally substituted by one or more radicals $R^3$, where two or more substituents $R^1$, together with the atoms to which they are bonded, may also form a mono- or polycyclic, aliphatic or aromatic ring system with one another; where at least one group $R^1$ has a bond to a further structural unit of the polymer;

$R^2$ is on each occurrence, identically or differently, a straight-chain, branched or cyclic alkyl or alkoxy group having 1 to 22 C atoms, in which, in addition, one or more non-adjacent C atoms is optionally replaced by —$R^4C$═$CR^4$—, —C≡C—, $Si(R^4)_2$, $Ge(R^4)_2$, $Sn(R^4)_2$, —$NR^4$—, —O—, —S—, —CO—O—, —O—CO—O—, where, in addition, one or more H atoms is optionally replaced by fluorine, an aryl, heteroaryl or aryloxy group having 1 to 40 C atoms, which may also be substituted by one or more radicals $R^3$, or OH or $N(R^3)_2$;

$R^3$ is on each occurrence, identically or differently, $R^4$ or CN, $B(R^4)_2$ or $Si(R^4)_3$;

$R^4$ is on each occurrence, identically or differently, H, D or an aliphatic or aromatic hydrocarbon radical having 1 to 20 C atoms.

10. The mixture according to claim 1, wherein the proportion of the triplet emitter compound in the mixture is 0.1 to 40% by weight.

11. The mixture according to claim 1, wherein it comprises one or more solvents.

12. An organic electroluminescent device comprising the mixture according to claim 1.

13. An organic electroluminescent device comprising cathode, anode and at least one electroluminescent layer, wherein the electroluminescent layer comprises the mixture according to claim 1.

14. The organic electroluminescent device according to claim 8, wherein the electroluminescent layer is applied from solution.

15. The mixture according to claim 6, wherein DCy is, identically or differently on each occurrence, a cyclic group which contains at least one nitrogen, carbon in the form of a carbene or phosphorus, via which the cyclic group is bonded to the metal, and which may in turn carry one or more substituents $R^3$; the groups DCy and CCy are connected to one another via a covalent bond.

16. The mixture according to claim 7, wherein DCy is, identically or differently on each occurrence, a cyclic group which contains at least one nitrogen, carbon in the form of a carbene or phosphorus, via which the cyclic group is bonded to the metal, and which may in turn carry one or more substituents $R^3$; the groups DCy and CCy are connected to one another via a covalent bond.

17. The mixture according to claim 8, wherein DCy is, identically or differently on each occurrence, a cyclic group which contains at least one nitrogen, carbon in the form of a carbene or phosphorus, via which the cyclic group is bonded to the metal, and which may in turn carry one or more substituents $R^3$; the groups DCy and CCy are connected to one another via a covalent bond.

18. The mixture according to claim 9, wherein DCy is, identically or differently on each occurrence, a cyclic group which contains at least one nitrogen, carbon in the form of a carbene or phosphorus, via which the cyclic group is bonded to the metal, and which may in turn carry one or more substituents $R^3$; the groups DCy and CCy are connected to one another via a covalent bond.

* * * * *